(12) United States Patent
Fujisaki et al.

(10) Patent No.: US 10,921,711 B2
(45) Date of Patent: Feb. 16, 2021

(54) RESIST COMPOSITION AND METHOD OF FORMING RESIST PATTERN

(71) Applicant: TOKYO OHKA KOGYO CO., LTD., Kawasaki (JP)

(72) Inventors: Masafumi Fujisaki, Kawasaki (JP); Junichi Tsuchiya, Kawasaki (JP); Kotaro Endo, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 216 days.

(21) Appl. No.: 15/923,841

(22) Filed: Mar. 16, 2018

(65) Prior Publication Data

US 2018/0284611 A1 Oct. 4, 2018

(30) Foreign Application Priority Data

Mar. 31, 2017 (JP) .............................. JP2017-073143

(51) Int. Cl.
| | |
|---|---|
| *G03F 7/039* | (2006.01) |
| *G03F 7/16* | (2006.01) |
| *G03F 7/20* | (2006.01) |
| *G03F 7/38* | (2006.01) |
| *G03F 7/32* | (2006.01) |
| *G03F 7/038* | (2006.01) |
| *C08F 220/28* | (2006.01) |
| *C08F 220/16* | (2006.01) |

(52) U.S. Cl.
CPC .......... *G03F 7/0397* (2013.01); *C08F 220/16* (2013.01); *C08F 220/28* (2013.01); *G03F 7/0382* (2013.01); *G03F 7/162* (2013.01); *G03F 7/168* (2013.01); *G03F 7/2006* (2013.01); *G03F 7/2041* (2013.01); *G03F 7/325* (2013.01); *G03F 7/38* (2013.01); *C08F 220/281* (2020.02); *C08F 220/282* (2020.02)

(58) Field of Classification Search
CPC ....... G03F 7/0382; G03F 7/039; G03F 7/0397
See application file for complete search history.

(56) References Cited

U.S. PATENT DOCUMENTS

| | | |
|---|---|---|
| 2004/0110085 A1 | 6/2004 | Iwai et al. |
| 2009/0042148 A1 | 2/2009 | Padmanaban et al. |
| 2010/0062372 A1 | 3/2010 | Tsunehiro et al. |
| 2012/0328993 A1 | 12/2012 | Kuang-Jung et al. |

(Continued)

FOREIGN PATENT DOCUMENTS

| | | |
|---|---|---|
| CN | 103376660 A | 10/2013 |
| JP | A-2003-241385 | 8/2003 |

(Continued)

OTHER PUBLICATIONS

Notice of Allowance in Japanese Patent Application No. 2017-073143, dated Oct. 20, 2020.

*Primary Examiner* — Cynthia Hamilton
(74) *Attorney, Agent, or Firm* — Knobbe, Martens, Olson & Bear LLP

(57) ABSTRACT

A resist composition which generates an acid when exposed and whose solubility in a developer is changed by an action of an acid, the resist composition including: a base material component (A) whose solubility in a developer is changed by an action of an acid, in which the base material component (A) comprises a polymer compound (A1) having a constitutional unit (a01) represented by Formula (a0-1), a constitutional unit (a02) represented by Formula (a0-2), and a constitutional unit (a03) which is represented by Formula (a0-3) and has a structure different from the constitutional unit (a02).

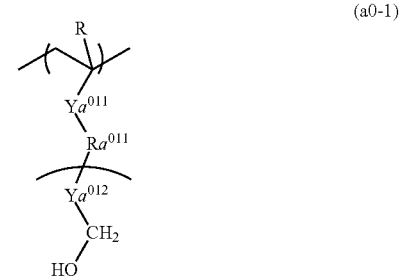

(a0-1)

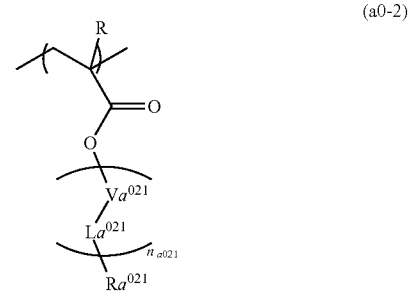

(a0-2)

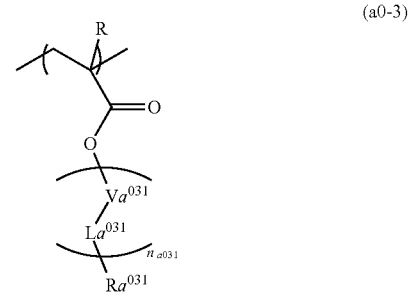

(a0-3)

6 Claims, No Drawings

(56) References Cited

U.S. PATENT DOCUMENTS

| | | | |
|---|---|---|---|
| 2013/0260312 A1* | 10/2013 | Suzuki | G03F 7/0397 |
| | | | 430/270.1 |
| 2013/0288178 A1 | 10/2013 | Yoshiyuki et al. | |
| 2018/0284612 A1* | 10/2018 | Tsuchiya | G03F 7/0397 |
| 2019/0354011 A1* | 11/2019 | Oikawa | G03F 7/039 |

FOREIGN PATENT DOCUMENTS

| | | |
|---|---|---|
| JP | 2010-060953 A | 3/2010 |
| JP | 2011-227463 A | 11/2011 |
| JP | A-2012-173418 | 9/2012 |
| JP | 2013-001715 A | 1/2013 |
| JP | A-2013-178515 | 9/2013 |
| JP | 2015-114336 A | 6/2015 |

\* cited by examiner

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2017-73143, filed on Mar. 31, 2017, the content of which is incorporated herein by reference.

Description of Related Art

A technique (pattern-forming technique) of forming a fine pattern on a substrate and performing etching using the fine pattern as a mask to perform processing on a lower layer of the pattern has been widely employed in the manufacture of a semiconductor element or a liquid crystal display element. A fine pattern is typically formed of an organic material and formed using a technique such as a lithography method or a nanoimprint method. For example, in the lithography method, a step of forming a resist film on a support such as a substrate using a resist material that contains a base material component such as a resin, selectively exposing the resist film to radiation such as light or electron beams, and performing a development treatment thereon to form a resist pattern having a predetermined shape on the resist film is performed. Further, a semiconductor element or the like is manufactured by carrying out a step of performing processing on a substrate through etching using the resist pattern as a mask.

The resist material is divided into a positive type resist material and a negative type resist material. A resist material that has an exposed portion whose solubility in a developer is increased is referred to as a positive type resist material and a resist material that has an exposed portion whose solubility in a developer is decreased is referred to as a negative type resist material.

In recent years, pattern miniaturization has been promoted along with the advance of a lithography technique.

As a technique of miniaturization, shortening the wavelength (increasing the energy) of an exposure light source has typically been performed. Specifically, ultraviolet rays typified by g-line and i-line have been used in the related art, but mass production of semiconductor elements obtained by using a KrF excimer laser and an ArF excimer laser has recently started. Further, an electron beam (EB), an extreme ultraviolet ray (EUV), or an X-ray having a wavelength shorter (high energy) than that of any of these excimer lasers has also been examined.

Along with the shortening of the wavelength of an exposure light source, a resist material is required to improve lithography characteristics such as the sensitivity to an exposure light source, the resolution that enables reproduction of a fine pattern, and the like. As a resist material satisfying such a requirement, a chemically amplified resist composition is known.

As the chemically amplified resist composition, a composition which contains a base material component whose solubility in a developer is changed due to an action of an acid and an acid generator component that generates an acid when exposed has typically been used. For example, in a case where the developer is an alkali developer (alkali development process), a base material component whose solubility in an alkali developer is increased due to an action of an acid is used as the base material component.

A positive type chemically amplified resist composition, that is, a positive type development process performed by combining an alkali developer and a chemically amplified resist composition whose solubility in an alkali developer is increased when exposed has advantages of capability of simplifying the structure of a photomask and excellent characteristics of a pattern to be formed, compared to a negative type development process performed by combining a negative type chemically amplified resist composition and an alkali developer. Therefore, recently, a positive type development process performed by combining a positive type chemically amplified resist composition and an alkali developer has been mainly used for forming a fine pattern.

In a case where the positive type development process is applied, when a resist film obtained by coating a support with a chemically amplified resist composition is selectively exposed, an acid-decomposable group in a base resin is decomposed due to an action of an acid generated from an acid generator or the like, and the alkali insolubility of the unexposed portion of the resist film is not changed while the insolubility of the exposed portion of the resist film in an alkali developer is changed into solubility. Therefore, dissolution contrast between the exposed portion and the unexposed portion can be provided by performing development using an alkali developer and thus a positive type resist pattern can be formed.

However, in a case where the positive type development process is applied to form a fine pattern (a dense pattern, a trench pattern, or the like), a region having a weak optical intensity is generated in the exposed portion of the resist film, particularly in the film thickness direction, and the resolution of the resist pattern is likely to be degraded.

A method in which a region having a weak optical intensity is selectively dissolved and removed to form a resist pattern (negative type resist pattern) is useful for forming such a fine pattern described above. As a method of forming a negative type resist pattern using a chemically amplified resist composition used for a positive type development process which is the mainstream, a negative type development process performed by combining a chemically amplified resist composition with a developer containing an organic solvent (organic developer) is known (for example, see Japanese Unexamined Patent Application, First Publication No. 2013-178515).

In a case where the negative type development process is applied, when a resist film obtained by coating a support with a chemically amplified resist composition is selectively exposed, an acid-decomposable group in a base resin is decomposed due to an action of an acid generated from an acid generator or the like, and the solubility of the unexposed portion of the resist film in an organic developer is not changed while the solubility of the exposed portion of the resist film in an organic developer is changed into insolubility. Therefore, dissolution contrast between the exposed portion and the unexposed portion can be provided by performing development using an organic developer and thus a negative type resist pattern can be formed.

An example of the related art is Japanese Patent Application, First publication No. 2003-241385.

SUMMARY OF THE INVENTION

Further advance of the lithography technique and expansion of application fields have been promoted, and thus pattern miniaturization is rapidly progressing. Under this circumstance, a technique of forming a fine pattern having a size of 50 nm or less in an excellent shape is required for manufacturing a semiconductor element or the like.

However, in a case where a fine pattern (for example, a fine line and space pattern) is intended to be formed on a substrate, there is a problem in that pattern collapse is likely to occur because the area where the pattern is in contact with the substrate is reduced.

Further, the resist film has a difference in light intensity distribution at the time of exposure depending on various conditions so that there is a case where the amount of acid to be generated is decreased in a lower portion of the resist film having a weak light intensity while the amount of acid to be generated is increased in the upper portion of the resist film having a strong light intensity, when the resist film is exposed. Due to this phenomenon, in the negative type development process, there is a case where the pattern portion excessively remains in the upper portion of the resist film and the pattern portion is excessively removed from the lower portion (the vicinity of the interface between the resist film and the substrate) of the resist film because of insufficient light intensity. Therefore, pattern collapse is more likely to occur in the negative type development process.

In the negative type development process, there is a problem of reduction in film thickness of the exposed portion that remains as a resist pattern at the time of development using an organic developer. Since the reduction in film thickness (film shrink) results in etching defects at the time of etching the substrate using the formed resist pattern as a mask, improvement is required.

The present invention has been made in consideration of the above-described circumstances, and an object thereof is to provide a resist composition which is capable of suppressing the occurrence of pattern collapse and reduction in film thickness and of forming a fine pattern in an excellent shape; and a method of forming a resist pattern obtained by using the resist composition.

In order to solve the above-described problems, the present invention employs the following configurations.

According to a first aspect of the present invention, a resist composition is provided which generates an acid when exposed and whose solubility in a developer is changed by an action of an acid, the resist composition including: a base material component (A) whose solubility in a developer is changed by an action of an acid, in which the base material component (A) contains a polymer compound (A1) having a constitutional unit (a01) represented by Formula (a0-1), a constitutional unit (a02) represented by Formula (a0-2), and a constitutional unit (a03) which is represented by Formula (a0-3) and has a structure different from the constitutional unit (a02).

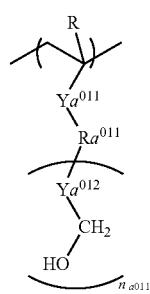

(a0-1)

[In the formula, R represents a hydrogen atom, an alkyl group having 1 to 5 carbon atoms, or a halogenated alkyl group having 1 to 5 carbon atoms. $Ya^{011}$ represents a divalent linking group. $Ra^{011}$ represents a cyclic aliphatic hydrocarbon group which may have a substituent. $Ya^{012}$ represents a single bond or a divalent linking group. $n_{a011}$ represents an integer of 1 to 3. In a case where $n_{a011}$ represents 2 or greater, a plurality of $Ya^{012}$'s may be the same as or different from each other.]

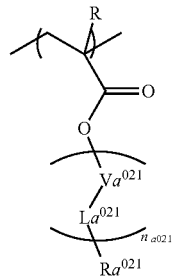

(a0-2)

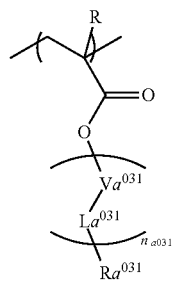

(a0-3)

[In the formulae, a plurality of R's each independently represents a hydrogen atom, an alkyl group having 1 to 5 carbon atoms, or a halogenated alkyl group having 1 to 5 carbon atoms. $Va^{021}$ and $Va^{031}$ each independently represents a divalent hydrocarbon group which may have an ether bond. $La^{021}$ and $La^{031}$ each independently represents —O—, —COO—, —CON(R')—, —OCO—, —CONHCO—, or —CONHCS—, and R' represents a hydrogen atom or a methyl group. $Ra^{021}$ and $Ra^{031}$ each independently represents a lactone-containing cyclic group, a carbonate-containing cyclic group, or a —$SO_2$-containing cyclic group. $n_{a021}$ and $n_{a031}$ each independently represents 1 or 2. In a case where $n_{a021}$ represents 2, a plurality of $Va^{021}$'s may be the same as or different from each other and a plurality of $La^{021}$'s may be the same as or different from each other. In a case where $n_{a031}$ represents 2, a plurality of $Va^{031}$'s may be the same as or different from each other and a plurality of $La^{031}$'s may be the same as or different from each other.]

According to a second aspect of the present invention, a method of forming a resist pattern is provided, including: a step of forming a resist film on a support using the resist composition according to the first aspect; a step of exposing the resist film; and a step of patterning the exposed resist film by performing negative type development using a developer that contains an organic solvent to form a resist pattern.

According to the present invention, it is possible to provide a resist composition which is capable of suppressing the occurrence of pattern collapse and reduction in film thickness and of forming a fine pattern in an excellent shape; and a method of forming a resist pattern obtained by using the resist composition.

DETAILED DESCRIPTION OF THE INVENTION

In the present specification and claims, the term "aliphatic" is a concept relative to aromatic and means a group that does not have aromaticity, a compound that does not have aromaticity, or the like.

The concept of "alkyl group" includes a linear, branched, or cyclic monovalent saturated hydrocarbon group unless otherwise noted. The same applies to an alkyl group in an alkoxy group.

The concept of "alkylene group" includes a linear, branched, or cyclic divalent saturated hydrocarbon group unless otherwise noted.

A "halogenated alkyl group" indicates a group formed by some or all hydrogen atoms in an alkyl group being substituted with halogen atoms, and examples of the halogen atoms include a fluorine atom, a chlorine atom, a bromine atom, and an iodine atom.

A "fluorinated alkyl group" or a "fluorinated alkylene group" indicates a group formed by some or all hydrogen atoms in an alkyl group or an alkylene group being substituted with fluorine atoms.

A "constitutional unit" indicates a monomer unit constituting a polymer compound (a resin, a polymer, or a copolymer).

The term "may have a substituent" includes a case where a hydrogen atom (—H) is substituted with a monovalent group and a case where a methylene group (—$CH_2$—) is substituted with a divalent group.

The concept of "exposure" includes general irradiation with radiation.

A "constitutional unit derived from acrylic acid ester" indicates a constitutional unit formed by an ethylenic double bond of acrylic acid ester being cleaved.

Further, "acrylic acid ester" indicates a compound in which a hydrogen atom in the terminal of a carboxy group of acrylic acid ($CH_2$=CH—COOH) is substituted with an organic group.

In acrylic acid ester, a hydrogen atom bonded to a carbon atom in the α-position may be substituted with a substituent. The substituent ($R^{\alpha 0}$) that substitutes for a hydrogen atom bonded to a carbon atom at the α-position is an atom or a group other than a hydrogen atom, and examples thereof include an alkyl group having 1 to 5 carbon atoms and a halogenated alkyl group having 1 to 5 carbon atoms. In addition, the substituent ($R^{\alpha 0}$) includes itaconic acid diester substituted with a substituent having an ester bond and the substituent ($R^{\alpha 0}$) includes α-hydroxy acrylic ester substituted with a hydroxyalkyl group or a group that modifies the hydroxyl group thereof. Further, the carbon atom at the α-position of acrylic acid ester indicates a carbon atom to which a carbonyl group of acrylic acid is bonded unless otherwise noted.

Hereinafter, acrylic acid ester formed by a hydrogen atom bonded to a carbon atom at the α-position being substituted with a substituent is also referred to as α-substituted acrylic acid ester. Further, the acrylic acid ester and the α-substituted acrylic acid ester are also collectively referred to as "(α-substituted)acrylic acid ester".

A "constitutional unit derived from acrylamide" indicates a constitutional unit formed by an ethylenic double bond of acrylamide being cleaved.

In acrylamide, a hydrogen atom bonded to a carbon atom at the α-position may be substituted with a substituent, and one or both hydrogen atoms in an amino group of acrylamide may be substituted with substituents. Further, the carbon atom at the α-position of acrylamide indicates a carbon atom to which a carbonyl group of acrylamide is bonded unless otherwise noted.

Examples of the substituent that substitutes for a hydrogen atom bonded to a carbon atom at the α-position of acrylamide are the same as those described as examples of the substituent at the α-position (substituent ($R^{\alpha 0}$)) in the α-substituted acrylic acid ester.

A "constitutional unit derived from hydroxystyrene or a hydroxystyrene derivative" indicates a constitutional unit formed by an ethylenic double bond of hydroxystyrene or a hydroxystyrene derivative being cleaved.

A "hydroxystyrene derivative" indicates a derivative formed by a hydrogen atom at the α-position of hydroxystyrene being substituted with another substituent such as an alkyl group or a halogenated alkyl group, and the concept of the "hydroxystyrene derivative" includes these derivatives. Examples of these derivatives include a derivative formed by a hydrogen atom of a hydroxyl group of hydroxystyrene, in which a hydrogen atom at the α-position may be substituted with a substituent, being substituted with an organic group; and a derivative formed by a substituent other than a hydroxyl group being bonded to a benzene ring of hydroxystyrene in which a hydrogen atom at the α-position may be substituted with a substituent. Further, the α-position of hydroxystyrene (carbon atom at the α-position) indicates a carbon atom to which a benzene ring is bonded unless otherwise noted.

Examples of the substituent that substitutes for a hydrogen atom at the α-position of hydroxystyrene are the same as those described as examples of the substituent (substituent ($R^{\alpha 0}$)) at the α-position in the α-substituted acrylic acid ester.

A "constitutional unit derived from vinylbenzoic acid or a vinylbenzoic acid derivative" indicates a constitutional unit formed by an ethylenic double bond of vinylbenzoic acid or a vinylbenzoic acid derivative being cleaved.

A "vinylbenzoic acid derivative" indicates a derivative formed by a hydrogen atom at the α-position of vinylbenzoic acid being substituted with another substituent such as an alkyl group or a halogenated alkyl group, and the concept of the "vinylbenzoic acid derivative" includes these derivatives. Examples of these derivatives include a derivative formed by a hydrogen atom of a carboxy group of vinylbenzoic acid, in which a hydrogen atom at the α-position may be substituted with a substituent, being substituted with an organic group; and a derivative formed by a substituent other than a hydroxyl group and a carboxy group being bonded to a benzene ring of vinylbenzoic acid in which a hydrogen atom at the α-position may be substituted with a substituent. Further, the α-position of vinylbenzoic acid (carbon atom at the α-position) indicates a carbon atom to which a benzene ring is bonded unless otherwise noted.

The concept of "styrene" includes those formed by hydrogen atoms in styrene and the α-position of styrene being substituted with other substituents such as an alkyl group and a halogenated alkyl group.

A "styrene derivative" indicates a derivative formed by a hydrogen atom at the α-position of styrene being substituted with another substituent such as an alkyl group or a halogenated alkyl group, and the concept of the "styrene derivative" includes these derivatives. Examples of these derivatives include those formed by a substituent being bonded to a benzene ring of styrene in which a hydrogen atom at the α-position may be substituted with a substituent. Further, the α-position (carbon atom at the α-position) indicates a carbon atom to which a benzene ring is bonded unless otherwise noted.

A "constitutional unit derived from styrene" or a "constitutional unit derived from a styrene derivative" indicates a constitutional unit formed by an ethylenic double bond of styrene or a styrene derivative being cleaved.

As the alkyl group as a substituent at the α-position, a linear or branched alkyl group is preferable, and specific examples thereof include an alkyl group having 1 to 5 carbon atoms (such as a methyl group, an ethyl group, an n-propyl group, an isopropyl group, an n-butyl group, an isobutyl group, a tert-butyl group, a pentyl group, an isopentyl group, or a neopentyl group).

Further, specific examples of the halogenated alkyl group as a substituent at the α-position include groups formed by some or all hydrogen atoms in the "alkyl group as a substituent at the α-position" being substituted with halogen atoms. Examples of the halogen atoms include a fluorine atom, a chlorine atom, a bromine atom, and an iodine atom. Among these, a fluorine atom is particularly preferable.

In addition, specific examples of the hydroxyalkyl group as a substituent at the α-position include groups formed by some or all hydrogen atoms in the "alkyl group as a substituent at the α-position" being substituted with hydroxyl groups. The number of hydroxyl groups in the hydroxyalkyl group is preferably in a range of 1 to 5 and most preferably 1.

Resist Composition

A resist composition according to a first aspect of the present invention generates an acid when exposed and the solubility thereof in a developer is changed due to an action of an acid.

As an embodiment of such a resist composition, a resist composition that contains a base material component (A) (hereinafter, also referred to as an "(A) component") whose solubility in a developer is changed due to an action of an acid is exemplified.

In the resist composition of the present embodiment, the (A) component contains a polymer compound (A1) (hereinafter, referred to as an "(A1) component") having a constitutional unit derived from a compound represented by Formula (a0-1), a constitutional unit represented by Formula (a0-2), and a constitutional unit represented by Formula (a0-3).

In a case where a resist film is formed using the resist composition of the present embodiment and the resist film is selectively exposed, an acid is generated in the exposed portion of the resist film so that the solubility in a developer of the (A) component is changed due to an action of the acid, but the solubility in a developer of the (A) component is not changed in the unexposed portion of the resist film. Therefore, a difference in solubility in a developer is generated between the exposed portion and the unexposed portion of the resist film. Accordingly, in a case where the resist film is developed using an organic developer, the unexposed portion of the resist film is dissolved and removed and then a negative type resist pattern is formed.

In the present specification, a resist composition that forms a positive type resist pattern by the exposed portion of the resist film being dissolved and removed is referred to as a positive type resist composition; and a resist composition that forms a negative type resist pattern by the unexposed portion of the resist film being dissolved and removed is referred to as a negative type resist composition.

The resist composition of the present embodiment is suitable for a negative type development process performed using an organic developer during a development treatment when a resist pattern is formed.

The resist composition of the present embodiment has acid-generating ability for generating an acid when exposed, and the (A) component may generate an acid when exposed or an additive component blended separately from the (A) component may generate an acid when exposed.

Specifically, (1) the resist composition of the present embodiment may contain an acid generator component (B) (hereinafter, referred to as a "(B) component") that generates an acid when exposed; (2) the (A) component may be a component that generates an acid when exposed; and (3) the (A) component is a component that generates an acid when exposed and may further contain the (B) component.

In other words, in a case of (2) or (3) described above, the (A) component becomes a "base material component which generates an acid when exposed and whose solubility in a developer is changed due to an action of an acid". In a case where the (A) component is a base material component which generates an acid when exposed and whose solubility in a developer is changed due to an action of an acid, it is preferable that an (A1) component described below be a polymer compound which generates an acid when exposed and whose solubility in a developer is changed due to an action of an acid. As such a polymer compound, a resin having a constitutional unit that generates an acid when exposed can be used. As a monomer from which a constitutional unit generating an acid when exposed is derived, known ones can be used. It is particularly preferable that the resist composition of the present embodiment correspond to the case of (1) described above.

(A) Component

The (A) component is a base material component whose solubility in a developer is changed due to an action of an acid.

The "base material component" in the present invention is an organic compound having film-forming ability, and an organic compound having a molecular weight of 500 or greater is preferably used. In a case where the molecular weight of the organic compound is 500 or greater, the film-forming ability is improved and a nano-level resist pattern is easily formed.

The organic compound used as the base material component is roughly classified into a non-polymer and a polymer.

A non-polymer having a molecular weight of 500 or greater and less than 4000 is typically used as the non-polymer. Hereinafter, a "low-molecular-weight compound" described below indicates a non-polymer having a molecular weight of 500 or greater and less than 4000.

A polymer having a molecular weight of 1000 or greater is typically used as the polymer. Hereinafter, a "resin", a "polymer compound", or a "polymer" described below indicates a polymer having a molecular weight of 1000 or greater.

As the molecular weight of a polymer, a weight-average molecular weight in terms of polystyrene according to gel permeation chromatography (GPC) is used.

In the resist composition of the present embodiment, at least a polymer compound (A1) having a constitutional unit represented by Formula (a0-1) (hereinafter, referred to as a "constitutional unit (a01)"), a constitutional unit represented by Formula (a0-2) (hereinafter, referred to as a "constitutional unit (a02)"), and a constitutional unit represented by Formula (a0-3) and different from the constitutional unit (a02) (hereinafter, referred to as a "constitutional unit (a03)") is used for the (A) component. Further, a polymer compound other than the (A1) component and/or a low-molecular-weight compound may be used in combination.

In a case where a resist film is formed using the resist composition that contains at least the (A1) component and the resist film is selectively exposed, in the exposed portion of the resist film, an acid is generated from a (B) component in a case where the resist composition contains the (B) component so that the solubility of the exposed portion of the resist film in an organic developer is decreased due to an action of the acid. Accordingly, in a case where the resist film obtained by coating the support with the resist composition of the present embodiment is selectively exposed when a resist pattern is formed, the solubility of the unexposed portion of the resist film in an organic developer is not changed while the solubility of the exposed portion of the resist film in an organic developer is changed into insolubility. Therefore, a negative type resist pattern is formed by performing development using an organic developer.

Regarding (A1) Component

The (A1) component is a polymer compound having a constitutional unit represented by Formula (a0-1) (constitutional unit (a01)), a constitutional unit represented by Formula (a0-2) (constitutional unit (a02)), and a constitutional unit represented by Formula (a0-3) and having a structure different from the structure of the constitutional unit (a02) (constitutional unit (a03)).

Constitutional Unit (a01)

The constitutional unit (a01) is a constitutional unit represented by Formula (a0-1). By employing the constitutional unit (a01), the affinity between the resist composition and a substrate or a lower layer film is improved so that pattern collapse of the formed pattern can be suppressed. Further, a pattern having an excellent shape with reduced roughness can be formed by using the constitutional unit (a01).

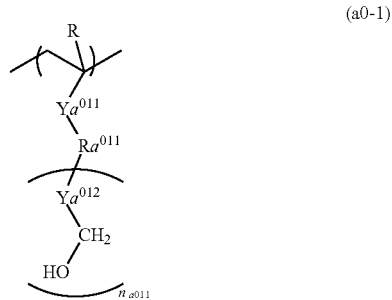

(a0-1)

[In the formula, R represents a hydrogen atom, an alkyl group having 1 to 5 carbon atoms, or a halogenated alkyl group having 1 to 5 carbon atoms. $Ya^{011}$ represents a divalent linking group. $Ra^{011}$ represents a cyclic aliphatic hydrocarbon group which may have a substituent. $Ya^{012}$ represents a single bond or a divalent linking group. $n_{a011}$ represents an integer of 1 to 3. In a case where $n_{a011}$ represents 2 or greater, a plurality of $Ya^{012}$'s may be the same as or different from each other.]

In Formula (a0-1), R represents a hydrogen atom, an alkyl group having 1 to 5 carbon atoms, or a halogenated alkyl group having 1 to 5 carbon atoms.

As the alkyl group having 1 to 5 carbon atoms as R, a linear or branched alkyl group having 1 to 5 carbon atoms is preferable, and specific examples thereof include a methyl group, an ethyl group, an n-propyl group, an isopropyl group, an n-butyl group, an isobutyl group, a tert-butyl group, a pentyl group, an isopentyl group, and a neopentyl group.

The halogenated alkyl group having 1 to 5 carbon atoms as R, a group formed by some or all hydrogen atoms in the alkyl group having 1 to 5 carbon atoms being substituted with halogen atoms. Examples of the halogen atoms include a fluorine atom, a chlorine atom, a bromine atom, and an iodine atom. Among these, a fluorine atom is particularly preferable.

R represents preferably a hydrogen atom, an alkyl group having 1 to 5 carbon atoms, or a fluorinated alkyl group having 1 to 5 carbon atoms, more preferably a hydrogen atom or an alkyl group having 1 to 5 carbon atoms from the viewpoint of ease of industrial availability, still more preferably an alkyl group having 1 to 5 carbon atoms, and particularly preferably a methyl group.

In Formula (a0-1), $Ya^{011}$ represents a divalent linking group.

The divalent linking group as $Ya^{011}$ is not particularly limited, and suitable examples thereof include a divalent hydrocarbon group which may have a substituent and a divalent linking group having heteroatoms.

Divalent hydrocarbon group which may have substituent

In a case where $Ya^{011}$ represents a divalent hydrocarbon group which may have a substituent, the hydrocarbon group may be an aliphatic hydrocarbon group or an aromatic hydrocarbon group.

Aliphatic Hydrocarbon Group as $Ya^{011}$

The aliphatic hydrocarbon group as a divalent hydrocarbon group represented by $Ya^{011}$ may be saturated or unsaturated. However, a saturated aliphatic hydrocarbon group is usually preferable.

More specific examples of the aliphatic hydrocarbon group include a linear or branched aliphatic hydrocarbon group and an aliphatic hydrocarbon group having a ring in the structure.

Linear or Branched Aliphatic Hydrocarbon Group

The number of carbon atoms of the linear aliphatic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The number of carbon atoms of the branched aliphatic hydrocarbon group is preferably in a range of 2 to 10, more preferably in a range of 3 to 6, still more preferably 3 or 4, and most preferably 3.

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms substituted with a fluorine atom, and a carbonyl group.

Aliphatic hydrocarbon group having ring in structure

Examples of the aliphatic hydrocarbon group having a ring in the structure include a cyclic aliphatic hydrocarbon group (group formed by removing two hydrogen atoms from an aliphatic hydrocarbon ring) which may have a substituent having heteroatoms in the ring structure; a group formed by the cyclic aliphatic hydrocarbon group being bonded to the terminal of a linear or branched aliphatic hydrocarbon group; and a group formed by the cyclic aliphatic hydrocarbon group being interposed in the middle of a linear or branched aliphatic hydrocarbon group. Examples of the linear or branched aliphatic hydrocarbon group are the same as those described above.

The number of carbon atoms of the alicyclic hydrocarbon group is preferably in a range of 3 to 20 and more preferably in a range of 3 to 12.

The cyclic aliphatic hydrocarbon group may be polycyclic or monocyclic. As the monocyclic alicyclic hydrocarbon group, a group formed by removing two hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing two hydrogen atoms from a polycycloalkane is preferable. The number of carbon atoms of the polycycloalkane is preferably in a range of 7 to 12, and specific examples thereof include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

As the alkyl group as a substituent, an alkyl group having 1 to 5 carbon atoms is preferable; and a methyl group, an ethyl group, a propyl group, an n-butyl group, and a tert-butyl group are more preferable.

As the alkoxy group as a substituent, an alkoxy group having 1 to 5 carbon atoms is preferable; a methoxy group, an ethoxy group, an n-propoxy group, an iso-propoxy group, an n-butoxy group, and a tert-butoxy group are more preferable; and a methoxy group and an ethoxy group are still more preferable.

Examples of the halogen atom as a substituent include a fluorine atom, a chlorine atom, a bromine atom, and an iodine atom. Among these, a fluorine atom is preferable.

As the halogenated alkyl group as a substituent, a group formed by some or all hydrogen atoms in the alkyl group being substituted with the halogen atoms is exemplified.

In the cyclic aliphatic hydrocarbon group, some carbon atoms constituting the ring structure may be substituted with substituents having heteroatoms. As the substituents having heteroatoms, —O—, —C(=O)—O—, —S—, —S(=O)$_2$—, and —S(=O)$_2$—O— are preferable.

Aromatic Hydrocarbon Group as Ya$^{o11}$

The aromatic hydrocarbon group as a divalent hydrocarbon group represented by Ya$^{o11}$ is a hydrocarbon group having at least one aromatic ring.

The aromatic ring is not particularly limited as long as the aromatic ring is a cyclic conjugated system having (4n+2) π electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Here, it is determined that the number of carbon atoms does not include the number of carbons in a substituent.

Specific examples of the aromatic ring include an aromatic hydrocarbon ring such as benzene, naphthalene, anthracene, or phenanthrene; and an aromatic heterocycle formed by some carbon atoms constituting the aromatic hydrocarbon ring being substituted with heteroatoms. Examples of the heteroatoms in the aromatic heterocycle include an oxygen atom, a sulfur atom, and a nitrogen atom. Specific examples of the aromatic heterocycle include a pyridine ring and thiophene ring.

Specific examples of the aromatic hydrocarbon group as Ya$^{o11}$ include a group (such as an arylene group or a heteroarylene group) formed by removing two hydrogen atoms from the aromatic hydrocarbon ring or the aromatic heterocycle; a group formed by removing two hydrogen atoms from an aromatic compound (such as phenyl or fluorene) having two or more aromatic rings; and a group (a group formed by removing one hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group) formed by one hydrogen atom in a group (such as an aryl group or a heteroaryl group), obtained by removing one hydrogen atom from the aromatic hydrocarbon ring or the aromatic heterocycle, being substituted with an alkylene group. The number of carbon atoms of the alkylene group bonded to the aryl group or the heteroaryl group is preferably in a range of 1 to 4, more preferably 1 or 2, and particularly preferably 1.

In the aromatic hydrocarbon group, a hydrogen atom in the aromatic hydrocarbon group may be substituted with a substituent. For example, a hydrogen atom bonded to an aromatic ring in the aromatic hydrocarbon group may be substituted with a substituent. Examples of the substituent include an alkyl group, an alkoxy group, a halogen atom, a halogenated alkyl group, and a hydroxyl group.

As the alkyl group as the substituent, an alkyl group having 1 to 5 carbon atoms is preferable; and a methyl group, an ethyl group, a propyl group, an n-butyl group, or a tert-butyl group is more preferable.

Examples of the alkoxy group, the halogen atom, and the halogenated alkyl group as the substituents include those described as examples of the substituent which may be included in the cyclic aliphatic hydrocarbon group.

Divalent Linking Group having Heteroatoms

The heteroatoms in the divalent linking group having heteroatoms are atoms other than a carbon atom and a hydrogen atom, and examples thereof include an oxygen atom, a nitrogen atom, a sulfur atom, and a halogen atom.

In a case where Ya$^{o11}$ represents a divalent linking group having heteroatoms, preferred examples of the linking group include a group represented by —O—, —C(=O)—O—, —O—C(=O)—, —C(=O)—, —O—C(=O)—O—, —C(=O)—NH—, —NH—, —NH—C(=NH)—(H may be substituted with a substituent such as an alkyl group or an acyl group), —S—, —S(=O)$_2$—, —S(=O)$_2$—O—, Formula —Y$^{21}$—O—Y$^{22}$—, —Y$^{21}$—O—, —O—Y$^{21}$—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, or —Y$^{21}$—S(=O)$_2$—O—Y$^{22}$— [in the formula, Y$^{21}$ and Y$^{22}$ each independently represents a divalent hydrocarbon group which may have a substituent, O represents an oxygen atom, and m" represents an integer of 0 to 3].

In a case where the divalent linking group having heteroatoms represents —C(=O)—NH—, —C(=O)—NH—C(=O)—, —NH—, or —NH—C(=NH)—, H in the formula may be substituted with a substituent such as an alkyl group or an acyl group. The number of carbon atoms of the substituent (such as an alkyl group or an acyl group) is preferably in a range of 1 to 10, more preferably in a range of 1 to 8, and still more preferably in a range of 1 to 5.

In Formula —$Y^{21}$—O—$Y^{22}$—, —$Y^{21}$—O—, —O—$Y^{21}$—, —$Y^{21}$C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$ and $Y^{22}$ each independently represents a divalent hydrocarbon group which may have a substituent. Examples of the divalent hydrocarbon group are the same as those for the divalent linking group (divalent hydrocarbon group which may have a substituent) described above.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. As the alkyl group in the alkylmethylene group, a linear alkyl group having 1 to 5 carbon atoms is preferable, a linear alkyl group having 1 to 3 carbon atoms is more preferable, and a methyl group is most preferable.

In the group represented by Formula —[$Y^{21}$—C(=O)—O]$_{m''}$—$Y^{22}$—, m'' represents an integer of 0 to 3, preferably an integer of 0 to 2, more preferably 0 or 1, and particularly preferably 1. In other words, as the group represented by Formula —[$Y^{21}$—C(=O)—O]$_{m''}$—$Y^{22}$—, a group represented by Formula —$Y^{21}$—C(=O)—O—$Y^{22}$— is particularly preferable. Among the examples, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

Among the examples, as $Ya^{011}$, a group having an ester bond [—C(=O)—O— or —O—C(=O)—] and/or an aromatic hydrocarbon group is preferable; a group formed of an ester bond, a combination of a linear or branched alkylene group and one or more ester bonds, a combination of an aromatic hydrocarbon group, an ester bond, and a linear or branched alkylene group, or a combination of an aromatic hydrocarbon group, an ether bond (—O—), and a linear or branched alkylene group is more preferable; a group formed of an ester bond or a combination of a linear or branched alkylene group and one or more ester bonds is particularly preferable; and —C(=O)—O— is most preferable.

In Formula (a0-1), $Ra^{011}$ represents a cyclic aliphatic hydrocarbon group which may have a substituent.

The number of carbon atoms of the cyclic aliphatic hydrocarbon group is preferably in a range of 3 to 20 and more preferably in a range of 3 to 12.

The cyclic aliphatic hydrocarbon group may be a polycyclic group or a monocyclic group. As the monocyclic alicyclic hydrocarbon group, a group formed by removing ($n_{011}$+1) hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing ($n_{a011}$+1) hydrogen atoms from a polycycloalkane is preferable. The number of carbon atoms of the polycycloalkane is preferably in a range of 7 to 12, and specific examples thereof include adamantane, noradamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

As the alkyl group as a substituent, an alkyl group having 1 to 5 carbon atoms is preferable; and a methyl group, an ethyl group, a propyl group, an n-butyl group, and a tert-butyl group are more preferable.

As the alkoxy group as a substituent, an alkoxy group having 1 to 5 carbon atoms is preferable; a methoxy group, an ethoxy group, an n-propoxy group, an iso-propoxy group, an n-butoxy group, and a tert-butoxy group are more preferable; and a methoxy group and an ethoxy group are still more preferable.

Examples of the halogen atom as a substituent include a fluorine atom, a chlorine atom, a bromine atom, and an iodine atom. Among these, a fluorine atom is preferable.

As the halogenated alkyl group as a substituent, a group formed by some or all hydrogen atoms in the alkyl group being substituted with the halogen atoms is exemplified.

In the cyclic aliphatic hydrocarbon group, some carbon atoms constituting the ring structure may be substituted with substituents having heteroatoms. Specifically, a methylene group (—CH$_2$—) constituting the ring structure may be substituted with a substituent having heteroatoms. As the substituents having heteroatoms, —O—, —C(=O)—O—, —S—, —S(=O)$_2$—, and —S(=O)$_2$—O— are preferable.

Among the examples, as $Ra^{011}$, a group formed by removing ($n_{a011}$+1) hydrogen atoms from a polycycloalkane which may have a substituent is preferable, and a bridged alicyclic group which may have a substituent is more preferable.

Further, the "bridged alicyclic group" indicates a cyclic aliphatic hydrocarbon group having a structure in which two or more carbon atoms constituting the ring structure of the cyclic aliphatic hydrocarbon group are cross-linked.

Specific examples of the bridged alicyclic group include a group formed by removing ($n_{a011}$+1) hydrogen atoms from adamantane, noradamantane, norbornane, tricyclodecane, or tetracyclododecane. Among the examples of the group, a group formed by removing ($n_{a02}$+1) hydrogen atoms from adamantane is preferable.

The substituent which may be included in the bridged alicyclic group has the same definition as that for the substituent which may be included in the cyclic aliphatic hydrocarbon group. It is preferable that the bridged alicyclic group as $Ra^{011}$ not have a substituent.

In Formula (a0-1), $Ya^{012}$ represents a single bond or a divalent linking group.

Examples of the divalent linking group as $Ya^{012}$ are the same as those described as examples of the divalent linking group as $Ya^{011}$.

In a case where $Ya^{012}$ represents a divalent hydrocarbon group which may have a substituent, as the hydrocarbon group, an aliphatic hydrocarbon group is preferable and a linear or branched aliphatic hydrocarbon group is more preferable.

In a case where $Ya^{012}$ represents a linear aliphatic hydrocarbon group, the number of carbon atoms of the linear aliphatic hydrocarbon group is preferably in a range of 1 to 10, more preferably in a range of 1 to 6, still more preferably in a range of 1 to 4, particularly preferably in a range of 1 to 3, and most preferably 1 or 2.

As the linear aliphatic hydrocarbon group, a linear alkylene group is preferable, and specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

In a case where $Ya^{012}$ represents a branched aliphatic hydrocarbon group, the number of carbon atoms of the branched aliphatic hydrocarbon group is preferably in a range of 2 to 10, more preferably in a range of 3 to 6, still more preferably 3 or 4, and particularly preferably 3.

As the branched aliphatic hydrocarbon group, a branched alkylene group is preferable, and specific examples thereof include an alkylalkylene group, for example, an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, or —$C(CH_2CH_3)_2$—$CH_2$—; an alkyltrimethylene group such as —$CH(CH_3)CH_2CH_2$— or —$CH_2CH(CH_3)CH_2$—; and an alkyltetramethylene group such as —$CH(CH_3)CH_2CH_2CH_2$— or —$CH_2CH(CH_3)CH_2$—. As the alkyl group in the alkylalkylene group, a linear alkyl group having 1 to 5 carbon atoms is preferable, and an ethyl group or a methyl group is more preferable.

The linear or branched aliphatic hydrocarbon group may or may not have a substituent. Examples of the substituent include a fluorine atom, a fluorinated alkyl group having 1 to 5 carbon atoms substituted with a fluorine atom, a carbonyl group, and a hydroxyl group. It is preferable that the substituent be a hydroxyl group.

In a case where $Ya^{012}$ represents a divalent linking group having heteroatoms, a group having an ether bond (—O—) or an ester bond [—C(=O)—O— or —O—C(=O)—] is preferable as the linking group. Preferred specific examples thereof include a group represented by —O—, —C(=O)—O—, —O—C(=O)—, —C(=O)—, —O—C(=O)—O—, Formula —$Y^{21}$—O—$Y^{22}$—, —$Y^{21}$—O—, —O—$Y^{21}$—, —$Y^{21}$—C(=O)—O—, —C(=O)—O—$Y^{21}$—, —[$Y^{21}$—C(=O)—O]$_{m''}$—$Y^{22}$—, or —$Y^{21}$—O—C(=O)—$Y^{22}$— [in the formula, $Y^{21}$ and $Y^{22}$ each independently represents a divalent hydrocarbon group which may have a substituent, O represents an oxygen atom, and m" represents an integer of 0 to 3].

In Formula —$Y^{21}$—O—$Y^{22}$—, —$Y^{21}$—O—, —O—$Y^{21}$—, —$Y^{21}$—C(=O)—O—, —C(=O)—O—$Y^{21}$—, —[$Y^{21}$—C(=O)—O]$_{m''}$—$Y^{22}$—, or —$Y^{21}$—O—C(=O)—$Y^{22}$—, $Y^{21}$, $Y^{22}$, and m' have the same definitions as those in $Ya^{011}$ (divalent linking group having heteroatoms).

As $Y^{21}$, a linear aliphatic hydrocarbon group is preferable, a linear alkylene group is more preferable, a linear alkylene group having 1 to 5 carbon atoms is still more preferable, a methylene group or an ethylene group is particularly preferable, and a methylene group is most preferable.

As $Y^{22}$, a linear or branched aliphatic hydrocarbon group is preferable, and a methylene group, an ethylene group, or an alkylmethylene group is more preferable. As the alkyl group in the alkylmethylene group, a linear alkyl group having 1 to 5 carbon atoms is preferable, a linear alkyl group having 1 to 3 carbon atoms is more preferable, and a methyl group is most preferable.

Among the examples, as $Ya^{012}$, a single bond, an ester bond [—C(=O)—O— or —O—C(=O)—], an ether bond (—O—), a linear or branched alkylene group, or a combination of these is preferable; a single bond, an ether bond (—O—), a linear or branched alkylene group, or a combination of these is more preferable; a single bond or a combination of an ether bond (—O—) and a linear alkylene group is still more preferable; and a single bond or a group represented by Formula —O—$Y^{21}$— in which $Y^{21}$ represents a linear alkylene group having 1 to 5 carbon atoms (it is preferable that $Y^{21}$ represent a methylene group or an ethylene group) is particularly preferable.

In Formula (a0-1), $n_{a011}$ represents an integer of 1 to 3, preferably 1 or 2, and more preferably 1.

In a case where $n_{a011}$ represents 2 or greater, a plurality of $Ya^{012}$'s may be the same as or different from each other.

Preferred examples of the constitutional unit (a01) include a constitutional unit represented by Formula (a0-1-1).

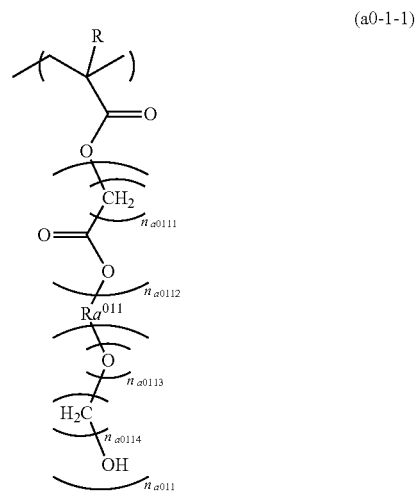

(a0-1-1)

[In the formula, R, $Ra^{011}$, and $n_{a011}$ have the same definitions as those in Formula (a0-1). $n_{0111}$ represents an integer of 1 to 5, $n_{a0112}$ represents an integer of 0 to 2, $n_{a0113}$ represents 0 or 1, and $n_{a0114}$ represents an integer of 1 to 10. In a case where $n_{a0112}$ represents 2 or greater, a plurality of $n_{a0111}$'s may be the same as or different from each other. In a case where $n_{a011}$ represents 2 or greater, a plurality of $n_{a0113}$'s and $n_{a0114}$'s each may be independently the same as or different from each other.]

In Formula (a0-1-1), R, $Ra^{011}$, and $n_{a011}$ have the same definitions as those in Formula (a0-1).

$n_{a0111}$ represents an integer of 1 to 5, preferably an integer of 1 to 3, and more preferably 1 or 2.

$n_{a0112}$ represents an integer of 0 to 2 and preferably 0 or 1.

$n_{a0113}$ represents 0 or 1.

$n_{a0114}$ represents an integer of 1 to 10, preferably an integer of 1 to 5, and more preferably an integer of 1 to 3.

In a case where $n_{a0112}$ represents 2 or greater, a plurality of $n_{a0111}$ may be the same as or different from each other. In a case where $n_{a011}$ represents 2 or greater, a plurality of $n_{a0113}$'s and $n_{a0114}$'s each may be independently the same as or different from each other.

Hereinafter, specific examples of the constitutional unit (a01) will be described. In each of the formulae shown below, $R^\alpha$ represents a hydrogen atom, a methyl group, or a trifluoromethyl group (hereinafter, the same applies to the present specification).
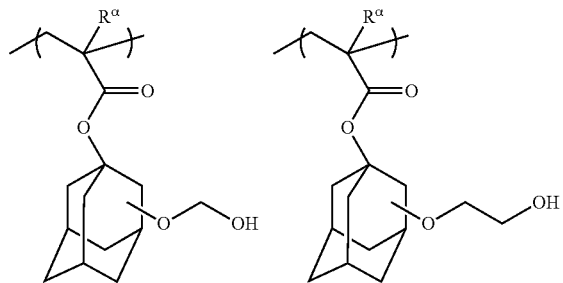
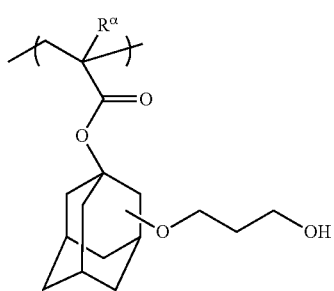
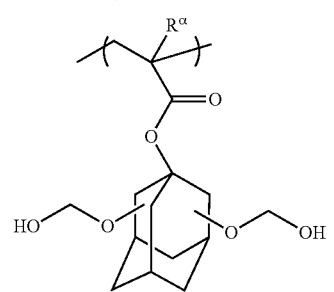
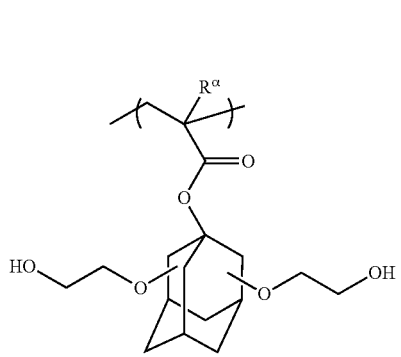
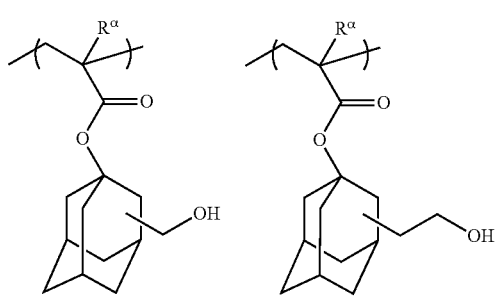
-continued
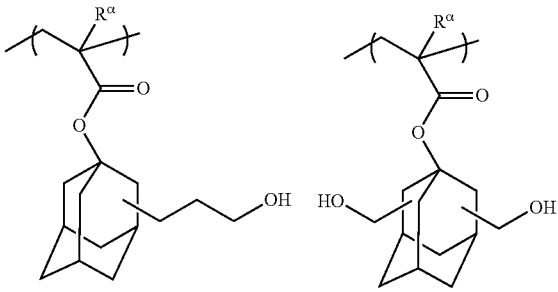
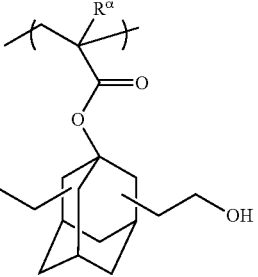
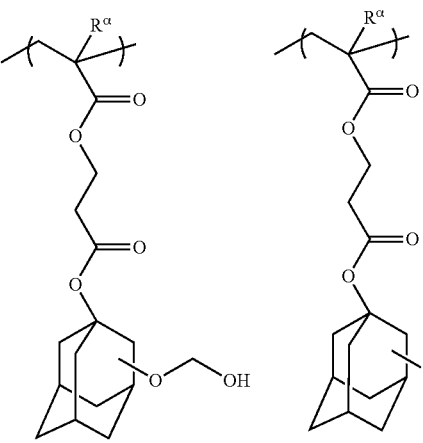
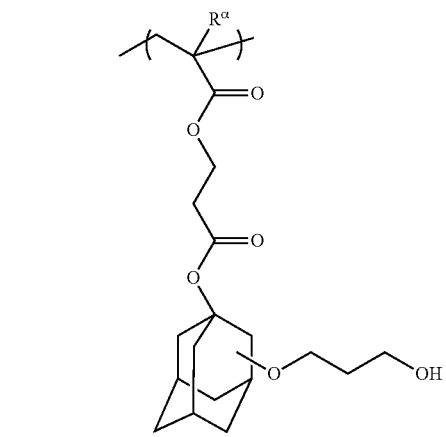
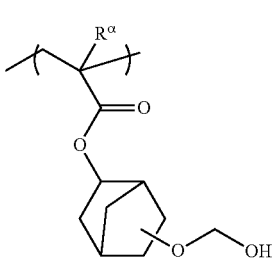

-continued

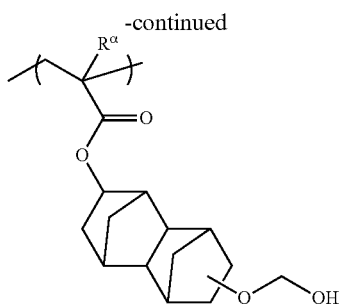

The constitutional unit (a01) included in the (A1) component may be formed of one or two or more kinds thereof.

The proportion of the constitutional unit (a01) in the (A1) component is preferably in a range of 3% to 60% by mole, more preferably in a range of 3% to 50% by mole, still more preferably in a range of 3% to 30% by mole, particularly preferably in a range of 3% to 25% by mole, and most preferably in a range of 3% to 15% by mole with respect to the total amount (100% by mole) of all constitutional units constituting the (A1) component.

In a case where the proportion of the constitutional unit (a01) is greater than or equal to the above-described preferable lower limit, the occurrence of pattern collapse can be suppressed during formation of a resist pattern so that a finer pattern having an excellent shape is likely to be formed. Further, in a case where the proportion of the constitutional unit (a01) is less than or equal to the above-described preferable upper limit, the balance between the constitutional unit and another constitutional unit is likely to be achieved so that a resist pattern to be formed tends to have excellent lithography characteristics and obtain an excellent shape.

Constitutional Unit (a02)

The constitutional unit (a02) is a constitutional unit represented by Formula (a0-2). By employing the constitutional unit (a02), the solubility of a resist film in an organic developer in the organic solvent development process after exposure is controlled and thus film shrink can be suppressed. In addition, by using the constitutional unit (a02) together with the constitutional unit (a03) described below, pattern collapse and the roughness can be both improved in a resist pattern to be formed.

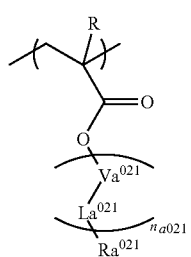

(a0-2)

[In the formula, R represents a hydrogen atom, an alkyl group having 1 to 5 carbon atoms, or a halogenated alkyl group having 1 to 5 carbon atoms. $Va^{021}$ represents a divalent hydrocarbon group which may have an ether bond. $La^{021}$ represents —O—, —COO—, —CON(R')—, —OCO—, —CONHCO—, or —CONHCS—, and R' represents a hydrogen atom or a methyl group. $Ra^{021}$ represents a lactone-containing cyclic group, a carbonate-containing cyclic group, or a —SO$_2$-containing cyclic group. $n_{a021}$ represents 1 or 2. In a case where $n_{a021}$ represents 2, a plurality of $Va^{021}$'s may be the same as or different from each other, and a plurality of $La^{021}$'s may be the same as or different from each other.]

In Formula (a0-2), R represents a hydrogen atom, an alkyl group having 1 to 5 carbon atoms, and a halogenated alkyl group having 1 to 5 carbon atoms. Preferred examples of R are the same as those described as examples of R in Formula (a0-1).

In Formula (a0-2), $Va^{021}$ represents a divalent hydrocarbon group which may have an ether bond. Examples of the divalent hydrocarbon group which may have an ether bond are the same as those described in the case where the divalent linking group as $Ya^{011}$ in Formula (a0-1) is a divalent hydrocarbon group which may have an ether bond as a substituent.

As the divalent hydrocarbon group, an aliphatic hydrocarbon group is preferable, and a linear or branched aliphatic hydrocarbon group is more preferable.

Among the examples, as $Va^{021}$, a linear or branched aliphatic hydrocarbon group having 1 to 3 carbon atoms is preferable, a linear or branched alkylene group having 1 to 3 carbon atoms is more preferable, a linear or branched alkylene group having 1 or 2 carbon atoms is still more preferable, and a methylene group or —CH(CH$_3$)— is particularly preferable.

In Formula (a0-2), $La^{021}$ represents —O—, —COO—, —CON(R')—, —OCO—, —CONHCO—, or —CONHCS—. In Formula —CON(R')—, R' represents a hydrogen atom or a methyl group.

It is preferable that $La^{021}$ represent —COO—.

In Formula (a0-2), $n_{a021}$ represents 1 or 2. In a case where $n_{a021}$ represents 2, a plurality of $Va^{021}$'s may be the same as or different from each other and a plurality of $La^{021}$'s may be the same as or different from each other. It is preferable that $n_{a021}$ represent 1.

In Formula (a0-2), $Ra^{021}$ represents a lactone-containing cyclic group, a carbonate-containing cyclic group, or a —SO$_2$-containing cyclic group.

The "lactone-containing cyclic group" indicates a cyclic group containing a ring (lactone ring) that has —O—C(=O)— in the ring skeleton. The lactone ring is counted as the first ring, and a group with only the lactone ring is referred to as a monocyclic group and a group with other ring structures is referred to as a polycyclic group regardless of the structures. The lactone-containing cyclic group may be a monocyclic group or a polycyclic group.

The lactone-containing cyclic group in the constitutional unit (a02) is not particularly limited, and an optional group can be used as the lactone-containing cyclic group. Specific examples thereof include groups respectively represented by Formulae (a2-r-1) to (a2-r-7). In the following formulae, the symbol "*" represents a binding site (hereinafter, the same applies to the present specification).

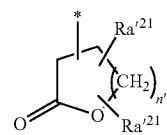

(a2-r-1)

(a2-r-2)
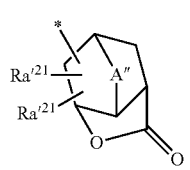

(a2-r-3)
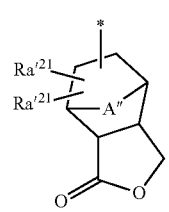

(a2-r-4)
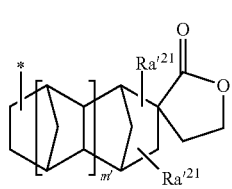

(a2-r-5)
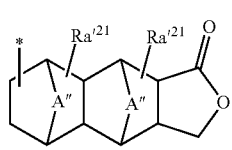

(a2-r-6)
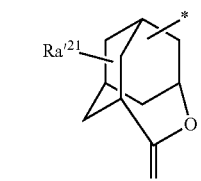

(a2-r-7)
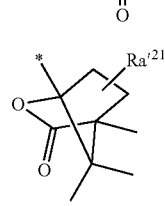

[In the formulae, $Ra'^{21}$'s each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; and A" represents an alkylene group having 1 to 5 carbon atoms which may have an oxygen atom (—O—) or a sulfur atom (—S—), an oxygen atom, or a sulfur atom. n' represents an integer of 0 to 2, and m' represents 0 or 1.]

In Formulae (a2-r-1) to (a2-r-7), as the alkyl group represented by $Ra'^{21}$, an alkyl group having 1 to 6 carbon atoms is preferable. It is preferable that the alkyl group be linear or branched. Specific examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Among these, a methyl group or an ethyl group is preferable, and a methyl group is particularly preferable.

As the alkoxy group represented by $Ra'^{21}$, an alkoxy group having 1 to 6 carbon atoms is preferable.

It is preferable that the alkoxy group be linear or branched. Specific examples thereof include a group formed by an oxygen atom (—O—) being linked to an alkyl group exemplified as the alkyl group as $Ra'^{21}$ described above.

Examples of the halogen atom as $Ra'^{21}$ include a fluorine atom, a chlorine atom, a bromine atom, and an iodine atom. Among these, a fluorine atom is preferable.

Examples of the halogenated alkyl group as $Ra'^{21}$ include a group formed by some or all hydrogen atoms in the alkyl group as $Ra'^{21}$ being substituted with halogen atoms. As the halogenated alkyl group, a fluorinated alkyl group is preferable and a perfluoroalkyl group is more preferable.

In —COOR" and —OC(=O)R" as $Ra'^{21}$, both (R")'s represent a hydrogen atom, an alkyl group, a lactone-containing cyclic group, a carbonate-containing cyclic group, or a —SO$_2$-containing cyclic group.

The alkyl group as R" may be linear, branched, or cyclic, and the number of carbon atoms is preferably in a range of 1 to 15.

In a case where R" represents a linear or branched alkyl group, the number of carbon atoms is preferably in a range of 1 to 10 and more preferably in a range of 1 to 5. In addition, a methyl group or an ethyl group is particularly preferable as the linear or branched alkyl group.

In a case where R" represents a cyclic alkyl group, the number of carbon atoms is preferably in a range of 3 to 15, more preferably in a range of 4 to 12, and most preferably in a range of 5 to 10. Specific examples thereof include a group formed by removing one or more hydrogen atoms from a monocycloalkane which may or may not substituted with a fluorine atom or a fluorinated alkyl group; and a group formed by removing one or more hydrogen atoms from a polycycloalkane such as a bicycloalkane, a tricycloalkane, or a tetracycloalkane. More specific examples thereof include a group formed by removing one or more hydrogen atoms from a monocycloalkane such as cyclopentane or cyclohexane; and a group formed by removing one or more hydrogen atoms from a polycycloalkane such as adamantane, norbornane, isobornane, tricyclodecane, and tetracyclododecane.

Examples of the lactone-containing cyclic group as R" are the same as those for the groups respectively represented by Formulae (a2-r-1) to (a2-r-7).

The carbonate-containing cyclic group as R" has the same definition as that for the carbonate-containing cyclic group described below. Specific examples thereof include groups respectively represented by Formulae (ax3-r-1) to (ax3-r-3).

The —SO$_2$-containing cyclic group as R" has the same definition as that for the —SO$_2$-containing cyclic group described below. Specific examples thereof include groups respectively represented by Formulae (a5-r-1) to (a5-r-4).

The number of carbon atoms of the hydroxyalkyl group represented by $Ra'^{21}$ is preferably in a range of 1 to 6, and specific examples thereof include a group formed by at least one of the hydrogen atoms in the alkyl group as $Ra'^{21}$ being substituted with a hydroxyl group.

Among the examples, $Ra'^{21}$ represents preferably a hydrogen atom or an alkyl group having 1 to 6 carbon atoms and more preferably a hydrogen atom.

In Formulae (a2-r-2), (a2-r-3), and (a2-r-5), as the alkylene group having 1 to 5 carbon atoms represented by A", a linear or branched alkylene group is preferable and examples thereof include a methylene group, an ethylene group, an n-propylene group, and an isopropylene group. In a case where the alkylene group has an oxygen atom or a sulfur atom, specific examples thereof include a group formed by —O— or —S— being interposed at the terminal thereof or between carbon atoms, such as —O—CH$_2$—, —CH$_2$—O—CH$_2$—, —S—CH$_2$—, or —CH$_2$—S—CH$_2$—. As A", an alkylene group having 1 to 5 carbon atoms or —O— is preferable; an alkylene group having 1 to 5 carbon atoms is more preferable; and a methylene group is most preferable.

Specific examples of the groups respectively represented by Formulae (a2-r-1) to (a2-r-7) are shown below.

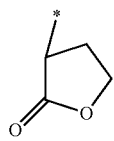
(r-Ic-1-1)

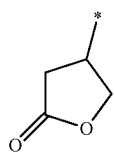
(r-Ic-1-2)

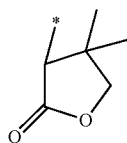
(r-Ic-1-3)

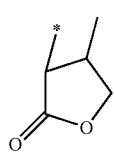
(r-Ic-1-4)

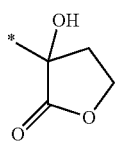
(r-Ic-1-5)

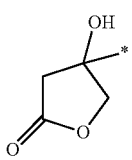
(r-Ic-1-6)

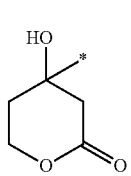
(r-Ic-1-7)

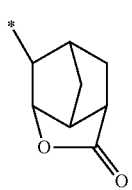
(r-Ic-2-1)

-continued

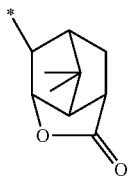
(r-Ic-2-2)

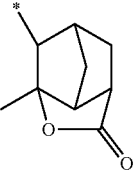
(r-Ic-2-3)

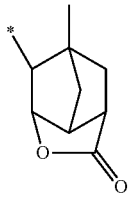
(r-Ic-2-4)

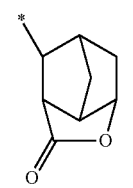
(r-Ic-2-5)

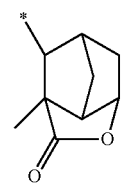
(r-Ic-2-6)

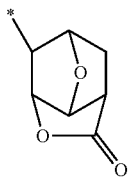
(r-Ic-2-7)

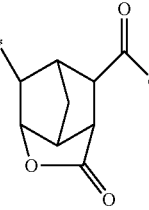
(r-Ic-2-8)

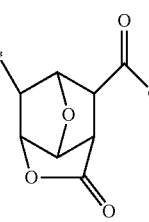
(r-Ic-2-9)

-continued
(r-Ic-2-10)
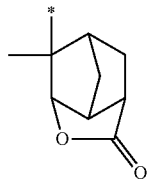
(r-Ic-2-11)
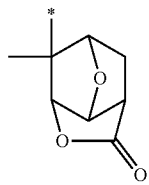
(r-Ic-2-12)
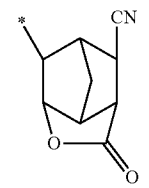
(r-Ic-2-13)
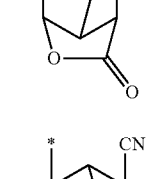
(r-Ic-2-14)
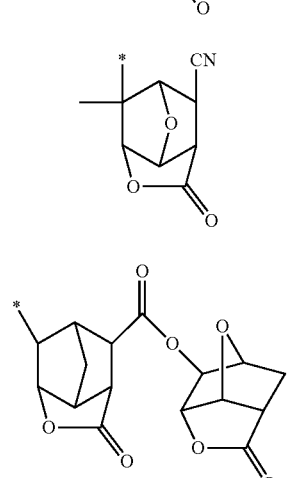
(r-Ic-2-15)
(r-Ic-2-16)
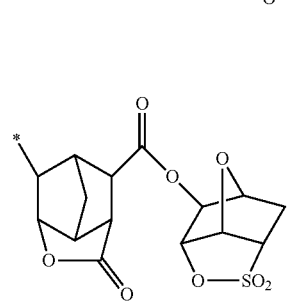
-continued
(r-Ic-2-17)
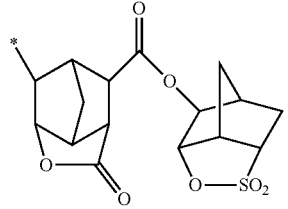
(r-Ic-2-18)
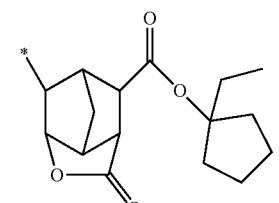
(r-Ic-3-1)
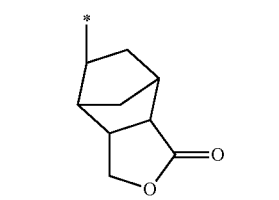
(r-Ic-3-2)
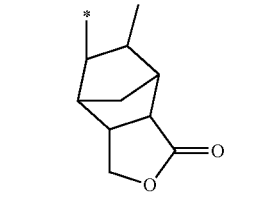
(r-Ic-3-3)
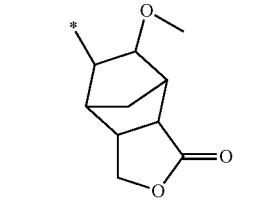
(r-Ic-3-4)
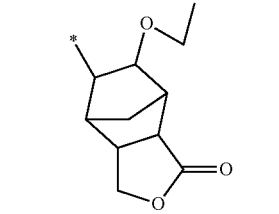
(r-Ic-3-5)
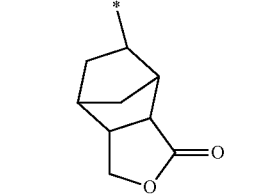
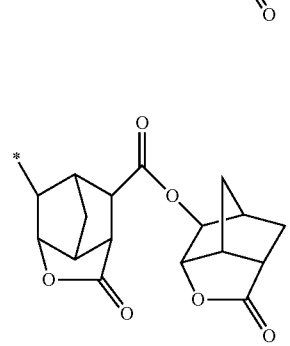

(r-Ic-4-1) 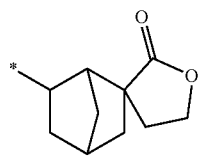

(r-Ic-4-2) 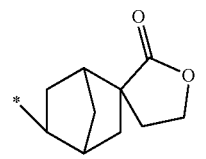

(r-Ic-4-3) 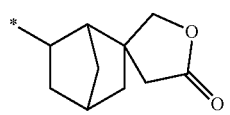

(r-Ic-4-4) 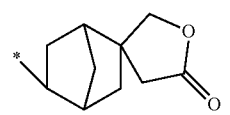

(r-Ic-4-5) 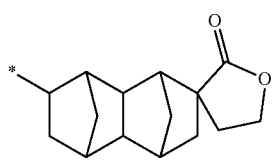

(r-Ic-4-6) 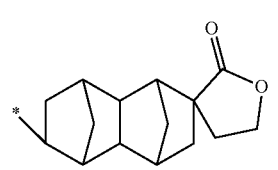

(r-Ic-4-7) 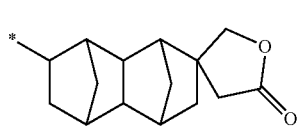

(r-Ic-4-8) 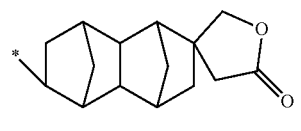

(r-Ic-4-9) 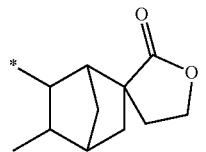

(r-Ic-5-1) 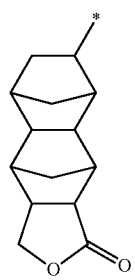

(r-Ic-5-2) 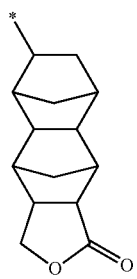

(r-Ic-5-3) 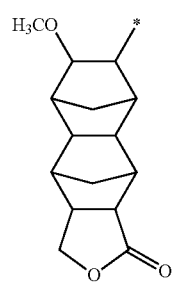

(r-Ic-5-4) 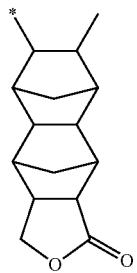

(r-Ic-6-1) 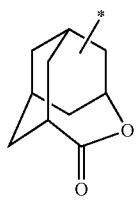

(r-Ic-7-1) 

The "carbonate-containing cyclic group" indicates a cyclic group containing a ring (carbonate ring) that has —O—C(=O)—O— in the ring skeleton. The carbonate ring is counted as the first ring, and a group with only the carbonate ring is referred to as a monocyclic group and a group with other ring structures is referred to as a polycyclic group regardless of the structures. The carbonate-containing cyclic group may be a monocyclic group or a polycyclic group.

The carbonate-containing cyclic group is not particularly limited, and an optional group can be used as the carbonate-containing cyclic group. Specific examples thereof include groups respectively represented by Formulae (ax3-r-1) to (ax3-r-3).

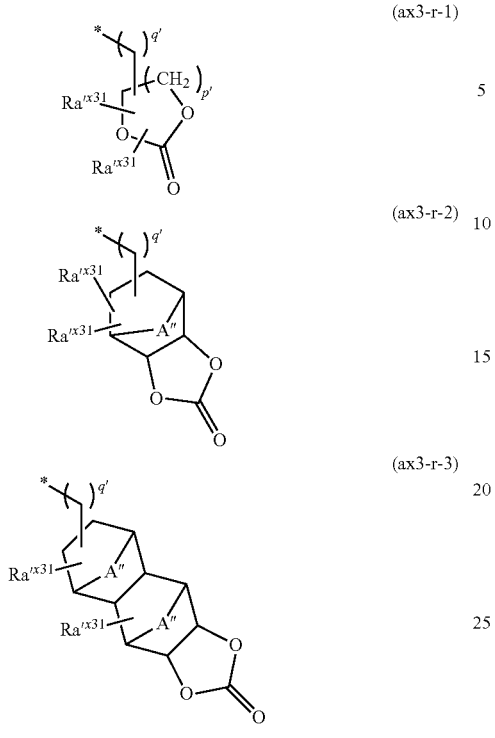
(ax3-r-1)
(ax3-r-2)
(ax3-r-3)

[In the formulae, Ra'$^{x31}$'s each independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom, an alkyl group, a lactone-containing cyclic group, a carbonate-containing cyclic group, or a —SO$_2$-containing cyclic group; and A" represents an alkylene group having 1 to 5 carbon atoms which may have an oxygen atom or a sulfur atom, an oxygen atom, or a sulfur atom. p' represents an integer of 0 to 3, and q' represents 0 or 1.]

In Formulae (ax3-r-1) to (ax3-r-3), A" has the same definition as that for A" in Formulae (a2-r-2), (a2-r-3), and (a2-r-5).

Examples of the alkyl group, the alkoxy group, the halogen atom, the halogenated alkyl group, —COOR", —OC(=O)R", and the hydroxyalkyl group as Ra'$^{31}$ are respectively the same as those for Ra'$^{21}$ in Formulae (a2-r-1) to (a2-r-7).

Specific examples of the groups respectively represented by Formulae (ax3-r-1) to (ax3-r-3) are shown below.

(r-cr-1-1)
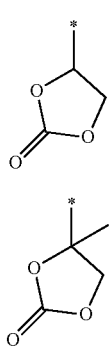

(r-cr-1-2)

(r-cr-1-3)
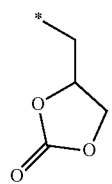

(r-cr-1-4)
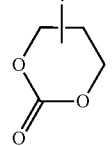

(r-cr-1-5)
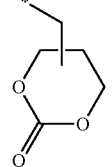

(r-cr-1-6)
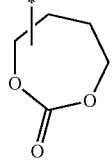

(r-cr-1-7)
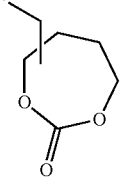

(r-cr-2-1)
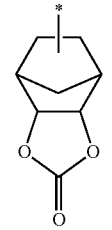

(r-cr-2-2)
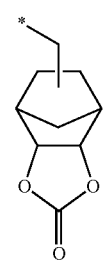

(r-cr-2-3)
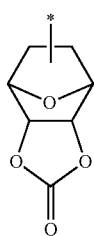

(r-cr-2-4)
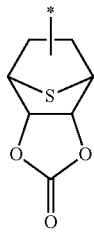

(r-cr-3-1)

(r-cr-3-2)
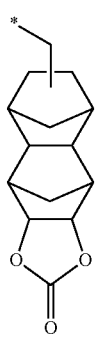

(r-cr-3-3)
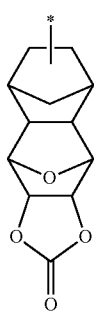

(r-cr-3-4)
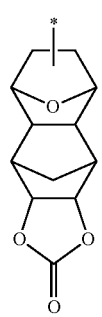

(r-cr-3-5)
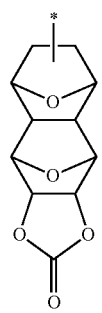

The "—$SO_2$-containing cyclic group" indicates a cyclic group containing a ring that has —$SO_2$— in the ring skeleton and specifically indicates a cyclic group in which a sulfur atom (S) in —$SO_2$— forms a part of the ring skeleton of the cyclic group. The ring having —$SO_2$— in the ring skeleton is counted as the first ring, and a group with only the ring is referred to as a monocyclic group and a group with other ring structures is referred to as a polycyclic group regardless of the structures. The —$SO_2$-containing cyclic group may be a monocyclic group or a polycyclic group.

It is particularly preferable that the —$SO_2$-containing cyclic group be a cyclic group having —O—$SO_2$— in the ring skeleton thereof, in other words, a cyclic group in which —O—S— in —O—$SO_2$— contain a sultone ring forming a part of the ring skeleton.

More specific examples of the —$SO_2$-containing cyclic group include groups respectively represented by Formulae (a5-r-1) to (a5-r-4).

(a5-r-1)
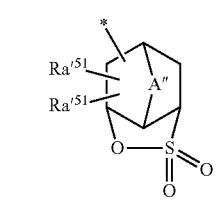

(a5-r-2)
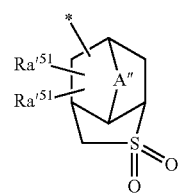

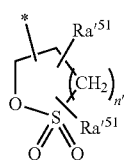
(a5-r-3)

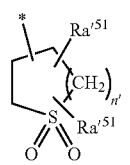
(a5-r-4)

[In the formulae, $Ra'^{51}$'s each independently represents a hydrogen atom, an alkyl group, an alkoxy group, a halogen atom, a halogenated alkyl group, a hydroxyl group, —COOR″, —OC(═O)R″, a hydroxyalkyl group, or a cyano group; R″ represents a hydrogen atom, an alkyl group, a lactone-containing cyclic group, a carbonate-containing cyclic group, or a —SO$_2$-containing cyclic group; and A″ represents an alkylene group having 1 to 5 carbon atoms which may have an oxygen atom or a sulfur atom, an oxygen atom, or a sulfur atom, and n' represents an integer of 0 to 2.]

In Formulae (a5-r-1) to (a5-r-4), A″ has the same definition as that for A″ in Formulae (a2-r-2), (a2-r-3), and (a2-r-5).

Examples of the alkyl group, the alkoxy group, the halogen atom, the halogenated alkyl group, —COOR″, —OC(═O)R″, and the hydroxyalkyl group as $Ra'^{51}$ are respectively the same as those for $Ra'^{21}$ in Formulae (a2-r-1) to (a2-r-7).

Specific examples of the groups respectively represented by Formulae (a5-r-1) to (a5-r-4) are shown below. In the formulae, "Ac" represents an acetyl group.

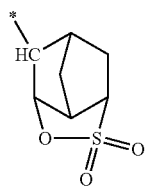
(r-s1-1-1)

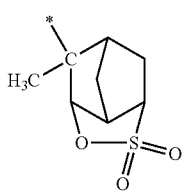
(r-s1-1-2)

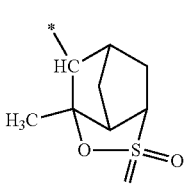
(r-s1-1-3)

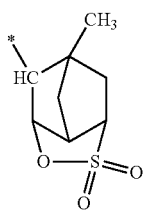
(r-s1-1-4)

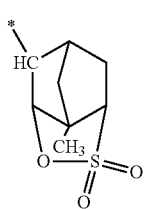
(r-s1-1-5)

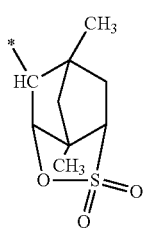
(r-s1-1-6)

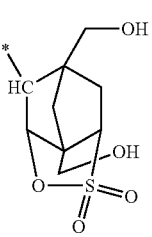
(r-s1-1-7)

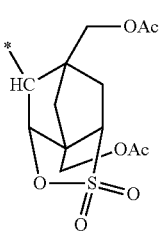
(r-s1-1-8)

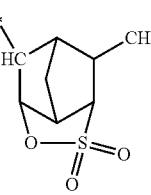
(r-s1-1-9)

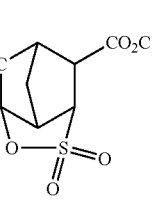
(r-s1-1-10)

-continued
(r-s1-1-11)
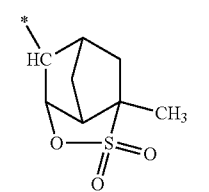
(r-s1-1-12)
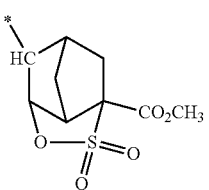
(r-s1-1-13)
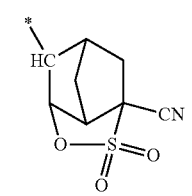
(r-s1-1-14)
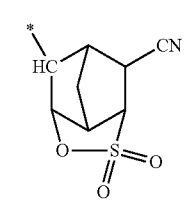
(r-s1-1-15)
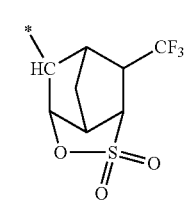
(r-s1-1-16)
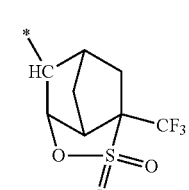
(r-s1-1-17)
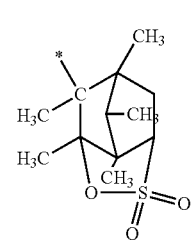
(r-s1-1-18)
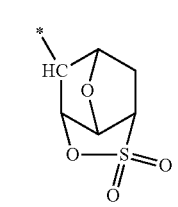
-continued
(r-s1-1-19)
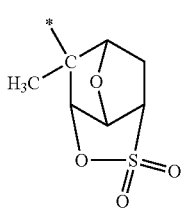
(r-s1-1-20)
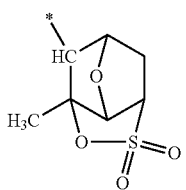
(r-s1-1-21)
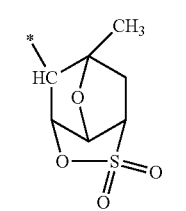
(r-s1-1-22)
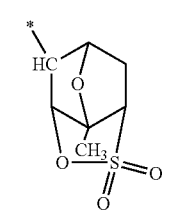
(r-s1-1-23)
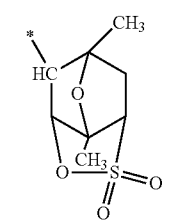
(r-s1-1-24)
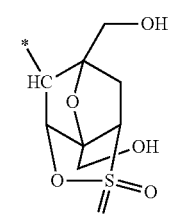
(r-s1-1-25)
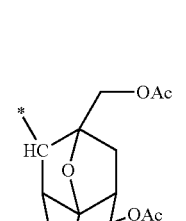

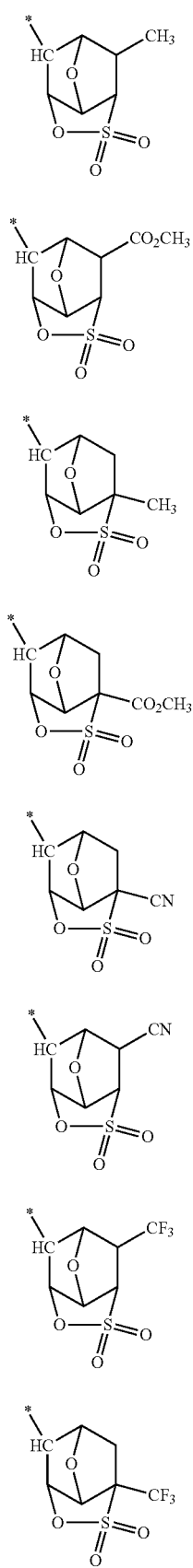
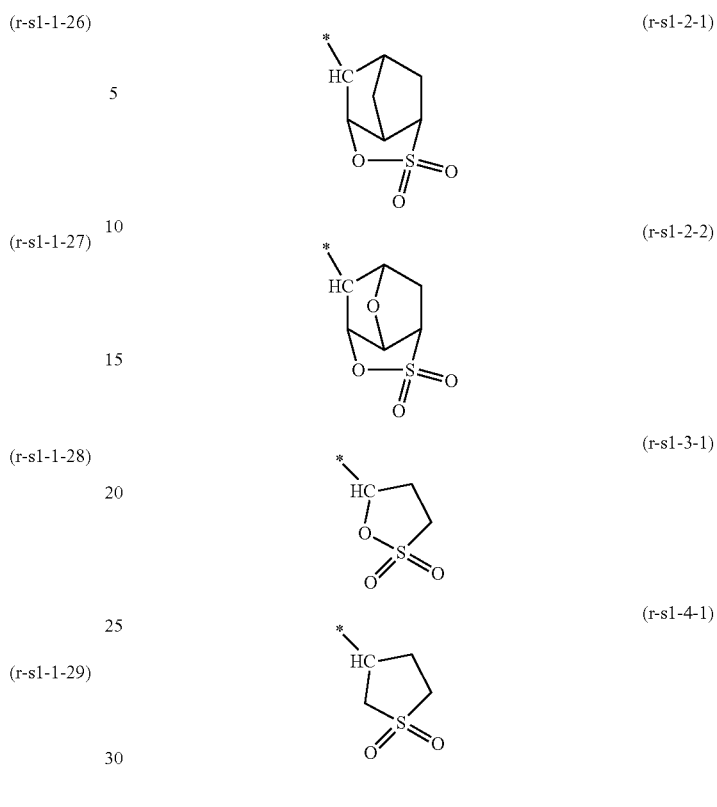

Among the examples, $Ra^{021}$ represents preferably a lactone-containing cyclic group or a —$SO_2$-containing cyclic group and more preferably a —$SO_2$-containing cyclic group.

In a case where $Ra^{021}$ represents a —$SO_2$-containing cyclic group, a group represented by Formula (a5-r-1) from among the groups shown above is preferable. Specifically, a group represented by Chemical Formula (r-s1-1-1) or (r-s1-1-18) is more preferable.

In a case where $Ra^{021}$ represents a lactone-containing cyclic group, groups respectively represented by Formulae (a2-r-1) to (a2-r-3) and (a2-r-6) from among the groups shown above are preferable. Specifically, groups respectively represented by Chemical Formulae (r-1c-1-1) to (r-1c-1-7), (r-1c-2-1) to (r-1c-2-18), (r-1c-3-1) to (r-1c-3-5), and (r-1c-6-1) are more preferable; and groups respectively represented by Chemical Formulae (r-1c-1-1) to (r-1c-1-7), (r-1c-2-1) to (r-1c-2-13), (r-1c-3-1) to (r-1c-3-5), and (r-1c-6-1) are still more preferable.

Constitutional Unit (a03)

The constitutional unit (a03) is a constitutional unit which is represented by Formula (a0-3) and has a structure different from the structure of the constitutional unit (a02) described above. By employing the constitutional unit (a03), the solubility of a resist film in an organic developer in the organic solvent development process after exposure is controlled and thus film shrink can be suppressed. In addition, by using the constitutional unit (a03) together with the constitutional unit (a02) described above, pattern collapse and the roughness can be both improved in a resist pattern to be formed.

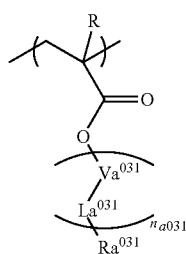

(a0-3)

[In the formula, R represents a hydrogen atom, an alkyl group having 1 to 5 carbon atoms, or a halogenated alkyl group having 1 to 5 carbon atoms. $Va^{031}$ represents a divalent hydrocarbon group which may have an ether bond. $La^{031}$ represents —O—, —COO—, —CON(R')—, —OCO—, —CONHCO—, or —CONHCS—, and R' represents a hydrogen atom or a methyl group. $Ra^{031}$ represents a lactone-containing cyclic group, a carbonate-containing cyclic group, or a —$SO_2$-containing cyclic group. $n_{a031}$ represents 1 or 2. In a case where $n_{a031}$ represents 2, a plurality of $Va^{031}$'s may be the same as or different from each other, and a plurality of $La^{031}$'s may be the same as or different from each other.]

In Formula (a0-3), R represents a hydrogen atom, an alkyl group having 1 to 5 carbon atoms, and a halogenated alkyl group having 1 to 5 carbon atoms. Preferred examples of R are the same as those described as examples of R in Formula (a0-1).

In Formula (a0-3), $Va^{031}$ represents a divalent hydrocarbon group which may have an ether bond. Preferred examples of $Va^{031}$ are the same as those described as examples of $Va^{021}$ in Formula (a0-2).

In Formula (a0-3), $La^{031}$ represents —O—, —COO—, —CON(R')—, —OCO—, —CONHCO—, or —CONHCS—. In Formula —CON(R')—, R' represents a hydrogen atom or a methyl group.

It is preferable that $La^{031}$ represent —COO—.

In Formula (a0-3), $n_{a031}$ represents 1 or 2. In a case where $n_{a031}$ represents 2, a plurality of $Ya^{031}$'s may be the same as or different from each other and a plurality of $La^{031}$'s may be the same as or different from each other. It is preferable that $n_{a031}$ represent 1.

In Formula (a0-3), $Ra^{031}$ represents a lactone-containing cyclic group, a carbonate-containing cyclic group, or a —$SO_2$-containing cyclic group.

Preferred examples of $Ra^{031}$ are the same as those described as examples of $Ra^{021}$ in Formula (a0-2). Suitable specific examples of the lactone-containing cyclic group, the carbonate-containing cyclic group, and the —$SO_2$-containing cyclic group as $Ra^{031}$ respectively include groups respectively represented by Formulae (a2-r-1) to (a2-r-7) described for $Ra^{021}$ in Formula (a0-2), groups respectively represented by Formulae (a5-r-1) to (a5-r-4), and groups respectively represented by Formulae (ax3-r-1) to (ax3-r-3).

Among these, it is preferable that $Ra^{031}$ represent a lactone-containing cyclic group or a —$SO_2$-containing cyclic group.

In a case where $Ra^{031}$ represents a lactone-containing cyclic group, groups respectively represented by Formulae (a2-r-1) to (a2-r-3) and (a2-r-6) from among the groups shown above are preferable. Specifically, groups respectively represented by Chemical Formulae (r-1c-1-1) to (r-1c-1-7), (r-1c-2-1) to (r-1c-2-18), (r-1c-3-1) to (r-1c-3-5), and (r-1c-6-1) are more preferable; and groups respectively represented by Chemical Formulae (r-1c-1-1) to (r-1c-1-7), (r-1c-2-1) to (r-1c-2-13), (r-1c-3-1) to (r-1c-3-5), and (r-1c-6-1) are still more preferable.

In a case where $Ra^{031}$ represents a —$SO_2$-containing cyclic group, a group represented by Formula (a5-r-1) from among the groups shown above is preferable. Specifically, a group represented by Chemical Formula (r-s1-1-1) or (r-s1-1-18) is more preferable.

The constitutional unit (a03) is a constitutional unit having a structure different from the structure of the constitutional unit (a02) described above. In a case where the structure of the constitutional unit (a03) is compared to the structure of the constitutional unit (a02), only one or two or more sites of the structure of the constitutional unit (a03) may be different from the structure of the constitutional unit (a02).

$Va^{031}$ in Formula (a0-3) representing the constitutional unit (a03) may be different from $Va^{021}$ in Formula (a0-2) representing the constitutional unit (a02), $La^{031}$ in Formula (a0-3) may be different from $La^{021}$ in Formula (a0-2), $na^{031}$ in Formula (a0-3) may be different from $na^{021}$ in Formula (a0-2), and $Ra^{031}$ in Formula (a0-3) may be different from $Ra^{021}$ in Formula (a0-2).

Among these, it is preferable that at least one of $Va^{031}$ and $Ra^{031}$ in Formula (a0-3) representing the constitutional unit (a03) be different from $Va^{021}$ and $Ra^{021}$ in Formula (a0-2) representing the constitutional unit (a02) and more preferable that $Ra^{031}$ be different from $Ra^{021}$.

In a case where $Ra^{021}$ in the constitutional unit (a02) is different from $Ra^{031}$ in the constitutional unit (a03), examples of the combination of $Ra^{021}$ with $Ra^{031}$ include a combination of a —$SO_2$-containing cyclic group with a lactone-containing cyclic group, a combination of —$SO_2$-containing cyclic groups, and a combination of lactone-containing cyclic groups.

Specific examples of the combination of a —$SO_2$-containing cyclic group with a lactone-containing cyclic group include a combination of a group represented by Formula (a5-r-1) with a group represented by any of Formulae (a2-r-1), (a2-r-2), (a2-r-3), and (a2-r-6). More specifically, a combination of a group represented by Chemical Formula (r-s1-1-1) or (r-s1-1-1) with a group represented by any of Chemical Formulae (r-1c-1) to (r-1c-1-7), (r-1c-2-1) to (r-1c-2-13), (r-1c-3-1) to (r-1c-3-5), and (r-1c-6-1) is suitably exemplified.

Specific examples of the combination of —$SO_2$-containing cyclic groups include a combination of two groups in which at least one of A" and $Ra'^{51}$ is different from that of the group represented by Formula (a5-r-1). More specifically, a combination of a group represented by Chemical Formula (r-s1-1-1) with a group represented by Chemical Formula (r-s1-1-1) is suitably exemplified.

Specific examples of the combination of lactone-containing cyclic groups include a combination of any two groups respectively represented by Formulae (a2-r-1), (a2-r-2), (a2-r-3), and (a2-r-6). More specifically, a combination of any two groups respectively represented by Chemical Formulae (r-1c-1) to (r-1c-1-7), (r-1c-2-1) to (r-1c-2-13), (r-1c-3-1) to (r-1c-3-5), and (r-1c-6-1) is suitably exemplified.

As the combination of $Ra^{021}$ with $Ra^{031}$, a combination of a —$SO_2$-containing cyclic group with a lactone-containing cyclic group or a combination of —$SO_2$-containing cyclic groups is preferable, and a combination of a —$SO_2$-containing cyclic group with a lactone-containing cyclic group is more preferable.

The constitutional units (a02) and (a03) included in the (A1) component may be respectively formed of one or more kinds thereof; one of the constitutional units (a02) and (a03) may be formed of two or more kinds thereof; or both of the constitutional units may be two or more kinds thereof.

The proportion of the constitutional unit (a02) and the constitutional unit (a03) in the (A1) component is preferably in a range of 2% to 80% by mole, more preferably in a range of 10% to 70% by mole, still more preferably in a range of 10% to 65% by mole, and particularly preferably in a range of 10% to 60% by mole with respect to the total amount (100% by mole) of all constitutional units constituting the (A1) component.

The proportion of the constitutional unit (a02) in the (A1) component is preferably in a range of 1% to 70% by mole, more preferably in a range of 5% to 60% by mole, still more preferably in a range of 5% to 50% by mole, and particularly preferably in a range of 5% to 40% by mole with respect to the total amount (100% by mole) of all constitutional units constituting the (A1) component.

The proportion of the constitutional unit (a03) in the (A1) component is preferably in a range of 1% to 70% by mole, more preferably in a range of 5% to 60% by mole, still more preferably in a range of 5% to 50% by mole, and particularly preferably in a range of 5% to 40% by mole with respect to the total amount (100% by mole) of all constitutional units constituting the (A1) component.

In a case where the proportion of the constitutional units (a02) and (a03) is greater than or equal to the above-described preferable lower limit, film shrink in the organic solvent development process after exposure is suppressed so that the residual film rate can be improved. Further, in a case where the proportion of the constitutional units (a02) and (a03) is less than or equal to the above-described preferable upper limit, the balance between the constitutional units and other constitutional units can be achieved so that various lithography characteristics and the pattern shape become excellent.

Other Constitutional Units

The (A1) component may have other constitutional units in addition to the constitutional unit (a01), the constitutional unit (a02), and the constitutional unit (a03) described above.

Examples of other constitutional units include a constitutional unit (a1) that contains an acid-decomposable group whose polarity is increased due to an action of an acid; a constitutional unit (a2) that contains a lactone-containing cyclic group, a —SO$_2$-containing cyclic group, or a carbonate-containing cyclic group (here, those corresponding to the constitutional units (a02) and (a03) are removed); a constitutional unit (a3) that contains a polar group-containing aliphatic hydrocarbon group (here, those corresponding to the constitutional unit (a01), the constitutional unit (a02), the constitutional unit (a03), the constitutional unit (a1), and the constitutional unit (a2) are removed); a constitutional unit (a4) that contains an acid non-dissociable aliphatic cyclic group; and a constitutional unit derived from styrene or a derivative thereof.

Constitutional Unit (a1):

It is preferable that the (A1) component have the constitutional unit (a1) that contains an acid-decomposable group whose polarity is increased due to an action of an acid in addition to the constitutional unit (a01), the constitutional unit (a02), and the constitutional unit (a03) described above.

The constitutional unit (a1) is a constitutional unit (a1) that contains an acid-decomposable group whose polarity is increased due to an action of an acid.

The "acid-decomposable group" is a group having acid decomposition properties in which at least some bonds in the structure of the acid-decomposable group can be cleaved due to an action of an acid.

As the acid-decomposable group whose polarity is increased by an action of an acid, a group that is decomposed due to an action of an acid to generate a polar group is exemplified.

Examples of the polar group include a carboxy group, a hydroxyl group, an amino group, and a sulfo group (—SO$_3$H). Among these, a polar group containing —OH (hereinafter, also referred to as an OH-containing polar group) in the structure is preferable; a carboxy group or a hydroxyl group is more preferable; and a carboxy group is particularly preferable.

More specifically, a group (for example, a group in which hydrogen atoms in an OH-containing polar group are protected by an acid-dissociable group) in which the polar group is protected by an acid-dissociable group is exemplified as the acid-decomposable group.

Here, the "acid-dissociable group" indicates (i) a group having acid dissociation properties in which a bond between the acid-dissociable group and an atom adjacent to the acid-dissociable group can be cleaved due to an action of an acid or (ii) a group in which some bonds are cleaved due to an action of an acid and then a bond between the acid-dissociable group and an atom adjacent to the acid-dissociable group can be cleaved because of the occurrence of a decarboxylation reaction.

The acid-dissociable group constituting an acid-decomposable group is required to be a group having polarity lower than that of a polar group generated due to dissociation of the acid-dissociable group. In this manner, at the time of dissociation of the acid-dissociable group due to an action of an acid, a polar group having higher polarity than that of the acid-dissociable group is generated so that the polarity is increased. As a result, the polarity of the entire (A1) component is increased. In a case where the polarity is increased, the solubility in an organic developer is relatively decreased.

Examples of the acid-dissociable group include groups suggested as an acid-dissociable group of a base resin for a chemically amplified resist.

Specific examples of the groups suggested as an acid-dissociable group of a base resin for a chemically amplified resist include an "acetal type acid-dissociable group", a "tertiary alkyl ester type acid-dissociable group", and a "tertiary alkyloxycarbonyl acid-dissociable group" described below.

Acetal Type Acid-Dissociable Group:

As an acid-dissociable group that protects a carboxy group or a hydroxyl group among polar groups, an acid-dissociable group represented by Formula (a1-r-1) (hereinafter, also referred to as an "acetal type acid-dissociable group") is exemplified.

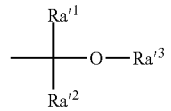
(a1-r-1)

[In the formula, $Ra'^1$ and $Ra'^2$ each independently represents a hydrogen atom or an alkyl group, $Ra'^3$ represents a hydrocarbon group, and $Ra'^3$ may be bonded to any of $Ra'^1$ and $Ra'^2$ to form a ring.]

In Formula (a1-r-1), it is preferable that at least one of $Ra'^1$ and $Ra'^2$ represent a hydrogen atom and more preferable that both of $Ra'^1$ and $Ra'^2$ represent a hydrogen atom.

In a case where $Ra'^1$ or $Ra'^2$ represents an alkyl group, examples of the alkyl group are the same as those for the alkyl group exemplified as the substituent which may be bonded to a carbon atom at the α-position in the description of the α-substituted acrylic acid ester. Among the examples, an alkyl group having 1 to 5 carbon atoms is preferable. Specific preferred examples thereof include a linear or branched alkyl group. More specific examples thereof include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is more preferable and a methyl group is particularly preferable.

In Formula (a1-r-1), examples of the hydrocarbon group as $Ra'^3$ include a linear or branched alkyl group and a cyclic hydrocarbon group.

The number of carbon atoms of the linear alkyl group is preferably in a range of 1 to 5, more preferably in a range of 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable and a methyl group or an ethyl group is more preferable.

The number of carbon atoms of the branched alkyl group is preferably in a range of 3 to 10 and more preferably in a range of 3 to 5. Specific examples thereof include an isopropyl group, an isobutyl group, a tert-butyl group, an isopentyl group, a neopentyl group, a 1,1-diethylpropyl group, and a 2,2-dimethylbutyl group. Among these, an isopropyl group is preferable.

In a case where $Ra'^3$ represents a cyclic hydrocarbon group, the hydrocarbon group may be an aliphatic hydrocarbon group or an aromatic hydrocarbon group and may be a polycyclic group or a monocyclic group.

As the aliphatic hydrocarbon group which is a monocyclic group, a group formed by removing one hydrogen atom from a monocycloalkane is preferable. The number of carbon atoms if the monocycloalkane is preferably in a range of 3 to 6, and specific examples of such a monocycloalkane include cyclopentane and cyclohexane.

As the aliphatic hydrocarbon group which is a polycyclic group, a group formed by removing one hydrogen atom from a polycycloalkane is preferable. The number of carbon atoms of the polycycloalkane is preferably in a range of 7 to 12, and specific examples of such a polycycloalkane include adamantane, norbornane, isobornane, tricyclodecane, and tetracyclododecane.

In a case where the cyclic hydrocarbon group as $Ra'^3$ is an aromatic hydrocarbon group, the aromatic hydrocarbon group is a hydrocarbon group having at least one aromatic ring.

The aromatic ring is not particularly limited as long as the aromatic ring is a cyclic conjugated system having (4n+2) π electrons, and the aromatic ring may be monocyclic or polycyclic. The number of carbon atoms of the aromatic ring is preferably in a range of 5 to 30, more preferably in a range of 5 to 20, still more preferably in a range of 6 to 15, and particularly preferably in a range of 6 to 12. Specific examples of the aromatic ring include an aromatic hydrocarbon ring such as benzene, naphthalene, anthracene, or phenanthrene; and an aromatic heterocycle formed by some carbon atoms constituting the aromatic hydrocarbon ring being substituted with heteroatoms. Examples of the heteroatoms in the aromatic heterocycle include an oxygen atom, a sulfur atom, and a nitrogen atom. Specific examples of the aromatic heterocycle include a pyridine ring and a thiophene ring.

Specific examples of the aromatic hydrocarbon group as $Ra'^3$ include a group (such as an arylene group or a heteroarylene group) formed by removing one hydrogen atom from the aromatic hydrocarbon ring or the aromatic heterocycle; a group formed by removing one hydrogen atom from an aromatic compound (such as phenyl or fluorene) having two or more aromatic rings; and a group (an arylalkyl group such as a benzyl group, a phenethyl group, a 1-naphthylmethyl group, a 2-naphthylmethyl group, a 1-naphthylethyl group, or a 2-naphthylethyl group) formed by one hydrogen atom in the aromatic hydrocarbon ring or the aromatic heterocycle being substituted with an alkylene group. The number of carbon atoms of the alkylene group bonded to the aromatic hydrocarbon ring or the aromatic heterocycle is preferably in a range of 1 to 4, more preferably 1 or 2, and particularly preferably 1.

In a case where $Ra'^3$ is bonded to any of $Ra'^1$ and $Ra'^2$ to form a ring, a 4- to 7-membered ring is preferable and a 4- to 6-membered ring is more preferable as the cyclic group. Specific examples of the cyclic group include a tetrahydropyranyl group and a tetrahydrofuranyl group.

Tertiary Alkyl Ester Type Acid-Dissociable Group:

Examples of the acid-dissociable group that protects a carboxy group among the above-described polar groups include an acid-dissociable group represented by Formula (a1-r-2). Among examples of the acid-dissociable group represented by Formula (a1-r-2), hereinafter, a group formed of an alkyl group is also referred to as a "tertiary alkyl ester type acid-dissociable group" for convenience.

(a1-r-2)

[In the formula, $Ra'^4$ to $Ra'^6$ each independently represents a hydrocarbon group, and $Ra'^5$ and $Ra'^6$ may be bonded to each other to form a ring.]

Examples of the hydrocarbon group as $Ra'^4$ to $Ra'^6$ are the same as those for $Ra'^3$.

It is preferable that $Ra'^4$ represent an alkyl group having 1 to 5 carbon atoms. In a case where $Ra'^5$ and $Ra'^6$ are bonded to each other to form a ring, a group represented by Formula (a1-r2-1) is exemplified. Further, in a case where $Ra'^5$ and $Ra'^6$ are not bonded to each other and independently represent a hydrocarbon group, a group represented by Formula (a1-r2-2) is exemplified.

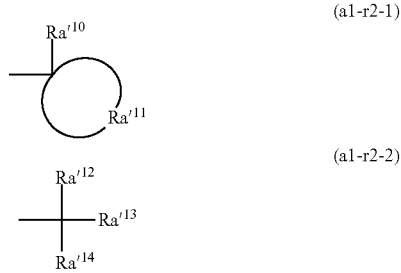

[In the formulae, $Ra'^{10}$ represents an alkyl group having 1 to 10 carbon atoms, $Ra'^{11}$ represents a group that forms an aliphatic cyclic group together with a carbon atom to which $Ra'^{10}$ is bonded, and $Ra'^{12}$ to $Ra'^{14}$ each independently represents a hydrocarbon group.]

In Formula (a1-r2-1), as the alkyl group having 1 to 10 carbon atoms represented by $Ra'^{10}$, a group exemplified as the linear or branched alkyl group represented by $Ra'^{3}$ in Formula (a1-r-1) is preferable. In Formula (a1-r2-1), as the aliphatic cyclic group that is formed by the group represented by $Ra'^{11}$ together with the carbon atom to which $Ra'^{10}$ is bonded, a group exemplified as the aliphatic hydrocarbon group which is a monocyclic group or a polycyclic group represented by $Ra'^{3}$ in Formula (a1-r-1) is preferable.

In Formula (a1-r2-2), it is preferable that $Ra'^{12}$ and $Ra'^{14}$ each independently represents an alkyl group having 1 to 10 carbon atoms. As the alkyl group, a group exemplified as the linear or branched alkyl group represented by $Ra'^{3}$ in Formula (a1-r-1) is more preferable, a linear alkyl group having 1 to 5 carbon atoms is still more preferable, and a methyl group or an ethyl group is particularly preferable.

In Formula (a1-r2-2), it is preferable that $Ra'^{13}$ represent a linear or branched alkyl group exemplified as the hydrocarbon group represented by $Ra'^{3}$ in Formula (a1-r-1), an aliphatic hydrocarbon group which is a monocyclic group or a polycyclic group, or an aromatic hydrocarbon group. Among these, a group exemplified as the aliphatic hydrocarbon group which is a monocyclic group or a polycyclic group represented by $Ra'^{3}$ is more preferable.

Specific examples of the group represented by Formula (a1-r2-1) are described below.

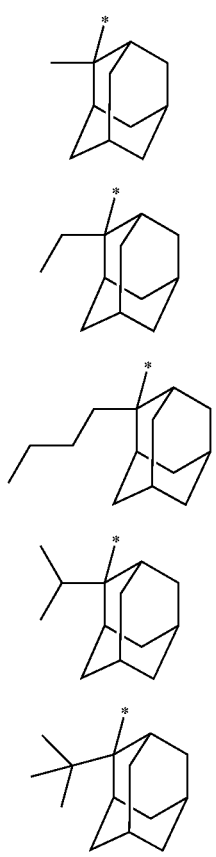

(r-pr-m1)

(r-pr-m2)

(r-pr-m3)

(r-pr-m4)

(r-pr-m5)

(r-pr-m6)

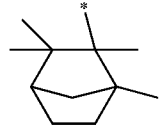

(r-pr-m7)

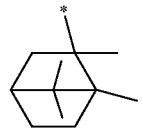

(r-pr-m8)

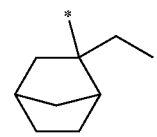

(r-pr-m9)

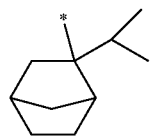

(r-pr-m10)

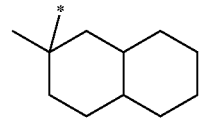

(r-pr-m11)

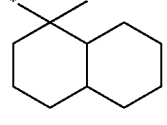

(r-pr-m12)

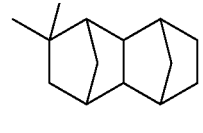

(r-pr-m13)

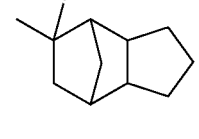

(r-pr-m14)

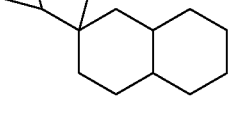

(r-pr-m15)

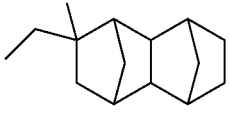

(r-pr-m16)

-continued
(r-pr-m17)
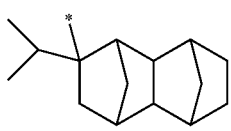
(r-pr-s1)
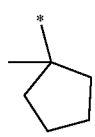
(r-pr-s2)
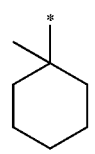
(r-pr-s3)
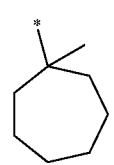
(r-pr-s4)
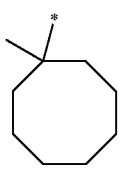
(r-pr-s5)
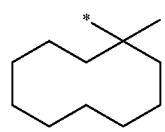
(r-pr-s6)
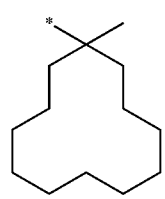
(r-pr-s7)
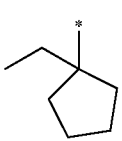
(r-pr-s8)
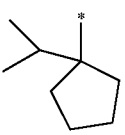
(r-pr-s9)
(r-pr-s10)
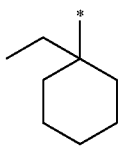
(r-pr-s11)
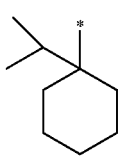
(r-pr-s12)
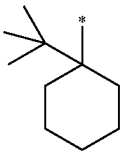
(r-pr-s13)
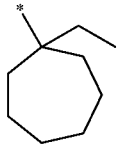
(r-pr-s14)
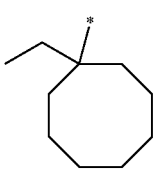
(r-pr-s15)
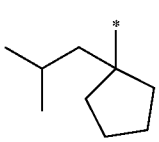
(r-pr-s16)
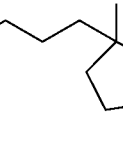
(r-pr-s17)
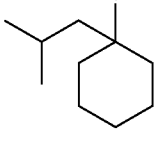
(r-pr-s18)
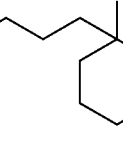
Specific examples of the group represented by Formula (a1-r2-2) are described below.

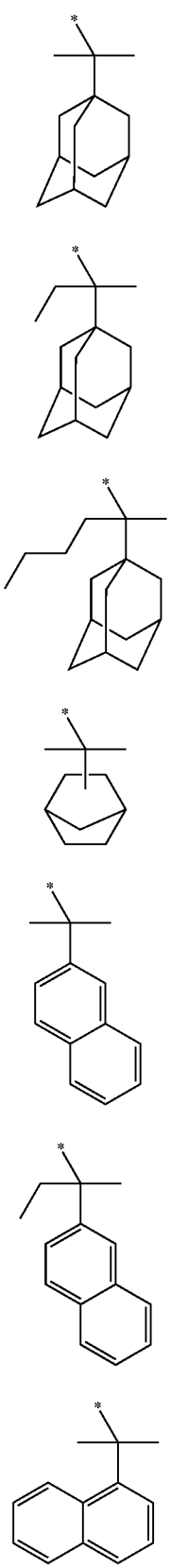
(r-pr-cm1)
(r-pr-cm2)
(r-pr-cm3)
(r-pr-cm4)
(r-pr-cm5)
(r-pr-cm6)
(r-pr-cm7)
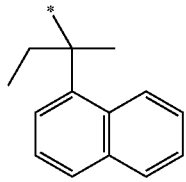
(r-pr-cm8)
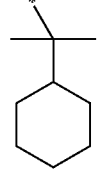
(r-pr-cs1)
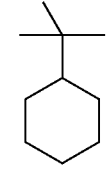
(r-pr-cs2)
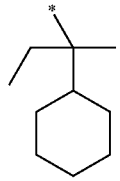
(r-pr-cs3)
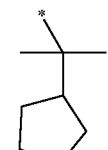
(r-pr-cs4)
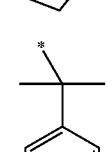
(r-pr-cs5)
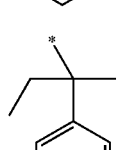
(r-pr-c1)
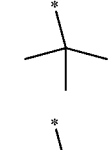
(r-pr-c2)
(r-pr-c3)
Tertiary Alkyloxy Carbonyl Acid-Dissociable Group:
Examples of the acid-dissociable group that protects a hydroxyl group among the above-described polar groups include an acid-dissociable group represented by Formula (a1-r-3) (hereinafter, also referred to as a "tertiary alkyloxy carbonyl acid-dissociable group" for convenience).

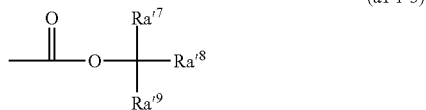

(a1-r-3)

[In the formula, $Ra'^7$ to $Ra'^9$ each independently represents an alkyl group.]

In Formula (a1-r-3), $Ra'^7$ to $Ra'^9$ each independently represents preferably an alkyl group having 1 to 5 carbon atoms and more preferably an alkyl group having 1 to 3 carbon atoms.

Further, the total number of carbon atoms of each alkyl group is preferably in a range of 3 to 7, more preferably in a range of 3 to 5, and most preferably 3 or 4.

Among the examples, an acid-dissociable group that does not contain a cyclic hydrocarbon group is preferable. In other words, it is preferable that an acid-dissociable group be formed of a linear or branched alkyl group. By employing such an acid-dissociable group, the residual film rate is further improved, the pattern collapse is suppressed, and an excellent pattern shape can be obtained in the organic solvent development process.

In the acid-dissociable group that does not contain a cyclic hydrocarbon group, the boiling point of a deprotected substance to be dissociated due to an action of an acid is low so that the deprotected substance is unlikely to remain in the resist film. Therefore, the above-described effects are considered to be obtained because an increase in hydrophobicity of the exposed portion in the resist film is suppressed so that the dissolution of the resist film in an organic developer is suppressed in a case where the acid-dissociable group does not contain a cyclic hydrocarbon group.

For example, in a case where the constitutional unit (a1) contains an acid-dissociable group represented by Formula (a1-r-1), it is preferable that $Ra'^3$ in Formula (a1-r-1) represent a linear or branched alkyl group and not be bonded to $Ra'^1$ or $Ra'^2$ to form a ring.

In a case where the constitutional unit (a1) contains an acid-dissociable group represented by Formula (a1-r-2), it is preferable that $Ra'^4$ to $Ra'^6$ in Formula (a1-r-2) each independently represents a linear or branched alkyl group and $Ra'^5$ and $Ra'^6$ not be bonded to each other to form a ring.

In a case where the constitutional unit (a1) contains an acid-dissociable group represented by Formula (a1-r-3), it is preferable that $Ra'^7$ to $Ra'^9$ in Formula (a1-r-3) each independently represents a linear or branched alkyl group.

Examples of the constitutional unit (a1) include a constitutional unit derived from acrylic acid ester in which a hydrogen atom bonded to a carbon atom at the α-position may be substituted with a substituent; a constitutional unit derived from acrylamide; a constitutional unit in which a hydroxyl group of a constitutional unit derived from hydroxystyrene or a hydroxystyrene derivative is protected by the acid-dissociable group; and a constitutional unit in which —C(=O)—OH of a constitutional unit derived from vinylbenzoic acid or a vinylbenzoic acid derivative is protected by the acid-dissociable group.

Among the above-described examples, as the constitutional unit (a1), a constitutional unit derived from acrylic acid ester in which a hydrogen atom bonded to a carbon atom at the α-position may be substituted with a substituent is preferable.

Specific preferred examples of such a constitutional unit (a1) include a constitutional unit represented by Formula (a1-1) or (a1-2).

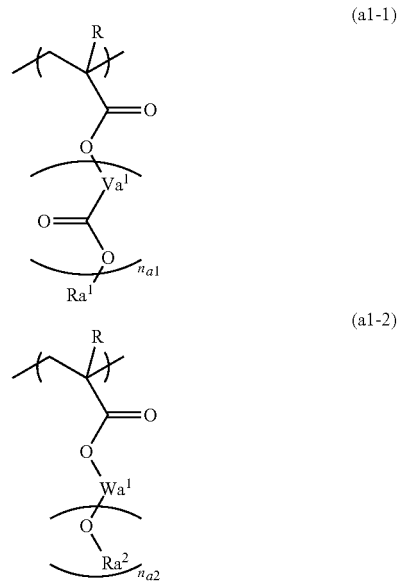

[In the formulae, R's each independently represents a hydrogen atom, an alkyl group having 1 to 5 carbon atoms, or a halogenated alkyl group having 1 to 5 carbon atoms. $Va^1$ represents a divalent hydrocarbon group which may have an ether bond, $n_{a1}$ represents an integer of 0 to 2, and $Ra^1$ represents an acid-dissociable group represented by Formula (a1-r-1) or (a1-r-2). $Wa^1$ represents a $(n_{a2}+1)$-valent hydrocarbon group, $n_{a2}$ represents an integer of 1 to 3, and $Ra^2$ represents an acid-dissociable group represented by Formula (a1-r-1) or (a1-r-3).]

In Formula (a1-1) or (a1-2), preferred examples of R are the same as those described as the examples of R in Formula (a0-1).

In Formula (a1-1), the divalent hydrocarbon group which may have an ether bond as $Va^1$ has the same definition as that for the case where the divalent linking group as $Ya^{o11}$ in Formula (a0-1) is a divalent hydrocarbon group which may have an ether bond as a substituent.

In Formula (a1-2), the $(n_{a2}+1)$-valent hydrocarbon group as $Wa^1$ may be an aliphatic hydrocarbon group or an aromatic hydrocarbon group. The aliphatic hydrocarbon group may be saturated or unsaturated, but it is preferable that the aliphatic hydrocarbon group be usually saturated. Examples of the aliphatic hydrocarbon group include a linear or branched aliphatic hydrocarbon group, an aliphatic hydrocarbon group having a ring in the structure, and a group formed by combining a linear or branched aliphatic hydrocarbon group with an aliphatic hydrocarbon group having a ring in the structure.

The $(n_{a2}+1)$-valent is di- to tetravalent, and divalent or trivalent is preferable.

Specific examples of the constitutional unit represented by Formula (a1-1) are described below.

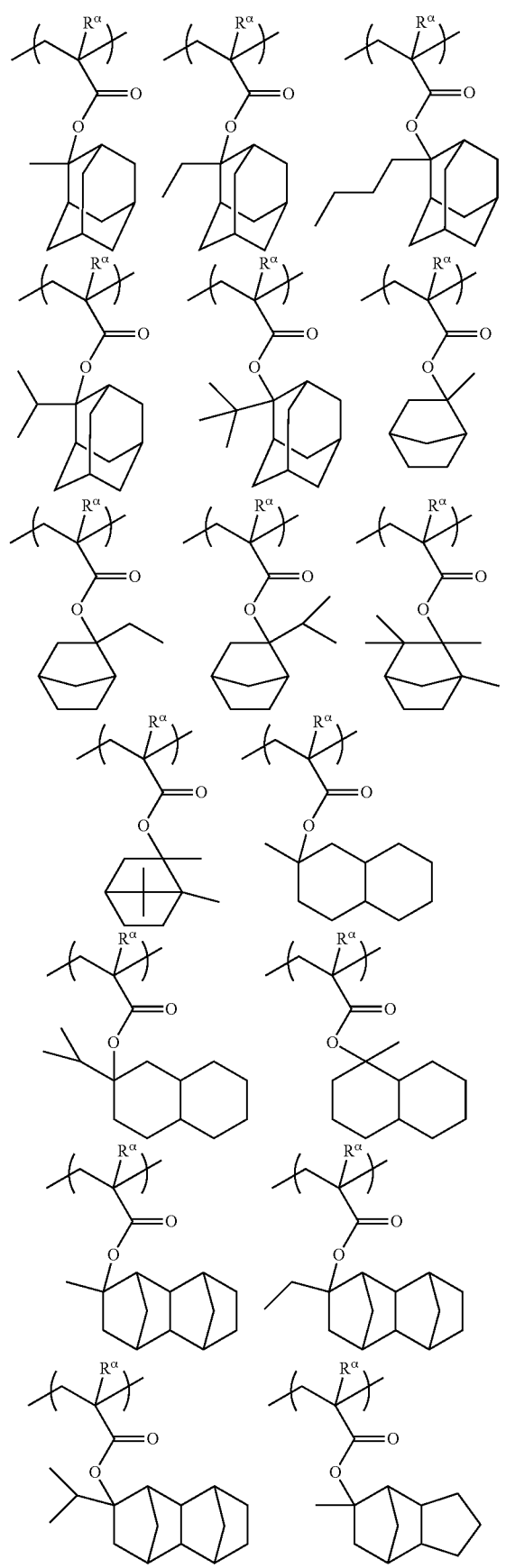
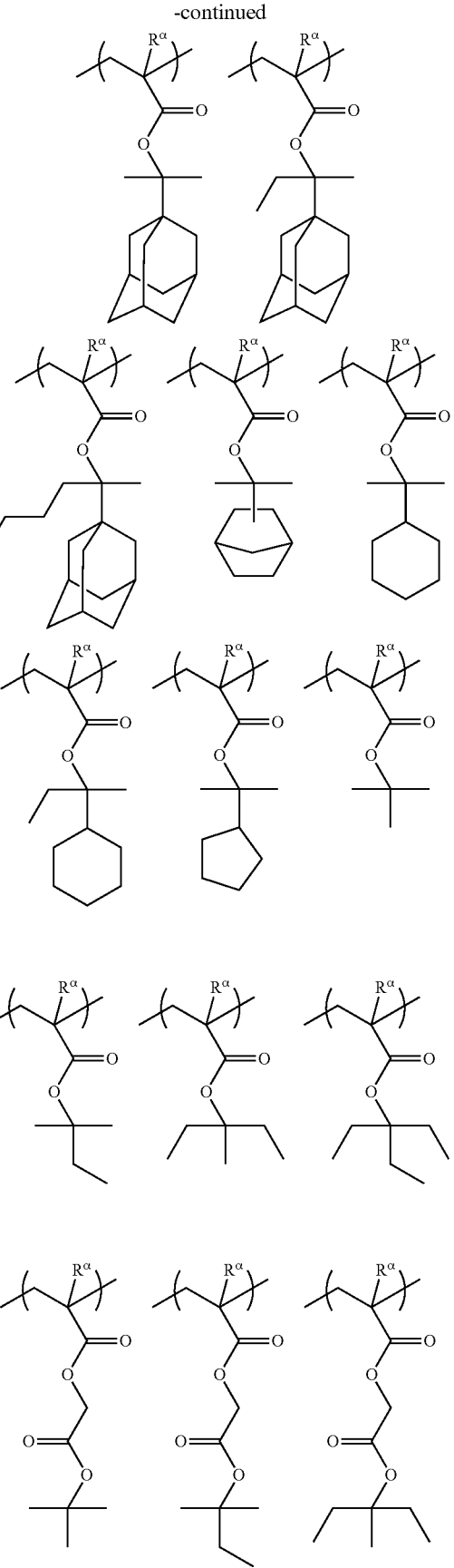
-continued

-continued
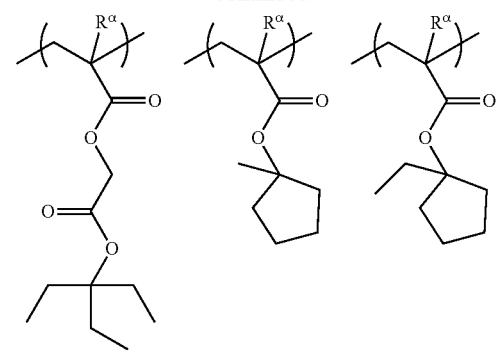
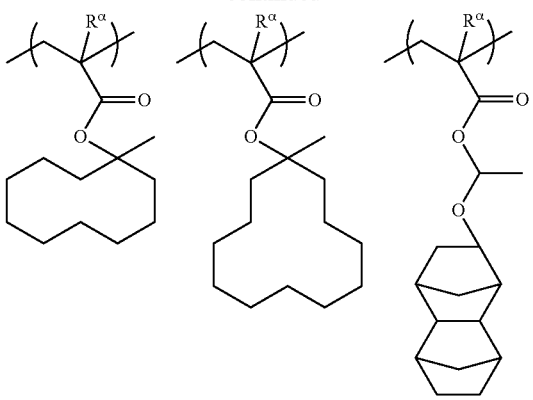
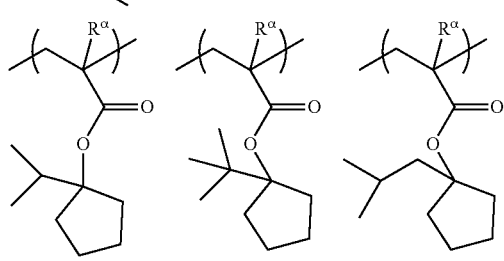
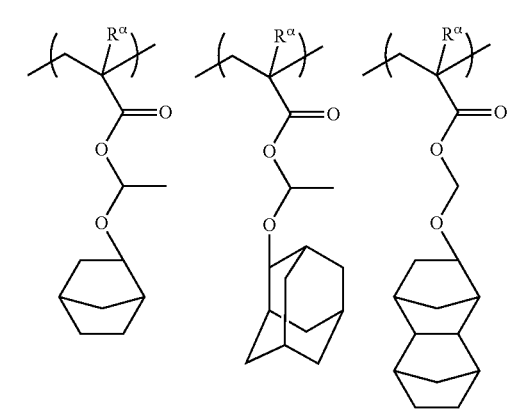
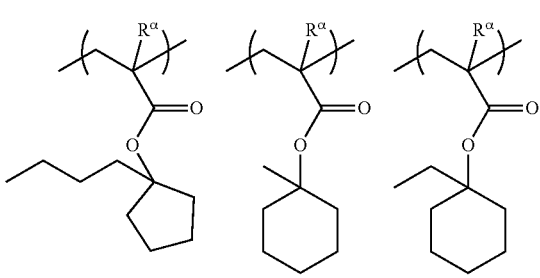
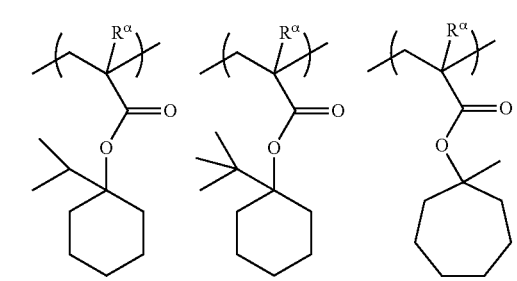
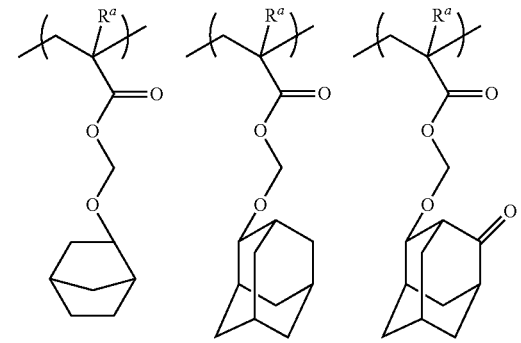
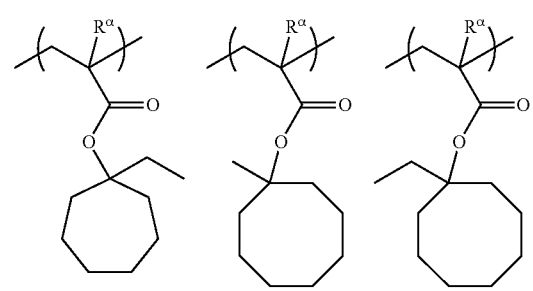
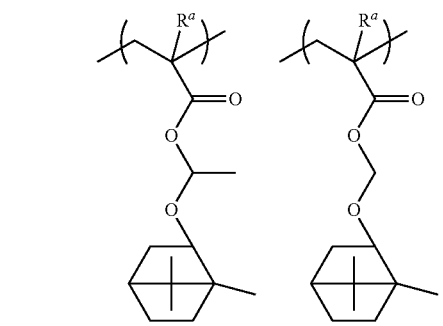

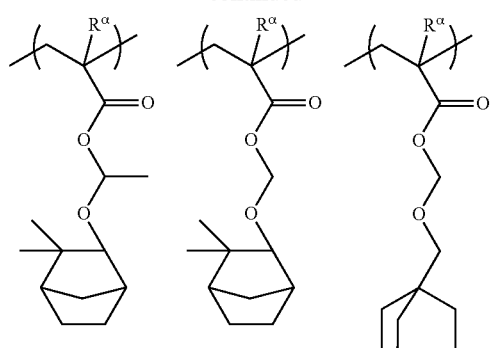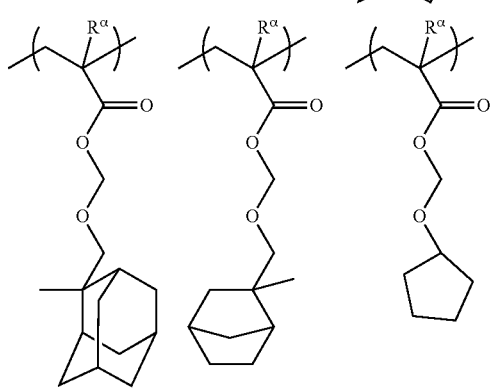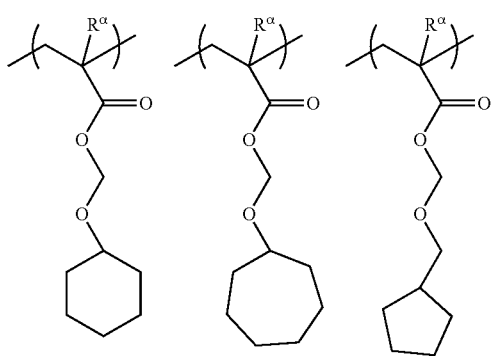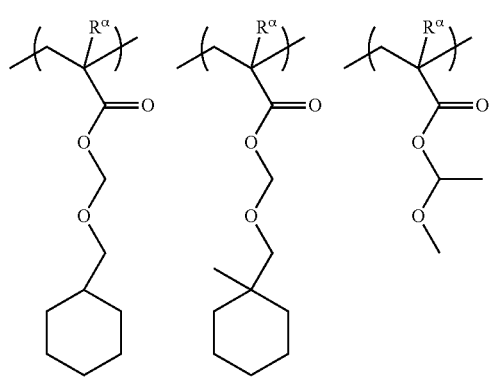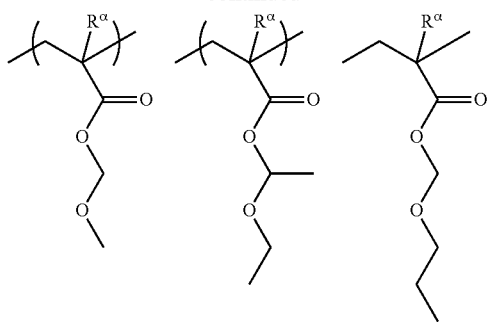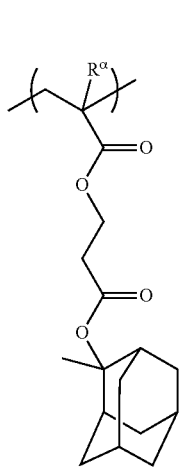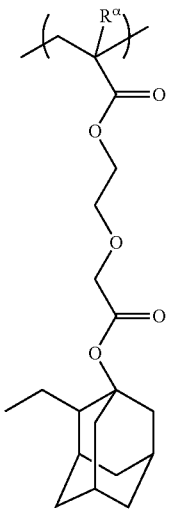

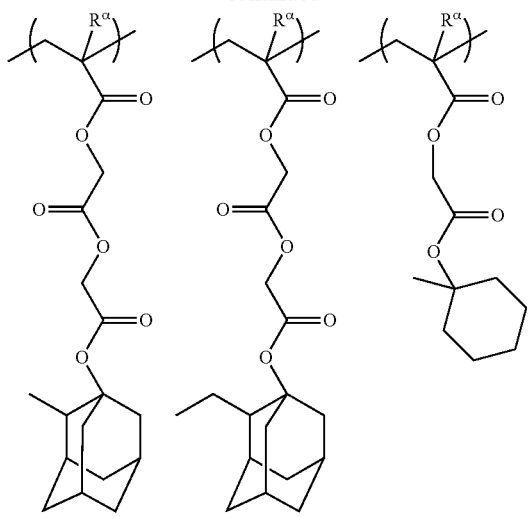
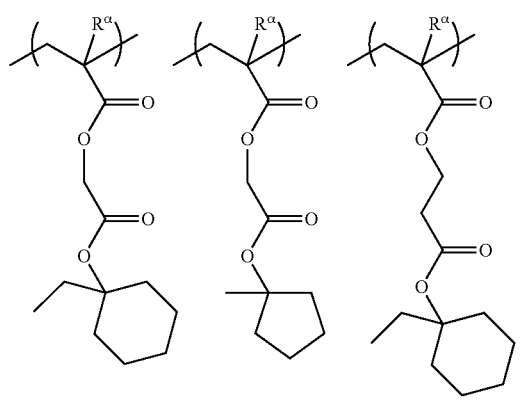
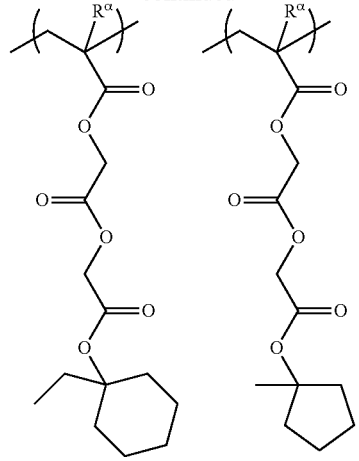
Specific examples of the constitutional unit represented by Formula (a1-2) are described below.
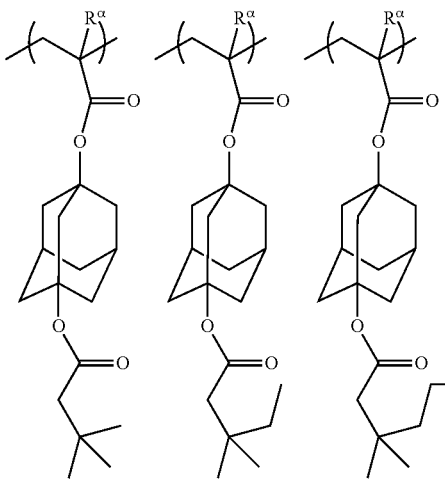
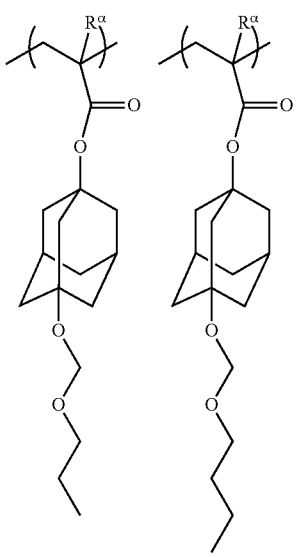

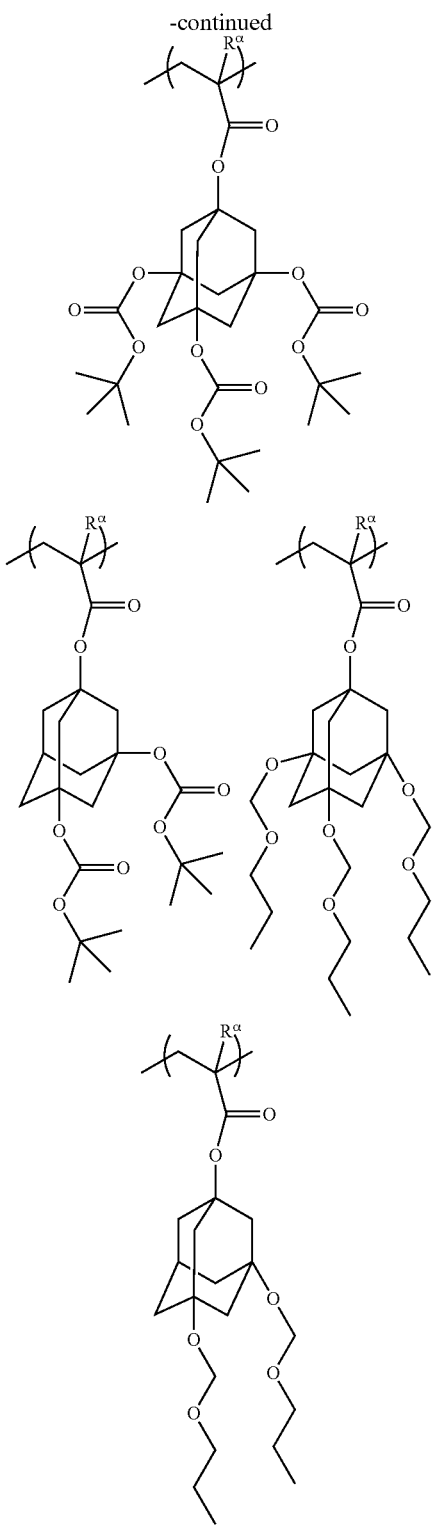

Among the examples, it is preferable that the constitutional unit (a1) contain an acid-dissociable group which does not have a cyclic hydrocarbon group (that is, an acid-dissociable group formed of a linear or branched alkyl group), and a constitutional unit represented by Formula (a1-1-1) is suitably exemplified as the constitutional unit (a1-1-1)

[In the formulae, R represents a hydrogen atom, an alkyl group having 1 to 5 carbon atoms, or a halogenated alkyl group having 1 to 5 carbon atoms. $Va^{11}$ represents a divalent hydrocarbon group which may have an ether bond. $Ra^{11}$ to $Ra^{13}$ each independently represents a linear or branched alkyl group having 1 to 5 carbon atoms which may have a substituent. $n_{a11}$ represents an integer of 0 to 2. In a case where $n_{a11}$ represents 2, a plurality of $Va^{11}$ may be the same as or different from each other.]

In Formula (a1-1-1), preferred examples of R are the same as those described as the examples of R in Formula (a0-1).

In Formula (a1-1-1), the divalent hydrocarbon group which may have an ether bond as $Va^{11}$ has the same definition as that for the case where the divalent linking group as $Ya^{11}$ in Formula (a0-1) is a divalent hydrocarbon group which may have an ether bond as a substituent. As the divalent hydrocarbon group, an aliphatic hydrocarbon group is preferable, and a linear or branched aliphatic hydrocarbon group is more preferable.

Among the examples, as $Va^{11}$, a linear or branched aliphatic hydrocarbon group having 1 to 3 carbon atoms is preferable, a linear or branched alkylene group having 1 to 3 carbon atoms is more preferable, a linear or branched alkylene group having 1 or 2 carbon atoms is still more preferable, and a methylene group or —CH(CH$_3$)— is particularly preferable.

In Formula (a1-1-1), $Ra^{11}$ to $Ra^{13}$ each independently represents a linear or branched alkyl group having 1 to 5 carbon atoms which may have a substituent. $Ra^{11}$ to $Ra^{13}$ represent preferably a linear alkyl group having 1 to 3 carbon atoms and more preferably a methyl group or an ethyl group.

Specific examples of the constitutional unit represented by Formula (a1-1-1) include those (those that contain an acid-dissociable group formed of a linear or branched alkyl group) that do not have a cyclic hydrocarbon group among the above-described specific examples of the constitutional unit represented by Formula (a1-1).

The constitutional unit (a1) included in the (A1) component may be formed of one or two or more kinds thereof. It is preferable that at least one constitutional unit (a1) included in the (A1) component contain an acid-dissociable group that does not have a cyclic hydrocarbon group and more preferable that at least one constitutional unit (a1) included in the (A1) component be a constitutional unit represented by Formula (a1-1-1).

The proportion of the constitutional unit (a1) in the (A1) component is preferably in a range of 1% to 70% by mole, more preferably in a range of 5% to 60% by mole, still more preferably in a range of 10% to 60% by mole, particularly preferably in a range of 30% to 55% by mole, and most preferably in a range of 40% to 55% by mole with respect to the total amount of all constitutional units constituting the (A1) component.

In a case where the proportion of the constitutional unit (a1) is set to be greater than or equal to the lower limit, a resist pattern can be easily obtained, and the sensitivity, the resolution, the roughness, and lithography characteristics such as EL margin are improved. Further, in a case where the proportion thereof is set to be lower than or equal to the upper limit, the balance between the constitutional unit (a1) and another constitutional unit can be achieved.

Constitutional Unit (a2):

The (A1) component may have a constitutional unit (a2) that contains a lactone-containing cyclic group, a —$SO_2$-containing cyclic group, or a carbonate-containing cyclic group (here, those corresponding to any of the constitutional units (a02) and (a03) are removed) in addition to the constitutional unit (a01), the constitutional unit (a02), and the constitutional unit (a03) described above. The lactone-containing cyclic group, the —$SO_2$-containing cyclic group, or the carbonate-containing cyclic group of the constitutional unit (a2) is useful for increasing the adhesiveness of a resist film to a substrate in a case where the (A1) component is used for forming a resist film.

The lactone-containing cyclic group in the constitutional unit (a2) is not particularly limited, and an optional group can be used as the lactone-containing cyclic group. Specific examples thereof are the same as those for $Ra^{021}$ in Formula (a0-2). More specific examples thereof include the groups respectively represented by Formulae (a2-r-1) to (a2-r-7).

The —$SO_2$-containing cyclic group in the constitutional unit (a2) is not particularly limited, and an optional group can be used as the —$SO_2$-containing cyclic group. Specific examples thereof are the same as those for $Ra^{021}$ in Formula (a0-2). More specific examples thereof include the groups respectively represented by Formulae (a5-r-1) to (a5-r-4).

The carbonate-containing cyclic group in the constitutional unit (a2) is not particularly limited, and an optional group can be used as the carbonate-containing cyclic group. Specific examples thereof are the same as those for $Ra^{021}$ in Formula (a0-2). More specific examples thereof include the groups respectively represented by Formulae (ax3-r-1) to (ax3-r-3).

As the constitutional unit (a2), among the examples, a constitutional unit derived from acrylic acid ester in which a hydrogen atom bonded to a carbon atom at the α-position may be substituted with a substituent is preferable.

It is preferable that such a constitutional unit (a2) be a constitutional unit represented by Formula (a2-1).

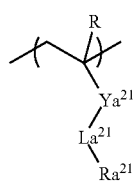

(a2-1)

[In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO—, or —CONHCS—, and R' represents a hydrogen atom or a methyl group. Here, in a case where $La^{21}$ represents —O—, $Ya^{21}$ does not represent —CO—. $Ra^{21}$ represents a lactone-containing cyclic group, a carbonate-containing cyclic group, or a —$SO_2$-containing cyclic group.]

In Formula (a2-1), R has the same definition as described above.

In Formula (a2-1), the divalent linking group as $Ya^{21}$ is not particularly limited, and suitable examples thereof include a divalent hydrocarbon group which may have a substituent and a divalent linking group having heteroatoms.

Examples of the divalent hydrocarbon group as $Ya^{21}$ are the same as those for the group described as the examples of the divalent hydrocarbon group as $Ya^{011}$ in Formula (a0-1). Examples of the substituent which may be included in the divalent hydrocarbon group as $Ya^{21}$ include an alkyl group having 1 to 5 carbon atoms, an alkoxy group, a halogen atom, a halogenated alkyl group having 1 to 5 carbon atoms, a hydroxyl group, and a carbonyl group.

Preferred examples of the divalent linking group having heteroatoms as $Ya^{21}$ include a group represented by —O—, —C(=O)—O—, —C(=O)—, —O—C(=O)—O—, —C(=O)—NH—, —NH—, —NH—C(=NH)— (H may be substituted with a substituent such as an alkyl group or an acyl group), —S—, —S(=O)$_2$—, —S(=O)$_2$—O—, Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$— [in the formula, $Y^{21}$ and $Y^{22}$ each independently represents a divalent hydrocarbon group which may have a substituent, O represents an oxygen atom, and m" represents an integer of 0 to 3].

In a case where the divalent linking group having heteroatoms represents —C(=O)—NH—, —C(=O)—NH—C(=O)—, —NH—, or —NH—C(=NH)—, H in the formula may be substituted with a substituent such as an alkyl group or an acyl group. The number of carbon atoms of the substituent (such as an alkyl group or an acyl group) is preferably in a range of 1 to 10, more preferably in a range of 1 to 8, and particularly preferably in a range of 1 to 5.

In Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$ and $Y^{22}$ each independently represents a divalent hydrocarbon group which may have a substituent. Examples of the divalent hydrocarbon group are the same as those for the divalent linking group (divalent hydrocarbon group which may have a substituent) described above.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. As the alkyl group in the alkylmethylene group, a linear alkyl group having 1 to 5 carbon atoms is preferable, a linear alkyl group having 1 to 3 carbon atoms is more preferable, and a methyl group is most preferable.

In the group represented by Formula —[$Y^{21}$—C(=O)—O]$_{m''}$—$Y^{22}$—, m" represents an integer of 0 to 3, preferably an integer of 0 to 2, more preferably 0 or 1, and particularly preferably 1. In other words, as the group represented by Formula —[$Y^{21}$—C(=O)—O]$_{m''}$—$Y^{22}$—, a group represented by Formula —$Y^{21}$—C(=O)—O—$Y^{22}$— is particularly preferable. Among the examples, a group represented by Formula —($CH_2$)$_{a'}$—C(=O)—O—($CH_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

It is preferable that $Ya^{21}$ represent a single bond, an ester bond [—C(=O)—O—], an ether bond (—O—), a linear or branched alkylene group, or a combination of these.

In Formula (a2-1), $La^{21}$ represents —O—, —COO—, —CON(R')—, —OCO—, —CONHCO—, or —CONHCS—.

R' represents a hydrogen atom or a methyl group.

Here, in a case where $La^{21}$ represents —O—, $Ya^{21}$ does not represent —CO—.

In Formula (a2-1), $Ra^{21}$ represents a lactone-containing cyclic group, a carbonate-containing cyclic group, or a —SO$_2$-containing cyclic group.

Suitable examples of the lactone-containing cyclic group, the —SO$_2$-containing cyclic group, and the carbonate-containing cyclic group as $Ra^{21}$ respectively include groups respectively represented by Formulae (a2-r-1) to (a2-r-7), groups respectively represented by Formulae (a5-r-1) to (a5-r-4), and groups respectively represented by Formulae (ax3-r-1) to (ax3-r-3).

Among the examples, $Ra^{21}$ represents preferably a lactone-containing cyclic group or a —SO$_2$-containing cyclic group and more preferably a group represented by Formula (a2-r-1), (a2-r-2), (a2-r-6), or (a5-r-1). Specifically, a group represented by any of Chemical Formulae (r-1c-1-1) to (r-1c-1-7), (r-1c-2-1) to (r-1c-2-18), (r-1c-6-1), (r-s1-1-1), and (r-s1-1-18) is more preferable.

The constitutional unit (a2) included in the (A1) component may be formed of one or two or more kinds thereof.

In a case where the (A1) component has the constitutional unit (a2), the proportion of the constitutional unit (a2) is preferably in a range of 1% to 70% by mole, more preferably in a range of 3% to 60% by mole, and still more preferably in a range of 5% to 50% by mole with respect to the total amount (100% by mole) of all constitutional units constituting the (A1) component.

In a case where the proportion of the constitutional unit (a2) is greater than or equal to the above-described preferable lower limit, the effects obtained by containing the constitutional unit (a2) are sufficiently obtained. Further, in a case where the proportion of the constitutional unit (a2) is less than or equal to the above-described preferable upper limit, the balance between the constitutional unit and another constitutional unit is likely to be achieved so that various lithography characteristics and the pattern shape become excellent.

Constitutional Unit (a3):

The (A1) component may have a constitutional unit (a3) that contains a polar group-containing aliphatic hydrocarbon group (here, those corresponding to any of the constitutional unit (a01), the constitutional unit (a02), the constitutional unit (a03), the constitutional unit (a1), and the constitutional unit (a2) described above are removed) in addition to the constitutional unit (a01), the constitutional unit (a02), and the constitutional unit (a03) described above.

In a case where the (A1) component has the constitutional unit (a3), the hydrophilicity of the (A) component is increased and the resolution is improved.

Examples of the polar group include a hydroxyl group, a cyano group, a carboxy group, and a hydroxyalkyl group formed by some hydrogen atoms in an alkyl group being substituted with fluorine atoms. Among these, a hydroxyl group is particularly preferable.

Examples of the aliphatic hydrocarbon group include a linear or branched hydrocarbon group having 1 to 10 carbon atoms (preferably an alkylene group) and a cyclic aliphatic hydrocarbon group (a cyclic group). The cyclic group may be a monocyclic group or a polycyclic group and can be appropriately selected from among a plurality of groups, which are suggested in a resin for a resist composition for an ArF excimer laser, and then used. It is preferable that the cyclic group be a polycyclic group and more preferable that the cyclic group have 7 to 30 carbon atoms.

Among the examples, a constitutional unit derived from acrylic acid ester that contains an aliphatic polycyclic group containing a hydroxyl group, a cyano group, a carboxy group, or a hydroxyalkyl group formed by some hydrogen atoms in an alkyl group being substituted with fluorine atoms is more preferable. Examples of the polycyclic group include a group formed by removing two or more hydrogen atoms from a bicycloalkane, a tricycloalkane, or a tetracycloalkane. Specific examples thereof include a group formed by removing two or more hydrogen atoms from a polycycloalkane such as adamantane, norbornane, isobornane, tricyclodecane, and tetracyclododecane. Among these polycyclic groups, a group formed by removing two or more hydrogen atoms from adamantane, a group formed by removing two or more hydrogen atoms from norbornane, and a group formed by removing two or more hydrogen atoms from tetracyclododecane are industrially preferable.

The constitutional unit (a3) is not particularly limited as long as the constitutional unit contains a polar group-containing aliphatic hydrocarbon group, and an optional constitutional unit can be used.

As the constitutional unit (a3), a constitutional unit which is derived from acrylic acid ester in which a hydrogen atom bonded to a carbon atom at the α-position may be substituted with a substituent and contains a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, a constitutional unit derived from hydroxyethyl ester of acrylic acid is preferable as the constitutional unit (a3). In a case where the hydrocarbon group is a polycyclic group, a constitutional unit represented by Formula (a3-1), a constitutional unit represented by Formula (a3-2), or a constitutional unit represented by Formula (a3-3) is preferably exemplified as the constitutional unit (a3).

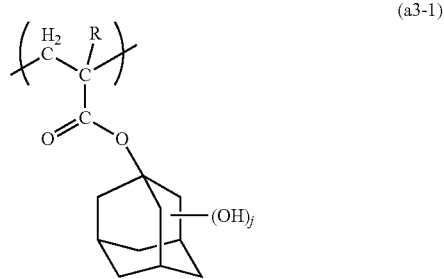

(a3-1)

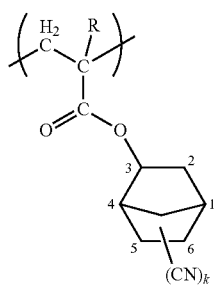

(a3-2)

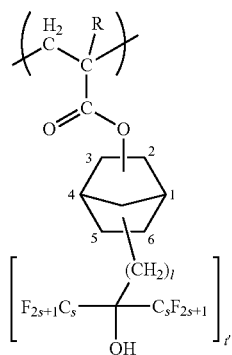

(a3-3)

[In the formula, R has the same definition as described above, j represents an integer of 1 to 3, k represents an integer of 1 to 3, t' represents an integer of 1 to 3, l represents an integer of 1 to 5, and s represents an integer of 1 to 3.]

In Formula (a3-1), j represents preferably 1 or 2 and more preferably 1. In a case where j represents 2, it is preferable that a hydroxyl group be bonded to the 3-position and the 5-position of an adamantyl group. In a case where j represents 1, it is preferable that a hydroxyl group be bonded to the 3-position of an adamantyl group.

It is preferable that j represent 1 and particularly preferable that a hydroxyl group be bonded to the 3-position of an adamantyl group.

In Formula (a3-2), it is preferable that k represent 1. It is preferable that a cyano group be bonded to the 5-position or the 6-position of a norbornyl group.

In Formula (a3-3), it is preferable that t' represent 1. It is preferable that l represent 1. It is preferable that s represent 1. In these cases, it is preferable that a 2-norbornyl group or a 3-norbornyl group be bonded to the terminal of a carboxy group of acrylic acid. It is preferable that fluorinated alkyl alcohol be bonded to the 5-position or the 6-position of a norbornyl group.

The constitutional unit (a3) included in the (A1) component may be formed of one or two or more kinds thereof.

In a case where the (A1) component has the constitutional unit (a3), the proportion of the constitutional unit (a3) is preferably in a range of 1% to 50% by mole, more preferably in a range of 1% to 40% by mole, still more preferably in a range of 3% to 30% by mole, and particularly preferably in a range of 10% to 20% by mole with respect to the total amount of all constitutional units constituting the (A1) component.

In a case where the proportion of the constitutional unit (a3) is set to be greater than or equal to the above-described preferable lower limit, the effects obtained by containing the constitutional unit (a3) are sufficiently obtained. Further, in a case where the proportion of the constitutional unit (a3) is set to be less than or equal to the above-described preferable upper limit, the balance between the constitutional unit and another constitutional unit is likely to be achieved.

Constitutional Unit (a4):

The constitutional unit (a4) is a constitutional unit that contains an acid non-dissociable aliphatic cyclic group.

The (A1) component may have the constitutional unit (a4) that contains an acid non-dissociable aliphatic cyclic group in addition to the constitutional unit (a0), the constitutional unit (a02), and the constitutional unit (a03).

In a case where the (A1) component has the constitutional unit (a4), dry etching resistance of a resist pattern to be formed is improved. Further, the hydrophobicity of the (A) component is increased. The improvement of the hydrophobicity contributes to improvement of the resolution, the resist pattern shape, or the like particularly in the case of the solvent development process.

The "acid non-dissociable cyclic group" in the constitutional unit (a4) is a cyclic group that remains in the constitutional unit without being dissociated even when an acid acts in a case where an acid is generated in the resist composition when exposed (for example, in a case where an acid is generated from the (B) component or the constitutional unit that generates an acid when exposed).

As the constitutional unit (a4), for example, a constitutional unit derived from acrylic acid ester that contains an acid non-dissociable aliphatic cyclic group is preferable. As the cyclic group, a plurality of groups of the related art which are known as groups that are used for resin components of a resist composition for an ArF excimer laser or a KrF excimer laser (preferably for an ArF excimer laser) can be used.

At least one selected from a tricyclodecyl group, an adamantyl group, a tetracyclododecyl group, an isobornyl group, and a norbornyl group is particularly preferable from the viewpoint of ease of industrial availability. These polycyclic groups may respectively contain a linear or branched alkyl group having 1 to 5 carbon atoms as a substituent.

Specific examples of the constitutional unit (a4) include constitutional units respectively represented by Formulae (a4-1) to (a4-7).

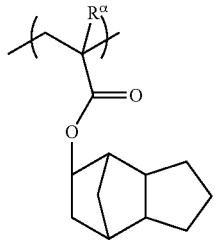

(a4-1)

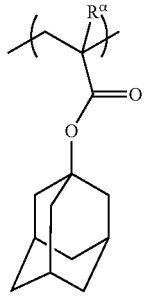

(a4-2)

-continued

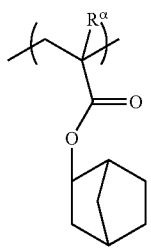
(a4-3)

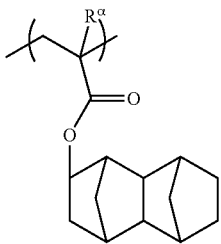
(a4-4)

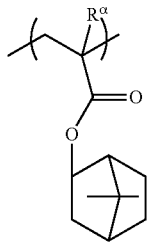
(a4-5)

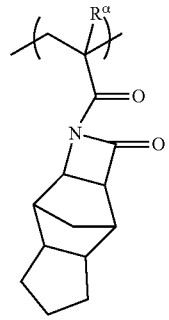
(a4-6)

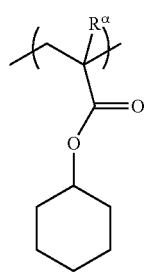
(a4-7)

[In the formulae, $R^\alpha$ has the same definition as described above.]

The constitutional unit (a4) included in the (A1) component may be formed of one or two or more kinds thereof.

In a case where the (A1) component has the constitutional unit (a4), the proportion of the constitutional unit (a4) is preferably in a range of 1% to 30% by mole and more preferably in a range of 3% to 20% by mole with respect to the total amount of all constitutional units constituting the (A1) component.

In a case where the proportion of the constitutional unit (a4) is set to be greater than or equal to the above-described preferable lower limit, the effects obtained by containing the constitutional unit (a4) are sufficiently obtained. Further, in a case where the proportion of the constitutional unit (a4) is set to be less than or equal to the above-described preferable upper limit, the balance between the constitutional unit and another constitutional unit is likely to be achieved.

In the resist composition of the present embodiment, the (A) component contains the polymer compound (A1) that has the constitutional unit (a01), the constitutional unit (a02), and the constitutional unit (a03).

As the (A1) component, a polymer compound that further has the constitutional unit (a1) in addition to the constitutional unit (a01), the constitutional unit (a02), and the constitutional unit (a03) is preferable.

The mass-average molecular weight (Mw) (in terms of polystyrene according to gel permeation chromatography (GPC)) of the (A1) component is not particularly limited, but is preferably in a range of 1000 to 50000, more preferably in a range of 1500 to 30000, and particularly preferably in a range of 2000 to 20000.

In a case where the Mw of the (A1) component is less than or equal to the upper limit of the above-described preferable range, the solubility of the resist composition in a resist solvent is sufficient enough to be used as a resist. Further, in a case where the Mw thereof is greater than or equal to the lower limit of the above-described preferable range, the dry etching resistance or the cross-sectional shape of the resist pattern becomes excellent.

The dispersity (Mw/Mn) of the (A1) component is not particularly limited, but is preferably in a range of 1.0 to 5.0, more preferably in a range of 1.0 to 4.0, and still more preferably in a range of 1.0 to 3.0. In addition, Mn indicates the number average molecular weight.

The (A1) component may be used alone or in combination of two or more kinds thereof.

The proportion of the (A1) component in the (A) component is preferably 25% by mass or greater, more preferably 50% by mass or greater, still more preferably 75% by mass or greater, and may be 100% by mass with respect to the total mass of the (A) component.

In a case where the proportion of the (A1) component is greater than or equal to the lower limit of the above-described preferable range, a resist pattern having various excellent lithography characteristics such as high sensitivity and improved roughness is likely to be formed.

Regarding (A2) Component

In the resist composition of the present embodiment, a base material component (hereinafter, referred to as a (A2) component) which does not correspond to the (A1) component and whose solubility in a developer is changed due to an action of an acid may be used in combination as the (A) component.

The (A2) component is not particularly limited and can be optionally selected from among a plurality of components of the related art which are known as base material components for a chemically amplified resist composition (for example, a base resin for an ArF excimer laser or a KrF excimer laser (preferably for an ArF excimer laser)) and then used.

The (A2) component may be used alone or in combination of two or more kinds thereof.

In the resist composition of the present embodiment, the (A) component may be used alone or in combination of two or more kinds thereof.

The content of the (A) component in the resist composition of the present embodiment may be adjusted according to the film thickness or the like of a resist to be formed.

Other Components

The resist composition of the present embodiment may further contain components other than the (A) component, in addition to the (A) component. Examples of other components include a (B) component, a (D) component, an (E) component, an (F) component, and an (S) component described below.

(B) Component: Acid Generator Component

The resist composition of the present embodiment may further contain an acid generator component (hereinafter, referred to as a (B) component) in addition to the (A) component.

The (B) component is not particularly limited, and those which have been suggested as an acid generator for a chemically amplified resist can be used.

Examples of such an acid generator include various acid generators, for example, onium salt-based acid generators such as an onium salt and a sulfonium salt, oxime sulfonate-based acid generators; diazomethane-based acid generators such as bisalkyl and bisaryl sulfonium diazomethanes and poly(bissulfonyl)diazomethanes; nitrobenzyl sulfonate-based acid generators, iminosulfonate-based acid generators, and disulfone-based acid generators. Among these, onium salt-based acid generators are preferably used.

Examples of the onium salt-based acid generators include a compound represented by Formula (b-1) (hereinafter, also referred to as a "(b-1) component"), a compound represented by Formula (b-2) (hereinafter, also referred to as a "(b-2) component"), and a compound represented by Formula (b-3) (hereinafter, also referred to as a "(b-3) component").

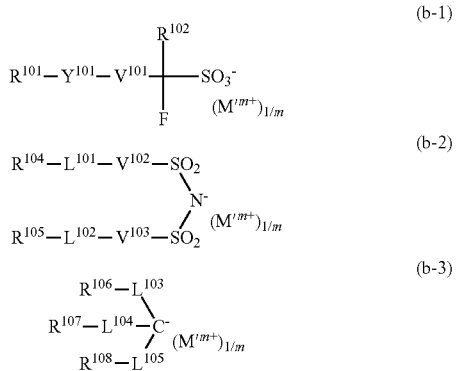

[In the formulae, $R^{101}$ and $R^{104}$ to $R^{108}$ each independently represents a cyclic group which may have a substituent, a chain alkyl group which may have a substituent, or a chain alkenyl group which may have a substituent. $R^{104}$ and $R^{105}$ may be bonded to each other to form a ring. $R^{102}$ represents a fluorine atom or a fluorinated alkyl group having 1 to 5 carbon atoms. $Y^{101}$ represents a single bond or a divalent linking group having oxygen atoms. $V^{101}$ to $V^{103}$ each independently represents a single bond, an alkylene group, or a fluorinated alkylene group. $L^{101}$ and $L^{102}$ each independently represents a single bond or an oxygen atom. $L^{103}$ to $L^{105}$ each independently represents a single bond, —CO—, or —SO$_2$—. m represents an integer of 1 or greater, and $M^{m+}$ represents an m-valent onium cation.]

Anionic Moiety

Anionic Moiety of (b-1) Component

In Formula (b-1), $R^{101}$ represents a cyclic group which may have a substituent, a chain alkyl group which may have a substituent, or a chain alkenyl group which may have a substituent.

Cyclic Group Which may have Substituent:

It is preferable that the cyclic group be a cyclic hydrocarbon group, and the cyclic hydrocarbon group may be an aromatic hydrocarbon group or an aliphatic hydrocarbon group. The aliphatic hydrocarbon group indicates a hydrocarbon group that does not have aromaticity. Further, the aliphatic hydrocarbon group may be saturated or unsaturated, but it is preferable that the aliphatic hydrocarbon group be usually saturated.

The aromatic hydrocarbon group as $R^{101}$ is a hydrocarbon group having an aromatic ring. The number of carbon atoms of the aromatic hydrocarbon group is preferably in a range of 3 to 30, more preferably in a range of 5 to 30, still more preferably in a range of 5 to 20, particularly preferably in a range of 6 to 15, and most preferably in a range of 6 to 10. Here, the number of carbon atoms does not include the number of carbon atoms in a substituent.

Specific examples of the aromatic ring included in the aromatic hydrocarbon group as $R^{101}$ include benzene, fluorene, naphthalene, anthracene, phenanthrene, biphenyl, and aromatic heterocycle formed by some carbon atoms constituting these aromatic rings being substituted with heteroatoms. Examples of the heteroatoms in the aromatic heterocycle include an oxygen atom, a sulfur atom, and a nitrogen atom.

Specific examples of the aromatic hydrocarbon group as $R^{101}$ include a group (an aryl group such as a phenyl group or a naphthyl group) formed by removing one hydrogen atom from the aromatic ring; and a group (for example, an arylalkyl group such as a benzyl group, a phenethyl group, a 1-naphthylmethyl group, a 2-naphthylmethyl group, a 1-naphthylethyl group, or a 2-naphthylethyl group) formed by one hydrogen atom in the aromatic ring being substituted with an alkylene group. The number of carbon atoms of the alkylene group (the alkyl chain in the arylalkyl group) is preferably in a range of 1 to 4, more preferably 1 or 2, and particularly preferably 1.

Examples of the cyclic aliphatic hydrocarbon group as $R^{101}$ include an aliphatic hydrocarbon group having a ring in the structure.

Examples of the aliphatic hydrocarbon group having a ring in the structure include an alicyclic hydrocarbon group (group formed by removing one hydrogen atom from an aliphatic hydrocarbon ring); a group formed by the alicyclic hydrocarbon group being bonded to the terminal of a linear or branched aliphatic hydrocarbon group; and a group formed by the alicyclic hydrocarbon group being interposed in the middle of a linear or branched aliphatic hydrocarbon group.

The number of carbon atoms of the alicyclic hydrocarbon group is preferably in a range of 3 to 20 and more preferably in a range of 3 to 12.

The alicyclic hydrocarbon group may be a polycyclic group or a monocyclic group. As the monocyclic alicyclic hydrocarbon group, a group formed by removing one or more hydrogen atoms from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group formed by removing one or more hydrogen atoms from a polycycloalkane is preferable. The number of carbon atoms of the polycycloalkane is preferably in a range of 7 to 30. Among the examples, as the polycycloalkane, a polycycloalkane having a cross-linked ring-based polycyclic skeleton such as adamantane, norbornane, isobornane, tricyclodecane, or tetracyclododecane; and a polycycloalkane having a fused ring-based polycyclic skeleton such as a cyclic group having a steroid skeleton are more preferable.

Among these, as the cyclic aliphatic hydrocarbon group as $R^{101}$, a group formed by removing one or more hydrogen atoms from a monocycloalkane or a polycycloalkane is preferable; a group formed by removing one hydrogen atom from a polycycloalkane is more preferable; an adamantyl group or a norbornyl group is particularly preferable; and an adamantyl group is most preferable.

The number of carbon atoms of the linear or branched aliphatic hydrocarbon group which may be bonded to an alicyclic hydrocarbon group is preferably in a range of 1 to 10, more preferably in a range of 1 to 6, still more preferably in a range of 1 to 4, and most preferably in a range of 1 to 3.

As the linear aliphatic hydrocarbon group, a linear alkylene group is preferable, and specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

As the branched aliphatic hydrocarbon group, a branched alkylene group is preferable, and specific examples thereof include an alkylalkylene group, for example, an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, or —C(CH$_2$CH$_3$)$_2$—; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, or —C(CH$_2$CH$_3$)$_2$—CH$_2$—; an alkyltrimethylene group such as —CH(CH$_3$)CH$_2$CH$_2$— or —CH$_2$CH(CH$_3$)CH$_2$—; and an alkyltetramethylene group such as —CH(CH$_3$)CH$_2$CH$_2$CH$_2$— or —CH$_2$CH(CH$_3$)CH$_2$CH$_2$—. As the alkyl group in the alkylalkylene group, a linear alkyl group having 1 to 5 carbon atoms is preferable.

Further, the cyclic hydrocarbon group as $R^{101}$ may have heteroatoms as in a case of a heterocycle. Specific examples thereof include lactone-containing cyclic groups respectively represented by Formulae (a2-r-1) to (a2-r-7); —SO$_2$- containing cyclic groups respectively represented by Formulae (a5-r-1) to (a5-r-4); and heterocyclic groups respectively represented by chemical Formulae (r-hr-1) to (r-hr-16).

(r-hr-1)

(r-hr-2)

(r-hr-3)

(r-hr-4)

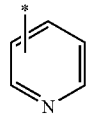

(r-hr-5)

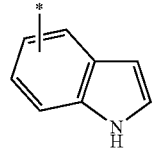

(r-hr-6)

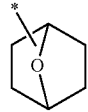

(r-hr-7)

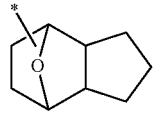

(r-hr-8)

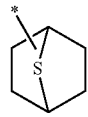

(r-hr-9)

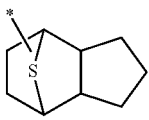

(r-hr-10)

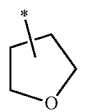

(r-hr-11)

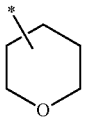

(r-hr-12)

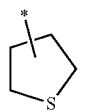

(r-hr-13)

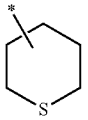

(r-hr-14)

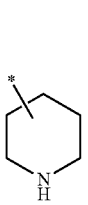

(r-hr-15)

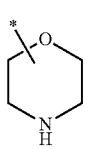
(r-hr-16)

Examples of the substituent in the cyclic group as $R^{101}$ include an alkyl group, an alkoxy group, a halogen atom, a halogenated alkyl group, a hydroxyl group, a carbonyl group and a nitro group.

As the alkyl group as a substituent, an alkyl group having 1 to 5 carbon atoms is preferable; and a methyl group, an ethyl group, a propyl group, an n-butyl group, and a tert-butyl group are most preferable.

As the alkoxy group as a substituent, an alkoxy group having 1 to 5 carbon atoms is preferable; a methoxy group, an ethoxy group, an n-propoxy group, an iso-propoxy group, an n-butoxy group, and a tert-butoxy group are more preferable; and a methoxy group and an ethoxy group are most preferable.

Examples of the halogen atom as a substituent include a fluorine atom, a chlorine atom, a bromine atom, and an iodine atom. Among these, a fluorine atom is preferable.

As the halogenated alkyl group as a substituent, a group formed by some or all hydrogen atoms in the alkyl group having 1 to 5 carbon atoms, such as a methyl group, an ethyl group, a propyl group, an n-butyl group, or a tert-butyl group, being substituted with the halogen atoms is exemplified.

The carbonyl group as a substituent is a group that substitutes for a methylene group (—$CH_2$—) constituting a cyclic hydrocarbon group.

Chain alkyl group which may have substituent:

The chain alkyl group as $R^{101}$ may be linear or branched.

The number of carbon atoms of the linear alkyl group is preferably in a range of 1 to 20, more preferably in a range of 1 to 15, and most preferably in a range of 1 to 10. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a heneicosyl group, and docosyl group.

The number of carbon atoms of the branched alkyl group is preferably in a range of 3 to 20, more preferably in a range of 3 to 15, and most preferably in a range of 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain Alkenyl Group which may have Substituent:

The chain alkenyl group as $R^{101}$ may be linear or branched, and the number of carbon atoms is preferably in a range of 2 to 10, more preferably in a range of 2 to 5, still more preferably in a range of 2 to 4, and particularly preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Among these, as the chain alkenyl group, a linear alkenyl group is preferable, a vinyl group or a propenyl group is more preferable, and a vinyl group is particularly preferable.

Examples of the substituent in the chain alkyl group or the chain alkenyl group as $R^{101}$ include an alkoxy group, a halogen atom, a halogenated alkyl group, a hydroxyl group, a carbonyl group, a nitro group, an amino group, and the cyclic groups as $R^{101}$.

Among these, $R^{101}$ represents preferably a cyclic group which may have a substituent or a chain alkyl group which may have a substituent, more preferably a cyclic group which may have a substituent, and still more preferably a cyclic hydrocarbon group which may have a substituent.

Specific preferred examples thereof include a phenyl group, a naphthyl group, a group formed by removing one or more hydrogen atoms from a polycycloalkane; a lactone-containing cyclic group respectively represented by Formulae (a2-r-1) to (a2-r-7); and a —$SO_2$-containing cyclic group respectively represented by Formulae (a5-r-1) to (a5-r-4).

In Formula (b-1), $Y^{101}$ represents a single bond or a divalent linking group having oxygen atoms.

In a case where $Y^{101}$ represents a divalent linking group having oxygen atoms, $Y^{101}$ may have atoms other than the oxygen atoms. Examples of the atoms other than the oxygen atoms include a carbon atom, a hydrogen atom, a sulfur atom, and a nitrogen atom.

Examples of the divalent linking group having oxygen atoms include a non-hydrocarbon-based oxygen atom-containing linking group such as an oxygen atom (ether bond: —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and a combination of the non-hydrocarbon-based oxygen atom-containing linking group with an alkylene group. A sulfonyl group (—$SO_2$—) may be further bonded to this combination. Examples of such a divalent linking group having oxygen atoms include linking groups respectively represented by Formulae (y-a1-1) to (y-a1-7).

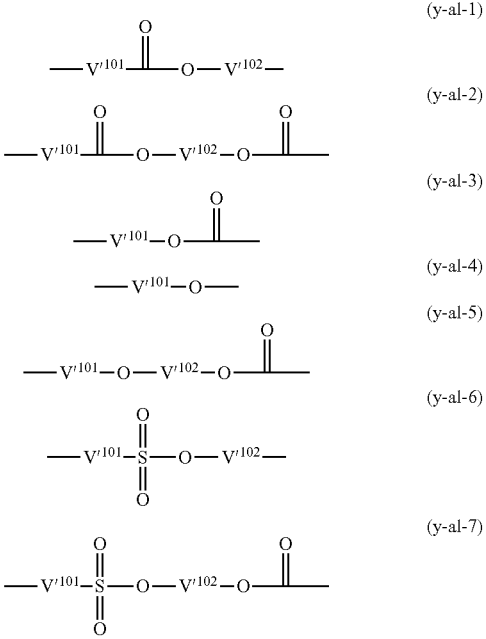

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ represents preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear or branched alkylene group, and a linear alkylene group is preferable.

Specific examples of the alkylene group as $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group)[—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$— or —$CH_2CH(CH_3)CH_2CH_2$—; and a pentamethylene group [—$CH_2CH_2CH_2CH_2CH_2$—].

In addition, some methylene groups in the alkylene group as $V'^{101}$ or $V'^{102}$ may be substituted with a divalent aliphatic cyclic group having 5 to 10 carbon atoms. As the aliphatic cyclic group, a divalent group formed by removing one hydrogen atom from a cyclic aliphatic hydrocarbon group (a monocyclic alicyclic hydrocarbon group or a polycyclic alicyclic hydrocarbon group) as $Ra'^3$ in Formula (a1-r-1) is preferable; and a cyclohexylene group, a 1,5-adamantylene group, or a 2,6-adamantylene group is more preferable.

$Y^{101}$ represents preferably a divalent linking group having an ester bond or a divalent linking group having an ether bond, more preferably linking groups respectively represented by Formulae (y-a1-1) to (y-a1-5); and still more preferably linking groups respectively represented by Formulae (y-a1-1) to (y-a1-3).

In Formula (b-1), $V^{102}$ represents a single bond, an alkylene group, or a fluorinated alkylene group. The number of carbon atoms of the alkylene group or the fluorinated alkylene group as $V^{101}$ is preferably in a range of 1 to 4. Examples of the fluorinated alkylene group as $V^{101}$ include a group formed by some or all hydrogen atoms in the alkylene group as $V^{101}$ being substituted with fluorine atoms. Among the examples, it is preferable that $V^{101}$ represent a single bond or a fluorinated alkylene group having 1 to 4 carbon atoms.

In Formula (b-1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

Specific examples of the anionic moiety of the (b-1) component include a fluorinated alkylsulfonate anion such as a trifluoromethanesulfonate anion or a perfluorobutanesulfonate anion in a case where $V^{101}$ represents a single bond. Specific examples thereof include an anion represented by any of Formulae (an-1) to (an-3) in a case where $Y^{101}$ represents a divalent linking group having oxygen atoms.

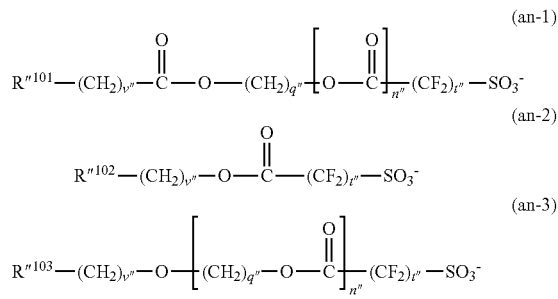

[In the formulae, $R''^{101}$ represents an aliphatic cyclic group which may have a substituent, a group represented by any of Formulae (r-hr-1) to (r-hr-6), or a chain alkyl group which may have a substituent; $R''^{102}$ represents an aliphatic cyclic group which may have a substituent, a lactone-containing cyclic group represented by any of Formulae (a2-r-1) to (a2-r-7), or a —$SO_2$-containing cyclic group represented by any of Formulae (a5-r-1) to (a5-r-4); $R''^{103}$ represents an aromatic cyclic group which may have a substituent, an aliphatic cyclic group which may have a substituent, or a chain alkenyl group which may have a substituent; (v")'s each independently represents an integer of 0 to 3, (q")'s each independently represents an integer of 1 to 20, (t")'s each independently represents an integer of 1 to 3, and (n")'s each independently represents 0 or 1.]

It is preferable that the aliphatic cyclic group which may have the substituent of $R''^{101}$, $R''^{102}$, or $R''^{103}$ be a group exemplified as the cyclic aliphatic hydrocarbon group as $R^{101}$. Examples of the substituent are the same as those for the substituent that may substitute for the cyclic aliphatic hydrocarbon group as $R^{101}$.

It is preferable that the aromatic cyclic group which may have a substituent as $R''^{103}$ be a group exemplified as the aromatic hydrocarbon group in the cyclic hydrocarbon group as $R^{101}$. Examples of the substituent are the same as those for the substituent that may substitute for the aromatic hydrocarbon group as $R^{101}$.

It is preferable that the chain alkyl group which may have a substituent as $R''^{101}$ be a group exemplified as chain alkyl group as $R^{101}$. It is preferable that the chain alkenyl group which may have a substituent as $R''^{103}$ be a group exemplified as the chain alkenyl group as $R^{101}$.

Anionic Moiety of (b-2) Component

In Formula (b-2), $R^{104}$ and $R^{105}$ each independently represents a cyclic group which may have a substituent, a chain alkyl group which may have a substituent, or a chain alkenyl group which may have a substituent, and examples of $R^{104}$ and $R^{105}$ are respectively the same as those for $R^{101}$ in Formula (b-1). Here, $R^{104}$ and $R^{105}$ may be bonded to each other to form a ring.

$R^{104}$ and $R^{105}$ represent preferably a chain alkyl group which may have a substituent and more preferably a linear or branched alkyl group or a linear or branched fluorinated alkyl group.

The number of carbon atoms of the chain alkyl group is preferably in a range of 1 to 10, more preferably in a range of 1 to 7, and still more preferably in a range of 1 to 3. It is preferable that the number of carbon atoms of the chain alkyl group as $R^{104}$ and $R^{105}$ be as small as possible within the above-described range of carbon atoms from the viewpoint of excellent solubility in a solvent for a resist. Further, in the chain alkyl group as $R^{104}$ and $R^{105}$, it is preferable that the number of hydrogen atoms substituted with fluorine atoms be as large as possible from the viewpoint that the acid strength is increased and the transparency with respect to electron beams or energy light having a wavelength of 200 nm or less is improved.

The proportion of fluorine atoms in the chain alkyl group, that is, the fluorination rate thereof is preferably in a range of 70% to 100% and more preferably in a range of 90% to 100%, and a perfluoroalkyl group formed by all hydrogen atoms being substituted with fluorine atoms is most preferable.

Formula (b-2), $V^{102}$ and $V^{103}$ each independently represents a single bond, an alkylene group, or a fluorinated alkylene group, and examples of $V^{102}$ and $V^{103}$ are respectively the same as those for $V^{101}$ in formula (b-1).

In Formula (b-2), $L^{101}$ and $L^{102}$ each independently represents a single bond or an oxygen atom.

Anionic Moiety of (b-3) Component

In Formula (b-3), $R^{106}$ to $R^{108}$ each independently represents a cyclic group which may have a substituent, a chain alkyl group which may have a substituent, or a chain alkenyl group which may have a substituent, and examples of $R^{106}$ to $R^{108}$ are respectively the same as those for $R^{101}$ in Formula (b-1).

$L^{103}$ to $L^{105}$ each independently represents a single bond, —CO—, or —SO$_2$—.

Cationic Moiety

In Formulae (b-1), (b-2), and (b-3), m represents an integer of 1 or greater. $M^{m+}$ represents an m-valent onium cation and suitable examples thereof include a sulfonium cation and an iodonium cation, and organic cations respectively represented by Formulae (ca-1) to (ca-5) are particularly preferable.

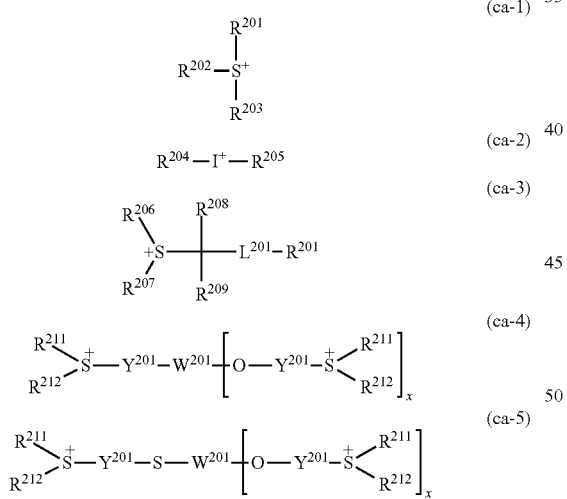

[In the formulae, $R^{201}$ to $R^{207}$, $R^{211}$, and $R^{212}$ each independently represents an aryl group which may have a substituent, an alkyl group, or an alkenyl group, $R^{201}$ to $R^{203}$, $R^{206}$, $R^{207}$, $R^{211}$, and $R^{212}$ may be bonded to one another to form a ring together with the sulfur atom in the formulae. $R^{208}$ and $R^{209}$ each independently represents a hydrogen atom or an alkyl group having 1 to 5 carbon atoms, $R^{210}$ represents an aryl group which may have a substituent, an alkyl group which may have a substituent, an alkenyl group which may have a substituent, or a —SO$_2$-containing cyclic group which may have a substituent, $L^{201}$ represents —C(=O)— or —C(=O)—O—, $Y^{201}$'s each independently represents an arylene group, an alkylene group, or an alkenylene group, x's each independently represents 1 or 2, and $W^{201}$'s each independently represents an (x+1)-valent linking group.]

Examples of the aryl group as $R^{201}$ to $R^{207}$, $R^{211}$, and $R^{212}$ include an unsubstituted aryl group having 6 to 20 carbon atoms, and a phenyl group and a naphthyl group are preferable.

The alkyl group as $R^{201}$ to $R^{207}$, $R^{211}$, and $R^{212}$ is a chain or cyclic alkyl group, and the number of carbon atoms thereof is preferably 1 to 30.

The number of carbon atoms of the alkenyl group as $R^{201}$ to $R^{207}$, $R^{211}$, and $R^{212}$ is preferably in a range of 2 to 10.

Examples of the substituent which may be included in $R^{201}$ to $R^{207}$, $R^{210}$, and $R^{212}$ include an alkyl group, a halogen atom, a halogenated alkyl group, a carbonyl group, a cyano group, an amino group, an aryl group, and groups respectively represented by Formulae (ca-r-1) to (ca-r-7).

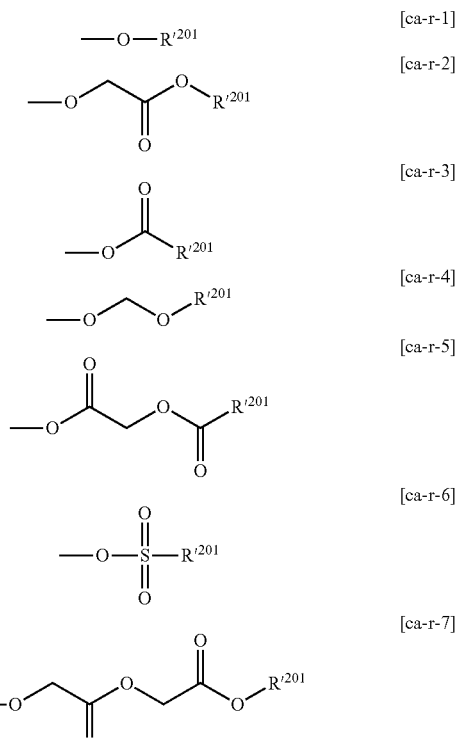

[In the formulae, $R'^{201}$'s each independently represents a hydrogen atom, a cyclic group which may have a substituent, a chain alkyl group which may have a substituent, or a chain alkenyl group which may have a substituent.]

Examples of the cyclic group which may have a substituent, the chain alkyl group which may have a substituent, or the chain alkenyl group which may have a substituent as $R'^{201}$ are the same as those for $R^{101}$ in Formula (b-1). In addition, examples of the cyclic group which may have a substituent or the chain alkyl group which may have a substituent as $R'^{201}$ are the same as those for the acid-dissociable group represented by Formula (a1-r-2) described in the constitutional unit (a1) above.

In a case where $R^{201}$ to $R^{203}$, $R^{206}$, $R^{207}$, $R^{211}$, and $R^{212}$ are bonded to one another to form a ring together with the sulfur atom in the formulae, $R^{201}$ to $R^{203}$, $R^{206}$, $R^{207}$, $R^{211}$, and $R^{212}$ may be bonded through a heteroatom such as a sulfur atom, an oxygen atom, or a nitrogen atom, or a functional group such as a carbonyl group, —SO—, —SO$_2$—, —SO$_3$—, —COO—, —CONH—, or —N(R$_N$)— (R$_N$ represents an alkyl group having 1 to 5 carbon atoms). As the ring to be formed, one ring containing the sulfur atom in the formulae in the ring skeleton is preferably a 3- to 10-membered ring and particularly preferably a 5- to 7-membered ring, including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a phenoxanthiin ring, a tetrahydrothiophenium ring, and a tetrahydrothiopyranium ring.

$R^{208}$ and $R^{209}$ each independently represents a hydrogen atom or an alkyl group having 1 to 5 carbon atoms and preferably a hydrogen atom or an alkyl group having 1 to 3 carbon atoms. In a case where $R^{208}$ and $R^{209}$ each independently represents an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$-containing cyclic group which may have a substituent.

Examples of the aryl group as $R^{210}$ include an unsubstituted aryl group having 6 to 20 carbon atoms, and a phenyl group and a naphthyl group are preferable.

The alkyl group as $R^{210}$ is a chain or cyclic alkyl group, and the number of carbon atoms thereof is preferably 1 to 30.

The number of carbon atoms of the alkenyl group as $R^{210}$ is preferably in a range of 2 to 10.

Examples of the —SO$_2$-containing cyclic group which may have a substituent as $R^{210}$ are the same as those for the "—SO$_2$-containing cyclic group" described above. Among the examples, a polycyclic group is preferable, and a group represented by Formula (a5-r-1) is more preferable.

$Y^{201}$'s each independently represents an arylene group, an alkylene group, or an alkenylene group.

Examples of the arylene group as $Y^{201}$ include a group formed by removing one hydrogen atom from the aryl group exemplified as the aromatic hydrocarbon group as $R^{101}$ in Formula (b-1).

Examples of the alkylene group and the alkenylene group as $Y^{201}$ respectively include groups formed by removing one hydrogen atom from the groups exemplified as the chain alkyl group and the chain alkenyl group as $R^{101}$ in Formula (b-1).

In Formula (ca-4) and Formula (ca-4), x's each independently represents 1 or 2.

$W^{201}$'s each independently represents an (x+1)-valent linking group, that is, a divalent or trivalent linking group.

As the divalent linking group represented by $W^{201}$, a divalent hydrocarbon group which may have a substituent is preferable, and examples of the divalent linking group include the same groups as the groups exemplified for the divalent hydrocarbon group which may have a substituent as $Ya^{011}$ in Formula (a0-1). The divalent linking group as $W^{201}$ may be linear, branched, or cyclic, but a cyclic divalent linking group is preferable. Among the examples, a group formed by two carbonyl groups being combined with both ends of an arylene group is preferable. Examples of the arylene group include a phenylene group and a naphthylene group. Among these, a phenylene group is particularly preferable.

Examples of the trivalent linking group as $W^{201}$ include a group formed by removing one hydrogen atom from the divalent linking group as $W^{201}$ and a group formed by the divalent linking group being bonded to the divalent linking group. As the trivalent linking group as $W^{201}$, a group formed by two carbonyl groups being bonded to an arylene group is preferable.

Specific examples of the suitable cation represented by Formula (ca-1) include cations respectively represented by Formulae (ca-1-1) to (ca-1-67).

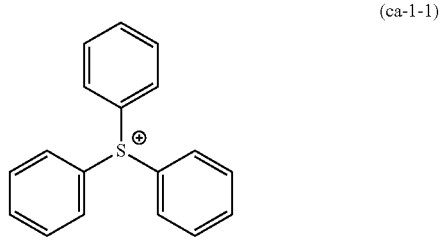

(ca-1-1)

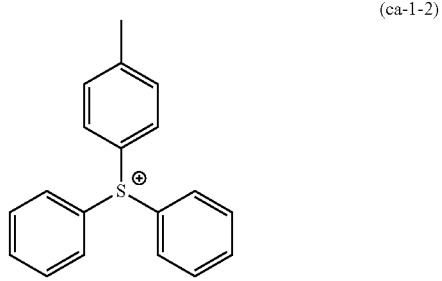

(ca-1-2)

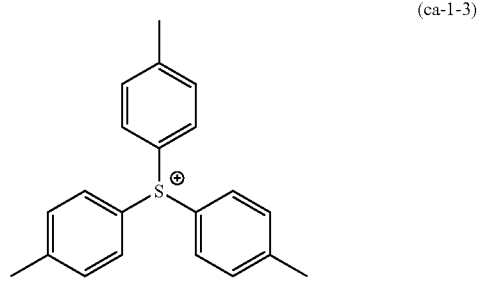

(ca-1-3)

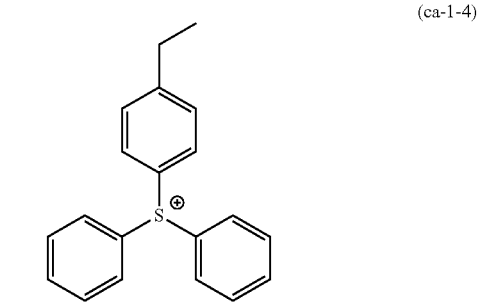

(ca-1-4)

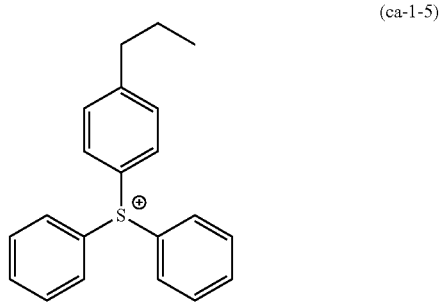

(ca-1-5)

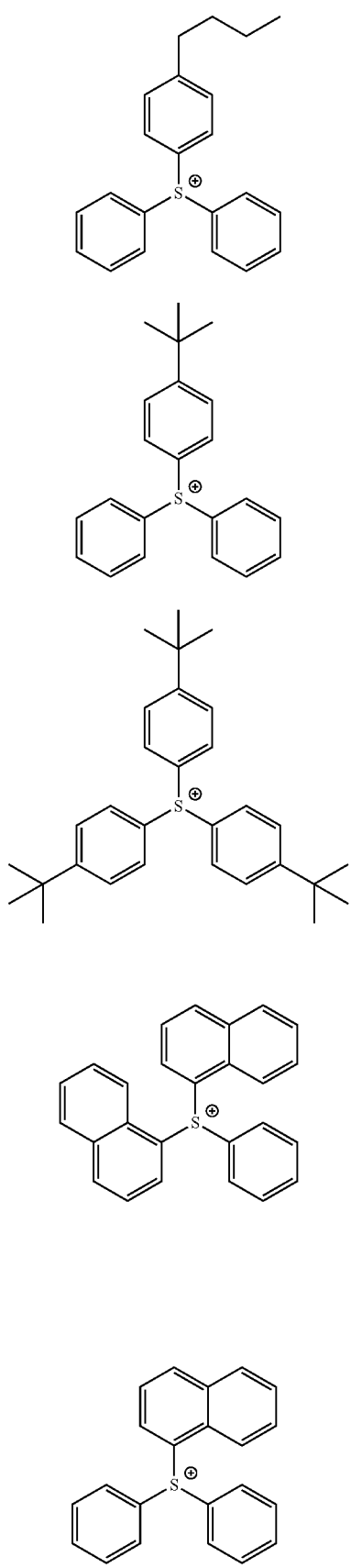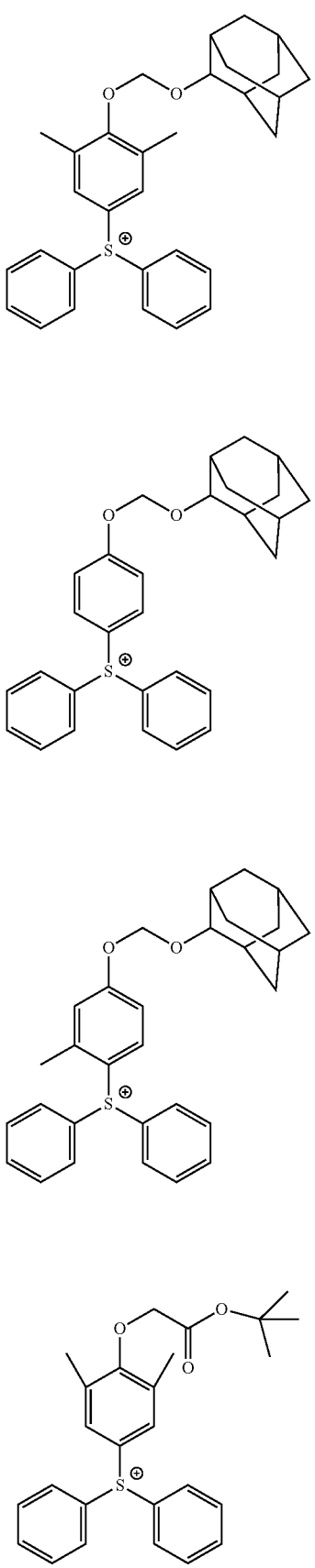

-continued
(ca-1-15)
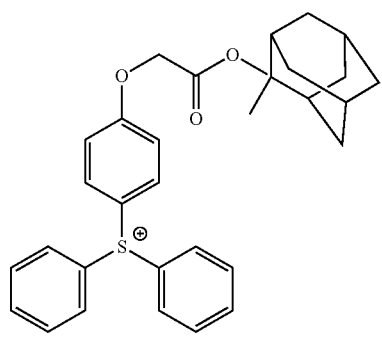
(ca-1-16)
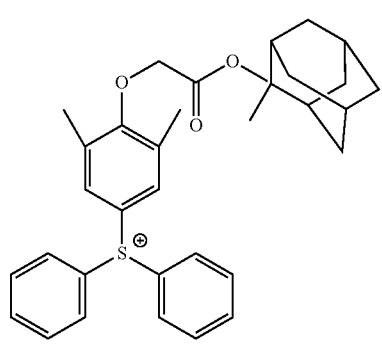
(ca-1-17)
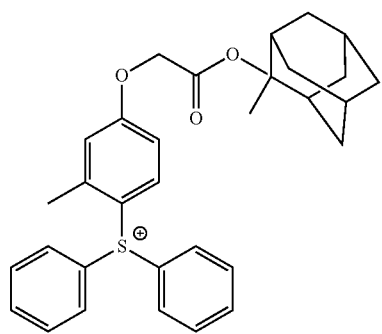
(ca-1-18)
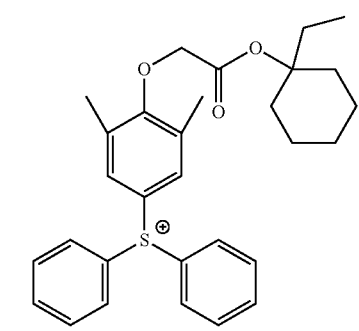
-continued
(ca-1-19)
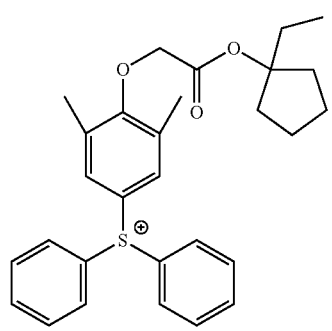
(ca-1-20)
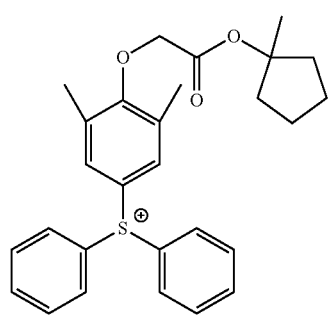
(ca-1-21)
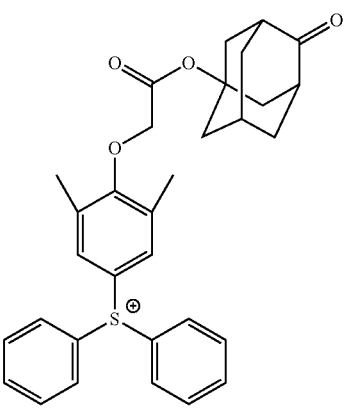
(ca-1-22)
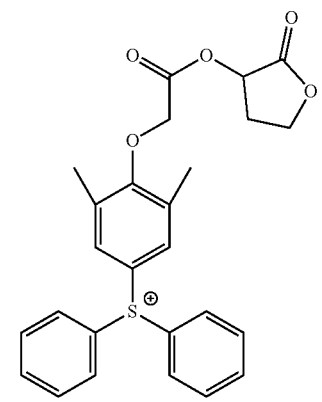

(ca-1-23)
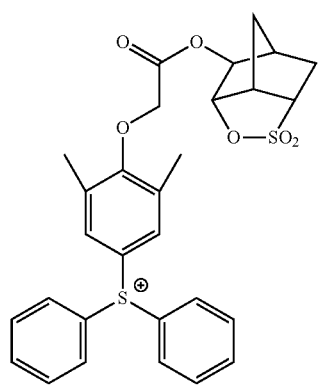
(ca-1-24)
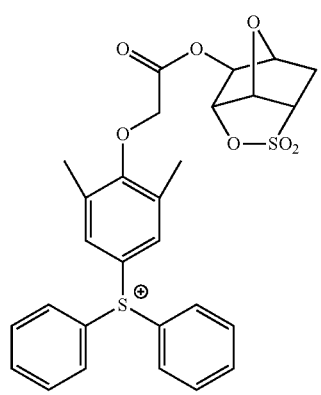
(ca-1-25)
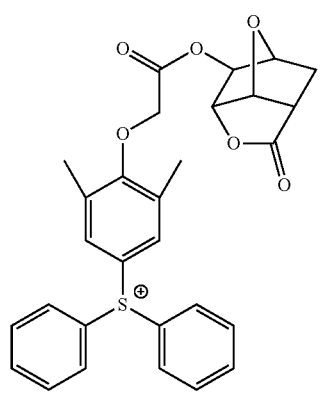
(ca-1-26)
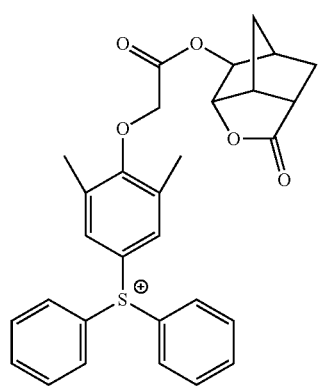
(ca-1-27)
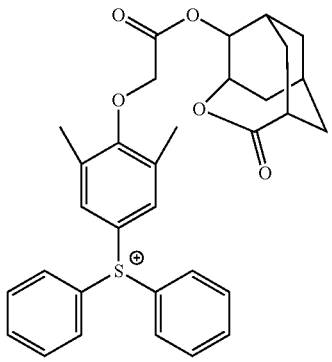
(ca-1-28)
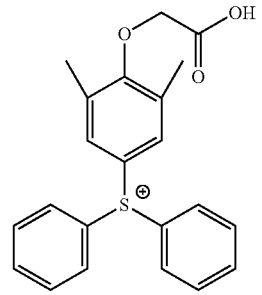
(ca-1-29)
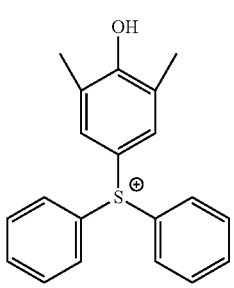
(ca-1-30)
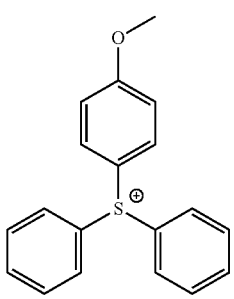
(ca-1-31)
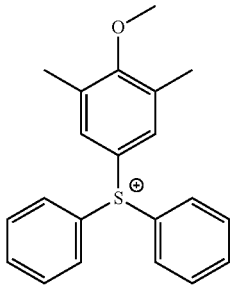

(ca-1-32)
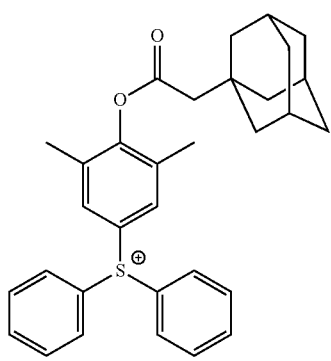
(ca-1-33)
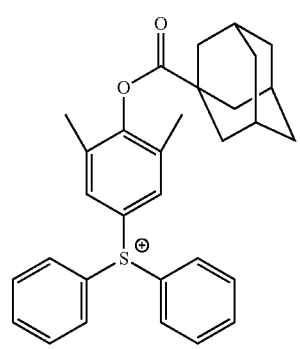
(ca-1-34)
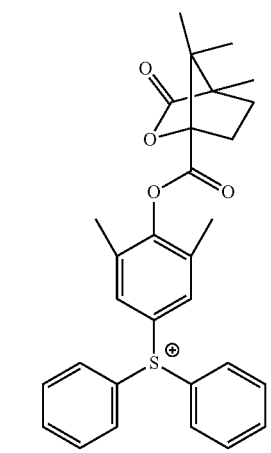
(ca-1-35)
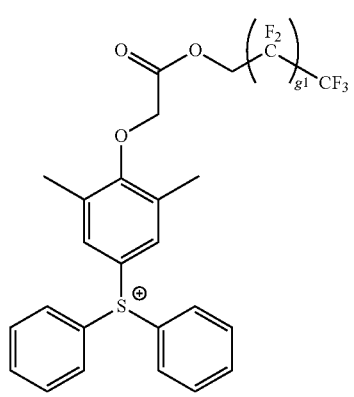
(ca-1-36)
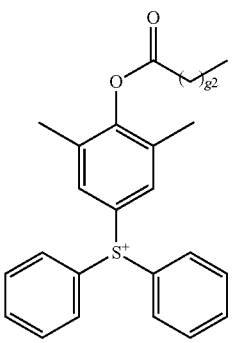
(ca-1-37)
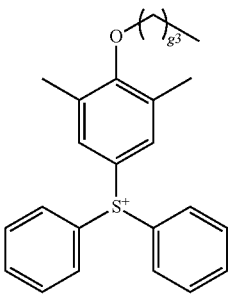
(ca-1-38)
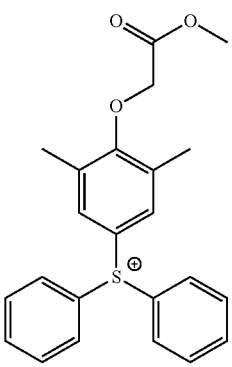
(ca-1-39)
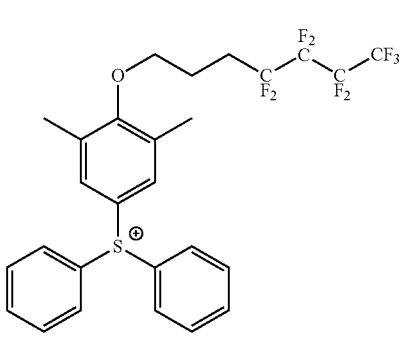

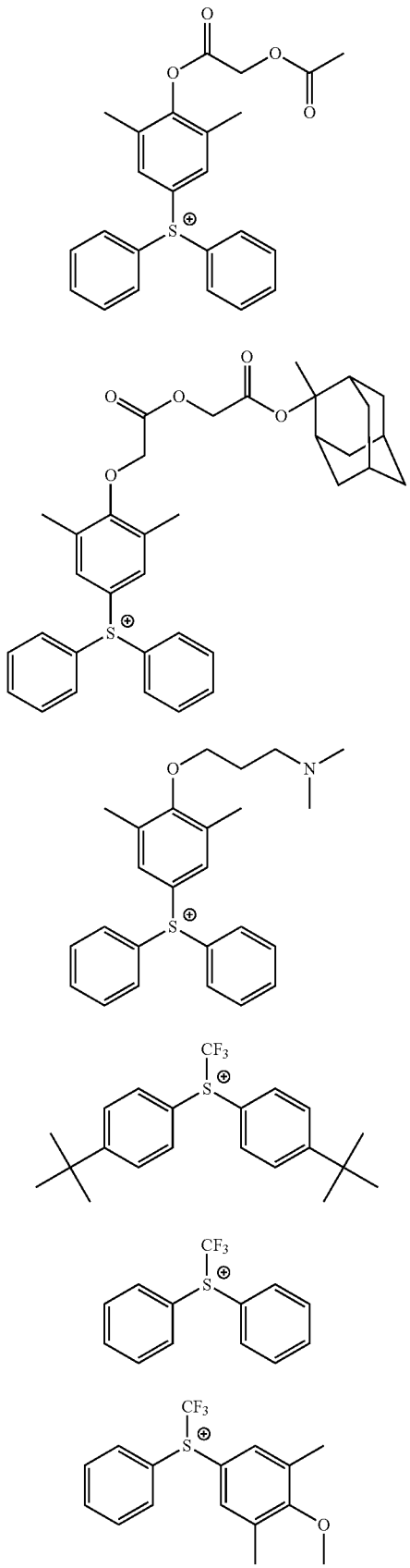
(ca-1-40)
(ca-1-41)
(ca-1-42)
(ca-1-43)
(ca-1-44)
(ca-1-45)
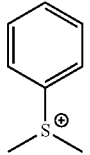
(ca-1-46)
(ca-1-47)
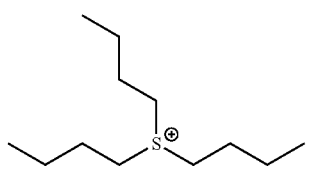
(ca-1-48)
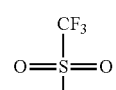
(ca-1-49)
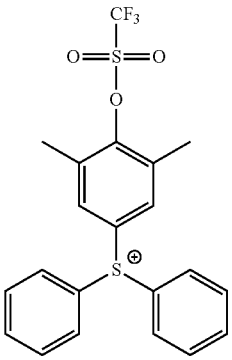
(ca-1-50)
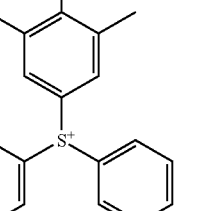
(ca-1-51)
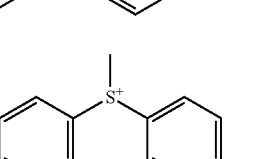
[In the formulae, g1, g2, and g3 represent the repetition number, g1 represents an integer of 1 to 5, g2 represents an integer of 0 to 20, and g3 represents an integer of 0 to 20.]

(ca-1-52) 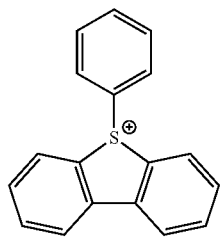
(ca-1-53) 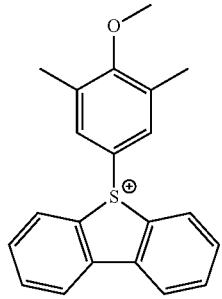
(ca-1-54) 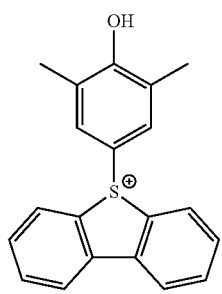
(ca-1-55) 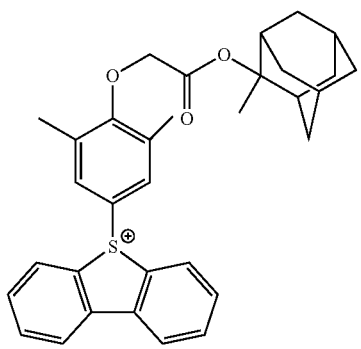
(ca-1-56) 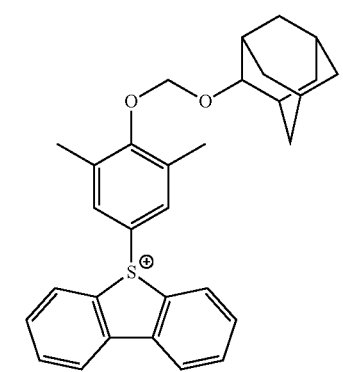
-continued
(ca-1-57) 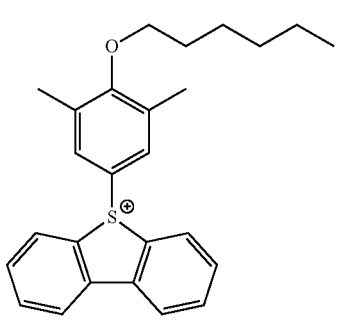
(ca-1-58) 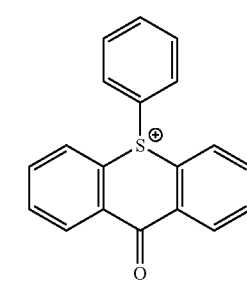
(ca-1-59) 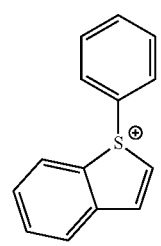
(ca-1-60) 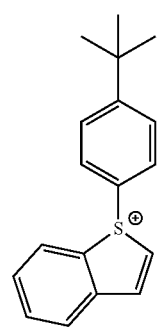
(ca-1-61) 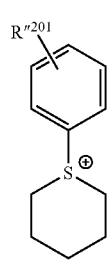

(ca-1-62)
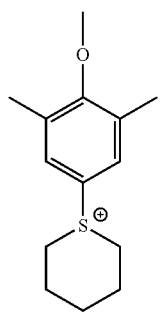

(ca-1-63)
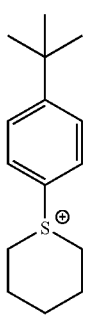

(ca-1-64)
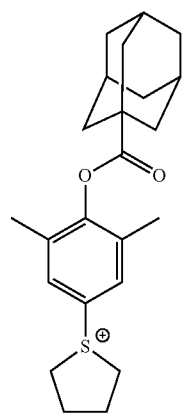

(ca-1-65)
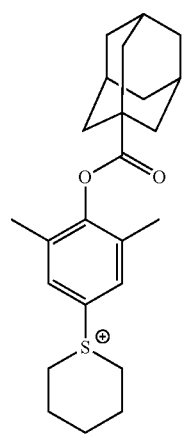

(ca-1-66)
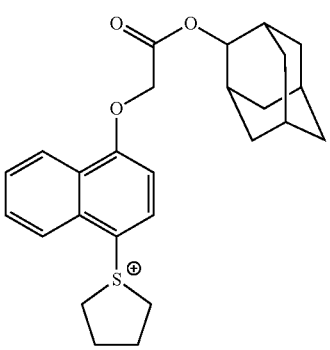

(ca-1-67)
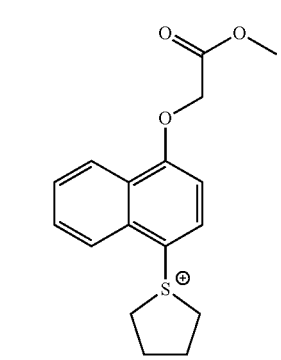

[In the formulae, $R''^{201}$ represents a hydrogen atom or a substituent, and examples of the substituent are the same as those for the substituents which may be included in $R^{201}$ to $R^{207}$ and $R^{210}$ to $R^{212}$.]

Specific suitable examples of the cation represented by Formula (ca-2) include a diphenyl iodonium cation and a bis(4-tert-butylphenyl)iodonium cation.

Specific suitable examples of the cation represented by Formula (ca-3) include cations respectively represented by Formulae (ca-3-1) to (ca-3-6).

(ca-3-1)
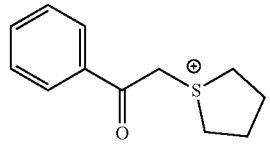

(ca-3-2)
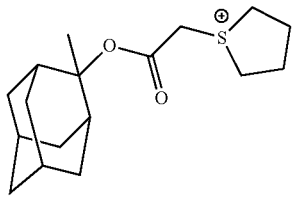

(ca-3-3)
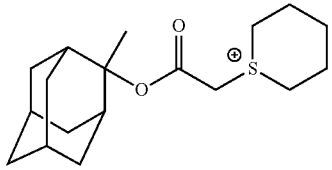

(ca-3-4)
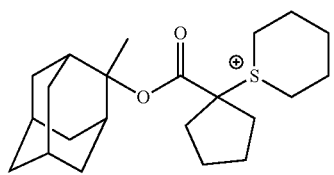
(ca-3-5)
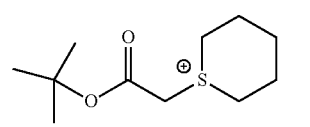
(ca-3-6)
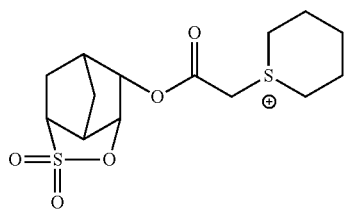
(ca-4-1)
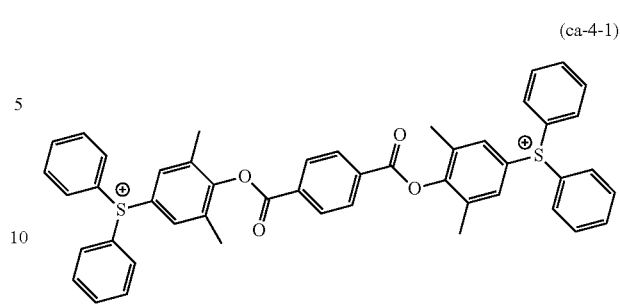
(ca-4-2)
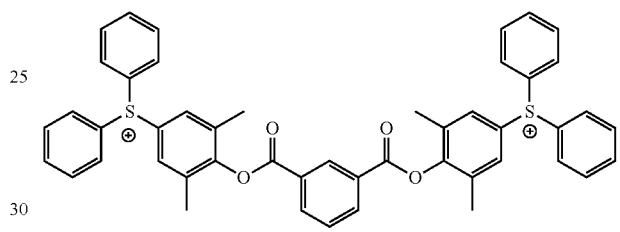
Specific suitable examples of the cation represented by Formula (ca-4) include cations respectively represented by Formulae (ca-4-1) and (ca-4-2).
Specific suitable examples of the cation represented by Formula (ca-5) include cations respectively represented by Formulae (ca-5-1) to (ca-5-3).
(ca-5-1)
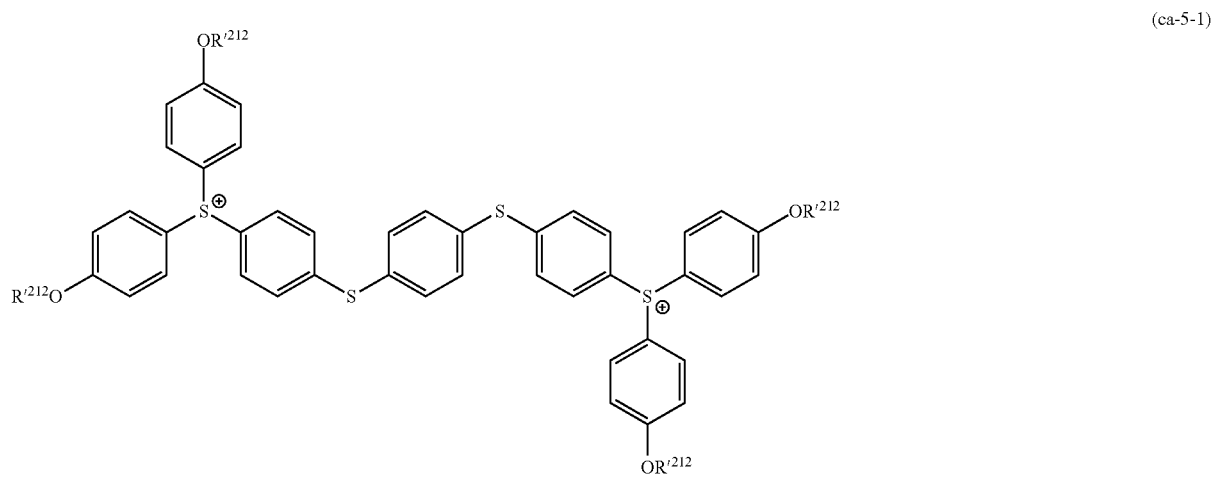

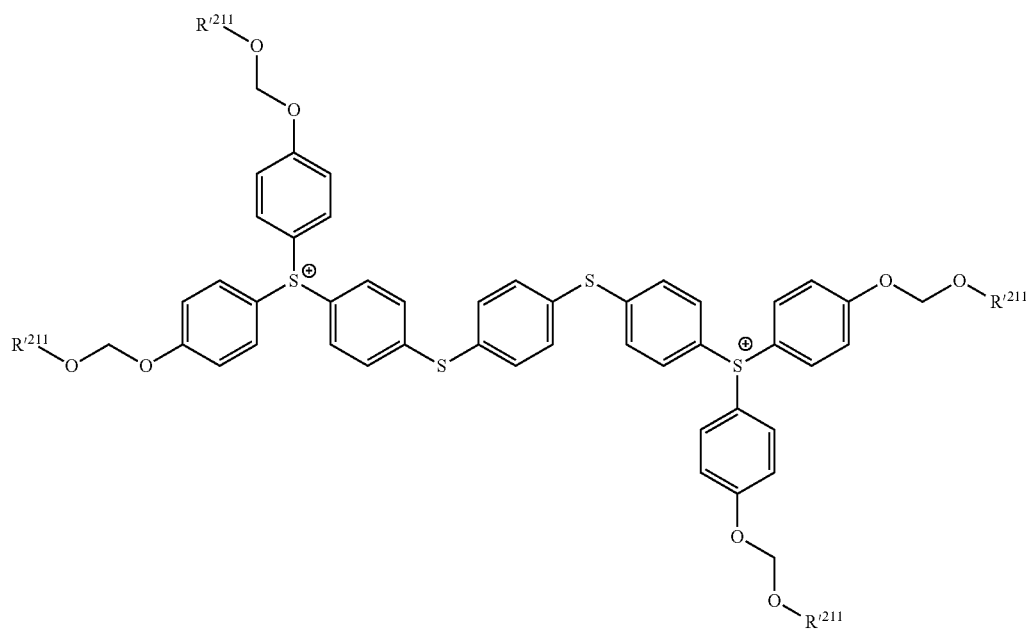

(ca-5-2)

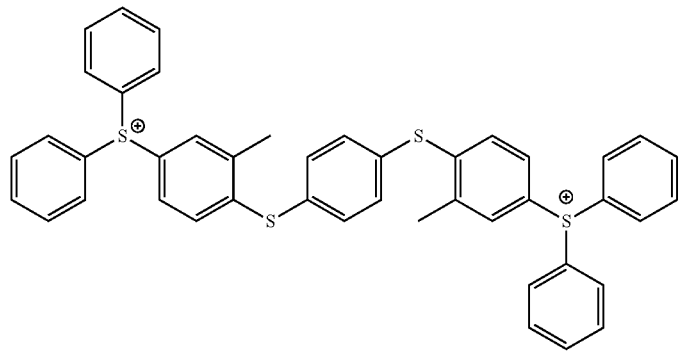

(ca-5-3)

Among the examples, as the cationic moiety $[(M'^{m+})_{l/m}]$, a cation represented by Formula (ca-1) is preferable, and cations respectively represented by Formulae (ca-1-1) to (ca-1-67) are more preferable.

In the (B) component, the above-described acid generator may be used alone or in combination of two or more kinds thereof.

In a case where the resist composition of the present embodiment contains the (B) component, the content of the (B) component is preferably in a range of 0.5 to 60 parts by mass, more preferably in a range of 1 to 50 parts by mass, and still more preferably in a range of 1 to 40 parts by mass with respect to 100 parts by mass of the (A) component.

In a case where the content of the (B) component is set to be in the above-described range, pattern formation is sufficiently performed. Further, it is preferable that each component of the resist composition be dissolved in an organic solvent from the viewpoint that a uniform solution is easily obtained and the storage stability of the resist composition becomes excellent.

(D) Component: Acid Diffusion Control Agent Component

The resist composition of the present embodiment may further contain an acid diffusion control agent component (hereinafter, referred to as a "(D) component") in addition to the (A) component or in addition to the (A) component and the (B) component. The (D) component acts as a quencher (acid diffusion control agent) that traps an acid generated when the resist composition is exposed.

The (D) component may be a photodegradable base (D1) (hereinafter, referred to as a "(D1) component") that loses acid diffusion controllability by being decomposed when exposed or may be a nitrogen-containing organic compound (D2) (hereinafter, referred to as a "(D2) component") that does not correspond to the (D1) component.

Regarding (D1) Component

In a case where the resist composition contains the (D1) component, the contrast between the exposed portion and the unexposed portion can be improved during the formation of the resist pattern.

The (D1) component is not particularly limited as long as the component loses the acid diffusion controllability by being decomposed when exposed, and one or more compounds selected from the group consisting of a compound represented by Formula (d1-1) (hereinafter, referred to as a "(d1-1) component"), a compound represented by Formula (d1-2) (hereinafter, referred to as a "(d1-2) component"), and a compound represented by Formula (d1-3) (hereinafter, referred to as a "(d1-3) component") are preferable.

The (d1-1) to (d1-3) components act as a quencher in the unexposed portion of the resist film without acting as a quencher in the exposed portion of the resist film because the components lose the acid diffusion controllability (basicity) by being decomposed.

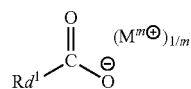  (d1-1)

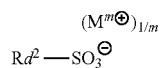  (d1-2)

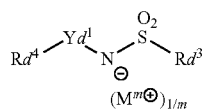  (d1-3)

[In the formulae, $Rd^1$ to $Rd^4$ each independently represents a cyclic group which may have a substituent, a chain alkyl group which may have a substituent, or a chain alkenyl group which may have a substituent. Here, it is determined that a fluorine atom is not bonded to a carbon atom adjacent to a S atom in $Rd^2$ in Formula (d1-2). $Yd^1$ represents a single bond or a divalent linking group. m represents an integer of 1 or greater, and $M^{m+}$'s each independently represents an m-valent organic cation.]

(d1-1) Component
Anionic Moiety

In Formula (d1-1), $Rd^1$ represents a cyclic group which may have a substituent, a chain alkyl group which may have a substituent, or a chain alkenyl group which may have a substituent, and examples thereof are respectively the same as those for $R^{101}$ in Formula (b-1).

Among these, it is preferable that $Rd^1$ represent an aromatic hydrocarbon group which may have a substituent, an aliphatic cyclic group which may have a substituent, or a chain alkyl group which may have a substituent. Examples of the substituents which may be included in these groups include a hydroxyl group, an oxo group, an alkyl group, an aryl group, a fluorine atom, a fluorinated alkyl group, lactone-containing cyclic groups respectively represented by Formulae (a2-r-1) to (a2-r-7), an ether bond, an ester bond, and a combination of these. In a case where an ether bond or an ester bond is included as a substituent, the ether bond or the ester bond may be present through an alkylene group. As the substituents in this case, linking groups respectively represented by Formulae (y-a1-1) to (y-a1-5) are preferable.

As the aromatic hydrocarbon group, a phenyl group or a naphthyl group is more preferable.

As the aliphatic cyclic group, a group formed by removing one or more hydrogen atoms from a polycycloalkane such as adamantane, norbornane, isobomane, tricyclodecane, or tetracyclododecane is more preferable.

The number of carbon atoms of the chain alkyl group is preferably in a range of 1 to 10, and specific examples of such an alkyl group include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain alkyl group is a fluorinated alkyl group having a fluorine atom or a fluorinated alkyl group as a substituent, the number of carbon atoms of the fluorinated alkyl group is preferably in a range of 1 to 11, more preferably in a range of 1 to 8, and still more preferably in a range of 1 to 4. The fluorinated alkyl group may contain atoms other than the fluorine atom. Examples of the atoms other than the fluorine atom include an oxygen atom, a sulfur atom, and a nitrogen atom.

$Rd^1$ represents preferably a fluorinated alkyl group in which some or all hydrogen atoms constituting the linear alkyl group are substituted with fluorine atoms and particularly preferably a fluorinated alkyl group (linear perfluoroalkyl group) in which all hydrogen atoms constituting the linear alkyl group are substituted with fluorine atoms.

Hereinafter, specific preferred examples of the anionic moiety of the (d1-1) component are described.

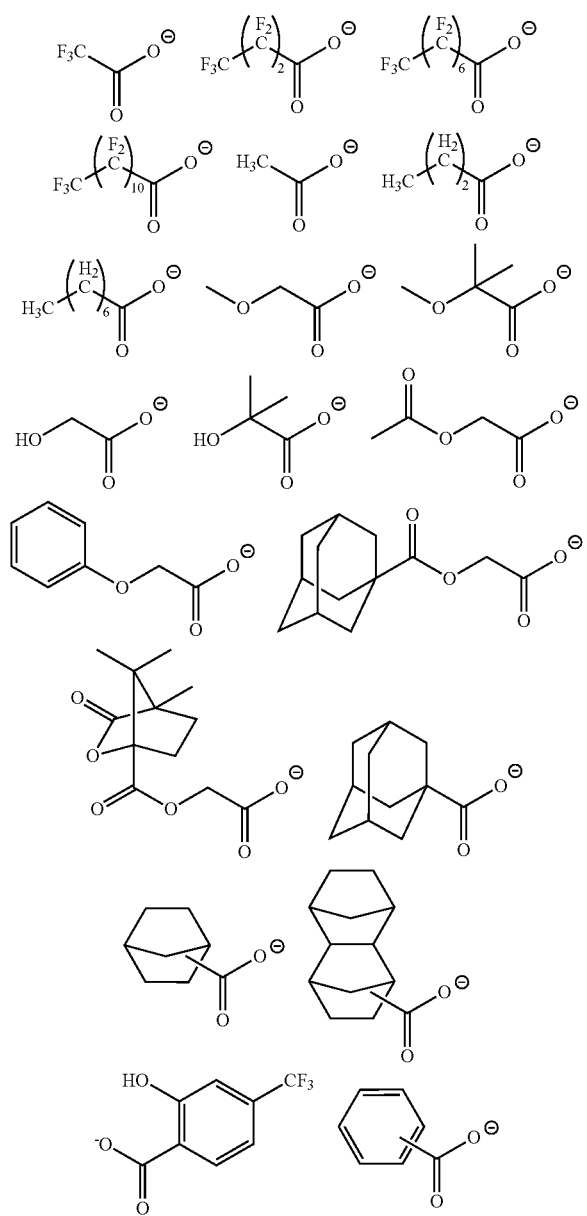

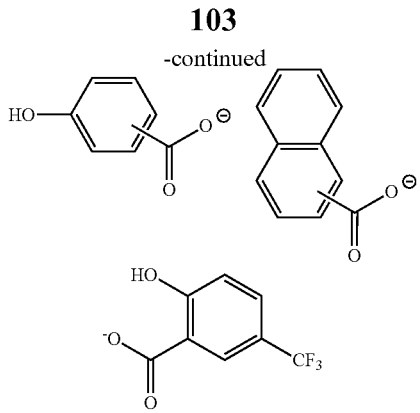

Cationic Moiety

In Formula (d1-1), $M^{m+}$ represents an m-valent organic cation.

Suitable examples of the organic cation as $M^{m+}$ are the same as those for the cations respectively represented by Formulae (ca-1) to (ca-5). Among these, the cation represented by Formula (ca-1) is more preferable, and the cations respectively represented by Formulae (ca-1-1) to (ca-1-67) are still more preferable.

The (d1-1) component may be used alone or in combination of two or more kinds thereof.

(d1-2) Component

Anionic Moiety

In Formula (d1-2), $Rd^2$ represents a cyclic group which may have a substituent, a chain alkyl group which may have a substituent, or a chain alkenyl group which may have a substituent, and examples thereof are respectively the same as those for $R^{101}$ in Formula (b-1).

Here, it is determined that a fluorine atom is not bonded (is not fluorine-substituted) to a carbon atom adjacent to a S atom as $Rd^2$. In this manner, the anion of the (d1-2) component becomes an appropriately weak acid anion and the quenching ability as the (D) component is improved.

As $Rd^2$, a chain alkyl group which may have a substituent or an aliphatic cyclic group which may have a substituent is preferable. The number of carbon atoms of the chain alkyl group is preferably in a range of 1 to 10 and more preferably in a range of 3 to 10. More preferred examples of the aliphatic cyclic group include a group (which may have a substituent) formed by removing one or more hydrogen atoms from adamantane, norbornane, isobornane, tricyclodecane, or tetracyclododecane; and a group formed by removing one or more hydrogen atoms from camphor.

The hydrocarbon group as $Rd^2$ may have a substituent, and examples of the substituent are the same as those for the substituent which may be included in the hydrocarbon group (such as an aromatic hydrocarbon group, an aliphatic cyclic group, or a chain alkyl group) as $Rd^1$ in Formula (d1-1).

Hereinafter, specific preferred examples of the anionic moiety of the (d1-2) component are described.

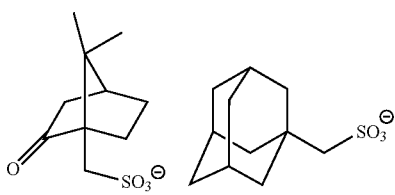

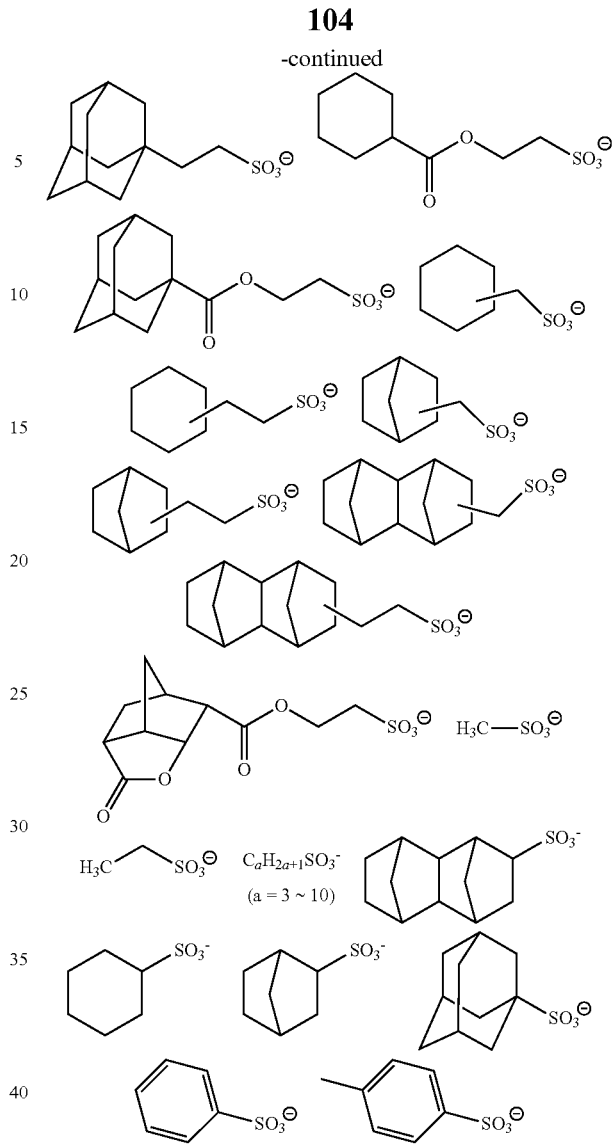

Cationic Moiety

In Formula (d1-2), $M^{m+}$ represents an m-valent organic cation and has the same definition as that for $M^{m+}$ in Formula (d1-1).

The (d1-2) component may be used alone or in combination of two or more kinds thereof.

(d1-3) Component

Anionic Moiety

In Formula (d1-3), $Rd^3$ represents a cyclic group which may have a substituent, a chain alkyl group which may have a substituent, or a chain alkenyl group which may have a substituent, and examples thereof are the same as those for $R^{101}$ in Formula (b-1) and a cyclic group having fluorine atoms, a chain alkyl group, or a chain alkenyl group is preferable. Among these, a fluorinated alkyl group is preferable, and the same fluorinated alkyl group as $Rd^1$ is more preferable.

In Formula (d1-3), $Rd^4$ represents a cyclic group which may have a substituent, a chain alkyl group which may have a substituent, or a chain alkenyl group which may have a substituent, and examples thereof are the same as those for $R^{101}$ in Formula (b-1).

Among these, an alkyl group which may have a substituent, an alkoxy group, an alkenyl group, and a cyclic group are preferable.

As the alkyl group represented by $Rd^4$, a linear or branched alkyl group having 1 to 5 carbon atoms is preferable, and specific examples thereof include a methyl group, an ethyl group, an n-propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, and the like.

It is preferable that the alkoxy group as $Rd^4$ be an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ are the same as those for $R^{101}$ in Formula (b-1). Among the examples, a vinyl group, a propenyl group (allyl group), a 1-methylpropenyl group, and a 2-methylpropenyl group are preferable. These groups may further have an alkyl group having 1 to 5 carbon atoms or a halogenated alkyl group having 1 to 5 carbon atoms as a substituent.

Examples of the cyclic group as $Rd^4$ are the same as those for $R^{101}$ in Formula (b-1). Among the examples, an alicyclic group formed by removing one or more hydrogen atoms from a cycloalkane such as cyclopentane, cyclohexane, adamantane, norbornane, isobornane, tricyclodecane, or tetracyclododecane; or an aromatic group such as a phenyl group or a naphthyl group is preferable. In a case where $Rd^4$ represents an alicyclic group, lithography characteristics become excellent because the resist composition is satisfactorily dissolved in an organic solvent. Further, in a case where $Rd^4$ represents an aromatic group, the resist composition has excellent light absorption efficiency and the sensitivity or lithography characteristics become excellent in the lithography using EUV or the like as an exposure light source.

In Formula (d1-3), $Yd^1$ represents a single bond or a divalent linking group.

The divalent linking group as $Yd^1$ is not particularly limited, and examples thereof include a divalent hydrocarbon group (such as an aliphatic hydrocarbon group or an aromatic hydrocarbon group) which may have a substituent and a divalent linking group having heteroatoms. Examples thereof are respectively the same as those for the divalent hydrocarbon group which may have a substituent and the divalent linking group having heteroatoms, which have been described in the section of the divalent linking group as $Ya^{011}$ in Formula (a01).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Hereinafter, specific preferred examples of the anionic moiety of the (d1-3) component are described.

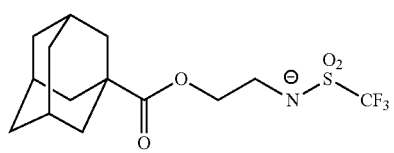

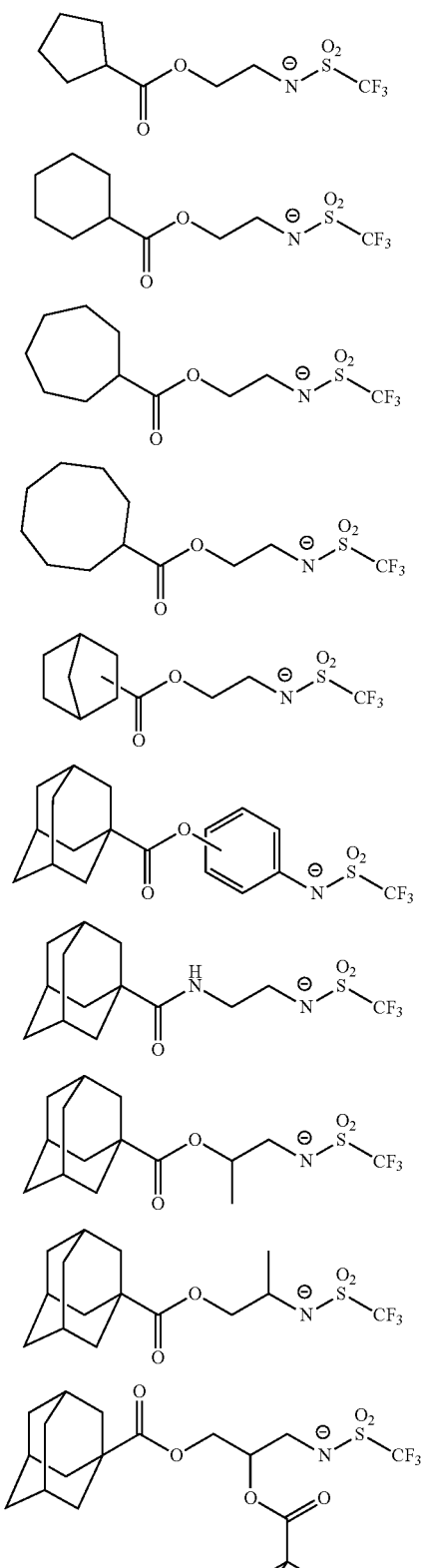

-continued

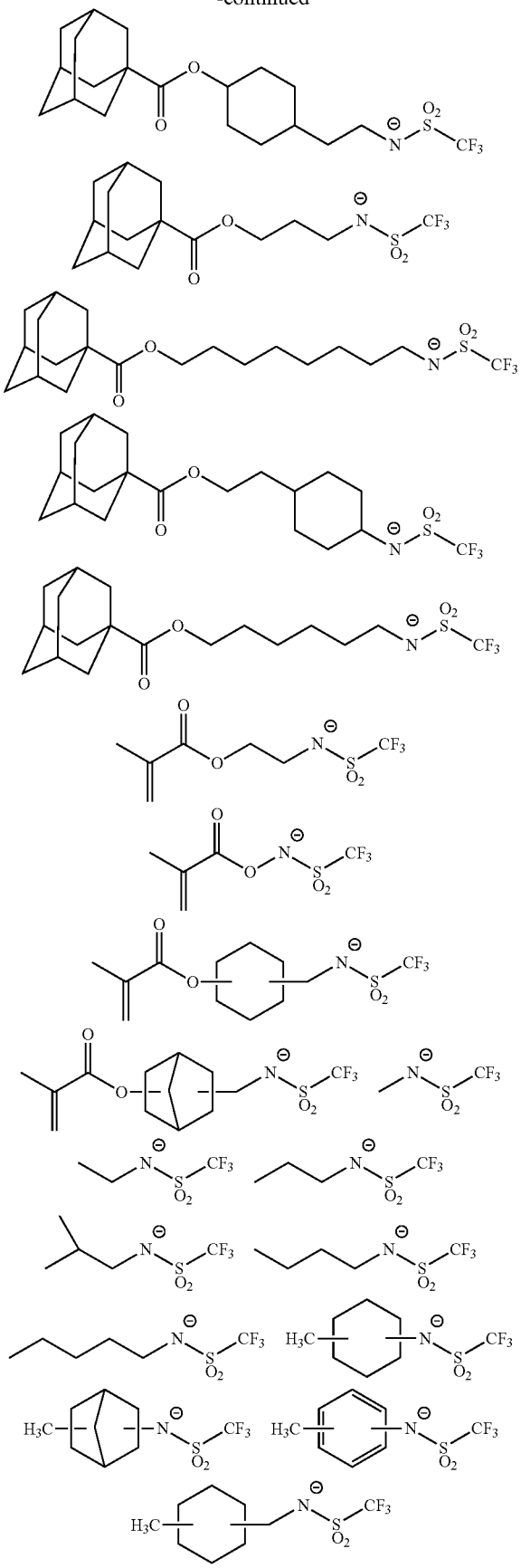

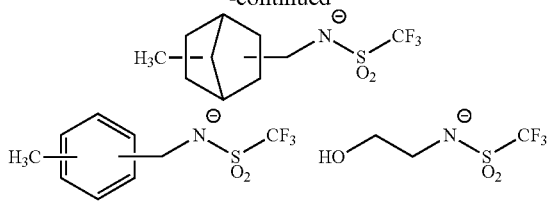

Cationic Moiety

In Formula (d1-3), $M^{m+}$ represents an m-valent organic cation and has the same definition as that for $M^{m+}$ in Formula (d1-1).

The (d1-3) component may be used alone or in combination of two or more kinds thereof.

Only any one component from among the above-described (d1-1) to (d1-3) components may be used or a combination of two or more kinds thereof may be used as the (D1) component.

Among these, it is preferable that the (d1-1) component be used as the (D1) component.

In a case where the resist composition of the present embodiment contains the (D1) component, the content of the (D1) component is preferably in a range of 0.5 parts to 10 parts by mass, more preferably in a range of 0.5 to 8 parts by mass, and still more preferably in a range of 1 to 8 parts by mass with respect to 100 parts by mass of the (A) component.

In a case where the content of the (D1) component is greater than or equal to the above-described preferable lower limit, particularly excellent lithography characteristics and a particularly excellent resist pattern shape are easily obtained. In addition, in a case where the content of the (D1) component is less than or equal to the above-described preferable upper limit, the sensitivity can be satisfactorily maintained and the throughput becomes excellent.

Method of Producing (D1) Component:

A method of producing the (d1-1) component and the (d1-2) component is not particularly limited, and the (d1-1) component and the (d1-2) component can be produced using a known method.

Further, a method of producing the (d1-3) component is not particularly limited. For example, the (d1-3) component is produced using the same method described in US2012-0149916.

Regarding (D2) Component

The acid diffusion control agent component may contain a nitrogen-containing organic compound component (hereinafter, referred to as a "(D2) component) that does not correspond to the (D1) component.

The (D2) component is not particularly limited as long as the component acts as an acid diffusion control agent and does not correspond to the (D1) component and may be optionally selected from known ones. Among known ones, an aliphatic amine is preferable. Among examples of the aliphatic amine, a secondary aliphatic amine or a tertiary aliphatic amine is more preferable.

The aliphatic amine indicates an amine that contains one or more aliphatic groups, and the number of carbon atoms of the aliphatic group is preferably in a range of 1 to 12.

Examples of the aliphatic amine include an amine (alkylamine or alkyl alcohol amine) in which at least one hydrogen atom of ammonia $NH_3$ is substituted with an alkyl group having 12 or less carbon atoms or a hydroxyalkyl group; and a cyclic amine Specific examples of the alkylamine and the alkyl alcohol amine include monoalkylamine such as n-hexylamine, n-heptylamine, n-octylamine, n-nonylamine, or n-decylamine; dialkylamine such as diethylamine, di-n-propylamine, di-n-heptylamine, di-n-octylamine, or dicyclohexylamine; trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, or tri-n-dodecylamine; and alkyl alcohol amine such as diethanolamine, triethanolamine, diisopropanolamine, triisopropanolamine, di-n-octanolamine, or tri-n-octanolamine Among these, trialkylamine having 5 to 10 carbon atoms is more preferable, and tri-n-pentylamine or tri-n-octylamine is particularly preferable.

Examples of the cyclic amine include a heterocyclic compound having nitrogen atoms as heteroatoms. The heterocyclic compound may be monocyclic (aliphatic monocyclic amine) or polycyclic (aliphatic polycyclic amine).

Specific examples of the aliphatic monocyclic amine include piperidine and piperazine.

The number of carbon atoms of the aliphatic polycyclic amine is preferably in a range of 6 to 10, and specific examples of such an aliphatic polycyclic amine include 1,5-diazabicyclo[4.3.0]-5-nonene, 1,8-diazabicyclo[5.4.0]-7-undecene, hexamethylenetetramine, and 1,4-diazabicyclo[2.2.2]octane.

Other examples of the aliphatic amine include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate. Among these, triethanolamine triacetate is preferable.

Further, an aromatic amine may be used as the (D2) component.

Examples of the aromatic amine include 4-dimethylaminopyridine, pyrrole, indole, pyrazole, imidazole, and derivatives of these, tribenzylamine, 2,6-diisopropylaniline, and N-tert-butoxycarbonyl pyrrolidine.

The (D2) component may be used alone or in combination of two or more kinds thereof.

In a case where the resist composition of the present embodiment contains the (D2) component, the content of the (D2) component to be used is typically in a range of 0.01 to 5 parts by mass with respect to 100 parts by mass of the (A) component. In a case where the content thereof is set to be in the above-described range, the resist pattern shape, post-exposure temporal stability, and the like are improved.

(E) component: at least one compound selected from group consisting of organic carboxylic acid, oxo acid of phosphorus, and derivative thereof.

The resist composition of the present embodiment may contain at least one compound (E) (hereinafter, referred to as an (E) component) selected from the group consisting of organic carboxylic acid, oxo acid of phosphorus, and a derivative thereof as an optional component for the purpose of preventing deterioration of sensitivity and improving the resist pattern shape and the post-exposure temporal stability.

Suitable examples of the organic carboxylic acid include acetic acid, malonic acid, citric acid, malic acid, succinic acid, benzoic acid, and salicylic acid.

Examples of the oxo acid of phosphorus include phosphoric acid, phosphonic acid, and phosphinic acid. Among these, phosphonic acid is particularly preferable.

Examples of the derivative of the oxo acid of phosphorus include an ester in which a hydrogen atom of the oxo acid is substituted with a hydrocarbon group; and examples of the hydrocarbon group include an alkyl group having 1 to 5 carbon atoms and an aryl group having 6 to 15 carbon atoms.

Examples of the derivative of phosphoric acid include phosphoric acid ester such as phosphoric acid di-n-butyl ester or phosphoric acid diphenyl ester.

Examples of the derivative of phosphonic acid include phosphonic acid ester such as phosphonic acid dimethyl ester, phosphonic acid-di-n-butyl ester, phenylphosphonic acid, phosphonic acid diphenyl ester, or phosphonic acid dibenzyl ester.

Examples of the derivative of phosphinic acid include phosphinic acid ester and phenylphosphinic acid.

The (E) component may be used alone or in combination of two or more kinds thereof.

In a case where the resist composition contains the (E) component, the content of the (E) component to be used is typically in a range of 0.01 to 5 parts by mass with respect to 100 parts by mass of the (A) component.

(F) Component: Fluorine Additive Component

The resist composition of the present embodiment may contain a fluorine additive component (hereinafter, referred to as an (F) component) in order to impart water repellency to the resist film.

As the (F) component, for example, fluorine-containing polymer compounds described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the (F) component include a polymer having a constitutional unit (f1) represented by Formula (f1-1). Preferred examples of the polymer include a polymer (homopolymer) formed of only the constitutional unit (f1) represented by Formula (f1-1); a copolymer of the constitutional unit (f1) and the constitutional unit (a1) that contains an acid-decomposable group whose polarity is increased due to an action of an acid; a copolymer of the constitutional unit (f1) and the constitutional unit (a4) that contains an acid non-dissociable aliphatic cyclic group; a copolymer of the constitutional unit (f1), a constitutional unit derived from acrylic acid or methacrylic acid, and the constitutional unit (a1); and a copolymer of the constitutional unit (f1), a constitutional unit derived from acrylic acid or methacrylic acid, and the constitutional unit (a4). Here, as the constitutional unit (a1) to be copolymerized with the constitutional unit (f1), a constitutional unit derived from 1-ethyl-1-cyclooctyl (meth)acrylate or a constitutional unit derived from 1-methyl-1-adamantyl (meth)acrylate is preferable.

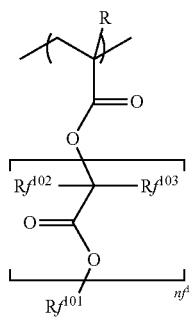

(f1-1)

[In the formula, R represents a hydrogen atom, an alkyl group having 1 to 5 carbon atoms, or a halogenated alkyl group having 1 to 5 carbon atoms. $Rf^{102}$ and $Rf^{103}$ each independently represents a hydrogen atom, a halogen atom, an alkyl group having 1 to 5 carbon atoms, or a halogenated alkyl group having 1 to 5 carbon atoms. $nf^1$ represents an integer of 0 to 5, and $Rf^{101}$ represents an organic group having fluorine atoms.]

In Formula (f1-1), R's each independently represents a hydrogen atom, an alkyl group having 1 to 5 carbon atoms, or a halogenated alkyl group having 1 to 5 carbon atoms. R in Formula (f1-1) has the same definition as that for R in Formula (a0-1).

R represents preferably a hydrogen atom, an alkyl group having 1 to 5 carbon atoms, or a fluorinated alkyl group having 1 to 5 carbon atoms, more preferably a hydrogen atom or an alkyl group having 1 to 5 carbon atoms from the viewpoint of ease of industrial availability, still more preferably an alkyl group having 1 to 5 carbon atoms, and particularly preferably a methyl group.

In Formula (f1-1), examples of the halogen atom as $Rf^{102}$ and $Rf^{103}$ include a fluorine atom, a chlorine atom, a bromine atom, and an iodine atom. Among these, a fluorine atom is particularly preferable. Examples of the alkyl group having 1 to 5 carbon atoms as $Rf^{102}$ and $Rf^{103}$ are the same as those for the alkyl group having 1 to 5 carbon atoms as R. Among the examples, a methyl group or an ethyl group is preferable. Specific examples of the halogenated alkyl group having 1 to 5 carbon atoms as $Rf^{102}$ and $Rf^{103}$ include a group formed by some or all hydrogen atoms of an alkyl group having 1 to 5 carbon atoms being substituted with halogen atoms.

Examples of the halogen atoms include a fluorine atom, a chlorine atom, a bromine atom, and an iodine atom. Among these, a fluorine atom is particularly preferable. Among these, as $Rf^{102}$ and $Rf^{103}$, a hydrogen atom, a fluorine atom, or an alkyl group having 1 to 5 carbon atoms is preferable; and a hydrogen atom, a fluorine atom, a methyl group, or an ethyl group is more preferable.

In Formula (f1-1), $nf^1$ represents an integer of 0 to 5, preferably an integer of 0 to 3, and more preferably 0 or 1.

In Formula (f1-1), $Rf^{101}$ represents an organic group having fluorine atoms and preferably a hydrocarbon group having fluorine atoms.

The hydrocarbon group having fluorine atoms may be linear, branched, or cyclic, and the number of carbon atoms is preferably in a range of 1 to 20, more preferably in a range of 1 to 15, and particularly preferably in a range of 1 to 10.

In the hydrocarbon group having fluorine atoms, it is preferable that 25% or greater of hydrogen atoms in the hydrocarbon group be fluorinated, more preferable that 50% or greater of hydrogen atoms therein be fluorinated, and particularly preferable that 60% or greater of hydrogen atoms therein be fluorinated from the viewpoint that the hydrophobicity of the resist film at the time of immersion and exposure is increased.

Among the examples, $Rf^{101}$ represents more preferably a fluorinated hydrocarbon group having 1 to 5 carbon atoms and particularly preferably a trifluoromethyl group, —$CH_2$—$CF_3$, —$CH_2$—$CF_2$—$CF_3$, —$CH(CF_3)_2$, —$CH_2$—$CH_2$—$CF_3$, or —$CH_2$—$CH_2$—$CF_2$—$CF_2$—$CF_2$—$CF_3$.

The mass-average molecular weight (Mw) (in terms of polystyrene according to gel permeation chromatography) of the (F) component is preferably in a range of 1000 to 50000, more preferably in a range of 5000 to 40000, and most preferably in a range of 10000 to 30000. In a case where the Mw of the (F) component is less than or equal to the upper limit of the above-described range, the solubility of the resist composition in a resist solvent is sufficient enough to be used as a resist. Further, in a case where the Mw thereof is greater than or equal to the lower limit of the above-described range, the dry etching resistance or the cross-sectional shape of the resist pattern becomes excellent.

The dispersity (Mw/Mn) of the (F) component is preferably in a range of 1.0 to 5.0, more preferably in a range of 1.0 to 3.0, and most preferably in a range of 1.2 to 2.5.

The (F) component may be used alone or in combination of two or more kinds thereof.

In a case where the resist composition of the present embodiment contains the (F) component, the content of the (F) component to be used is typically in a range of 0.5 to 10 parts by mass with respect to 100 parts by mass of the (A) component.

The resist composition of the present embodiment may further contain additives having miscibility as desired. For example, an additional resin, a dissolution inhibitor, a plasticizer, a stabilizer, a colorant, an antihalation agent, a dye, and the like may be added to the resist composition as appropriate in order to improve the performance of the resist film.

(S) Component: Organic Solvent Component

The resist composition of the present embodiment can be produced by dissolving a resist material in an organic solvent component (hereinafter, also referred to as an "(S) component").

The (S) component is not particularly limited as long as each component to be used is dissolved to obtain a uniform solution and can be optionally selected from among components known as solvents of a chemically amplified resist composition in the related art.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; a compound having an ester bond such as ethylene glycol monoacetate, diethylene glycol monoacetate, propylene glycol monoacetate, or dipropylene glycol monoacetate; derivatives of polyhydric alcohols, for example, a compound having an ether bond such as monoalkyl ether or monophenyl ether such as monomethyl ether, monoethyl ether, monopropyl ether, or monobutyl ether of the polyhydric alcohols or the compound having an ester bond [among these, propylene glycol monomethyl ether acetate (PGMEA) or propylene glycol monomethyl ether (PGME) is preferable]; cyclic ethers such as dioxane; esters such as methyl lactate, ethyl lactate (EL), methyl acetate, ethyl acetate, butyl acetate, methyl pyruvate, ethyl pyruvate, methyl methoxy propionate, and ethyl ethoxy propionate; an aromatic organic solvent such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, or mesitylene; and dimethyl sulfoxide (DMSO).

The (S) component may be used alone or in the form of a mixed solvent containing two or more kinds thereof.

Among these, PGMEA, PGME, γ-butyrolactone, EL, or cyclohexanone is preferable.

Further, a mixed solvent formed by mixing PGMEA and a polar solvent is also preferable. The blending ratio (mass ratio) may be appropriately determined in consideration of compatibility or the like between PGMEA and the polar solvent, but is preferably in a range of 1:9 to 9:1 and more preferably in a range of 2:8 to 8:2.

More specifically, in a case where EL or cyclohexanone is blended as the polar solvent, the mass ratio between PGMEA and EL or cyclohexanone is preferably in a range of 1:9 to 9:1 and more preferably in a range of 2:8 to 8:2. Further, in a case where PGME is blended as the polar solvent, the mass ratio between PGMEA and PGME is preferably in a range of 1:9 to 9:1, more preferably in a range of 2:8 to 8:2, and still more preferably in a range of 3:7 to 7:3. Moreover, a mixed solvent of PGMEA, PGME, and cyclohexanone is also preferable.

In addition to those described above, a mixed solvent of y-butyrolactone and at least one selected from PGMEA and EL is also preferable as the (S) component. In this case, as the mixing ratio, the mass ratio between the former and the latter is preferably in a range of 70:30 to 95:5.

The amount of the (S) component to be used is not particularly limited and appropriately set according to the thickness of the coated film at a concentration suitable for application to a substrate or the like. The (S) component is typically used such that the concentration of the solid content in the resist composition is in a range of 1% to 20% by mass and preferably in a range of 2% to 15% by mass.

According to the resist composition of the present embodiment described above, the effects of suppressing the occurrence of pattern collapse and improving the residual film rate by suppressing film shrink are obtained. Further, according to the resist composition of the present embodiment, the effect of forming an excellent pattern with a reduced roughness (LWR or the like) is also obtained. The above-described effects are likely to be obtained particularly in a case where the negative type development process that uses an organic developer is applied to the resist composition of the present embodiment.

In the negative type development process, pattern collapse caused by a pattern portion excessively remaining in the upper portion of the resist film and excessively removing the pattern portion in the lower portion of the resist film easily occurs. On the contrary, in the resist composition of the present embodiment, the affinity of various organic films of the lower layer of the resist film, the substrate, and the resist film is improved so that the pattern collapse can be reduced by using the (A1) component having the constitutional unit (a0) represented by Formula (a0-1).

Further, the negative type development process has a problem of a decrease in residual film rate due to the occurrence of film shrink during the development using an organic developer, compared to the positive type development process. In the resist composition of the present embodiment, film shrink can be suppressed and thus the film residual rate is improved by using a combination of the constitutional unit (a01), the constitutional unit (a02), and the constitutional unit (a03). Further, an excellent pattern with a reduced roughness can be formed. The reason for this is considered to be because the solubility of the resist film in an organic developer is suppressed so that the dissolution rate of the pattern portion is unlikely to be increased by using the combination of the constitutional unit (a01), the constitutional unit (a02), and the constitutional unit (a03).

In the resist composition of the present embodiment, due to the above-described action, the occurrence of pattern collapse can be suppressed so that the residual film rate is improved, and a resist pattern having an excellent shape with a reduced roughness can be formed.

Method of Forming Resist Pattern

A method of forming a resist pattern of the present embodiment includes a step of forming a resist film on a support using the above-described resist composition; a step of exposing the resist film; and a step of patterning the exposed resist film by performing negative type development using a developer that contains an organic solvent to form a resist pattern.

Such a method of forming a resist pattern can be performed as follows.

First, the support is coated with the above-described resist composition of the embodiment using a spinner or the like, and a bake (post-apply bake (PAB)) treatment is performed under a temperature condition of 80° C. to 150° C. for 40 to 120 seconds and preferably for 60 to 90 seconds, thereby forming a resist film.

Next, the resist film is exposed through a photomask (mask pattern) on which a predetermined pattern is formed or selectively exposed by drawing or the like through direct irradiation with electron beams without using a photomask, using an exposure device such as an ArF exposure device, an electron beam drawing device, or an EUV exposure device. Thereafter, a bake (post-exposure bake (PEB)) treatment is performed under a temperature condition of 80° C. to 150° C. for 40 to 120 seconds and preferably for 60 to 90 seconds.

Next, the resist film on which the exposure and the bake (PEB) treatment have been performed is subjected to negative type development. The negative type development treatment is performed using a developer (organic developer) that contains an organic solvent.

A rinse treatment may be performed after the negative type development. It is preferable to use a rinse liquid containing an organic solvent. Further, the organic developer or the rinse liquid adhering onto the resist pattern may be subjected to a removal treatment using a supercritical fluid after the negative type development or the rinse treatment.

Next, drying is performed after the negative type development or the rinse treatment. Further, a bake treatment (post-bake) may be performed after the negative type development in some cases.

In this manner, a resist pattern can be formed.

The support is not particularly limited, and a known one of the related art can be used and examples of the known support include a substrate for an electronic component and a support on which a predetermined wiring pattern is formed. More specific examples thereof include a silicon wafer, a substrate made of a metal such as copper, chromium, iron, or aluminum, and a glass substrate. As the material for the wiring pattern, for example, copper, aluminum, nickel, or gold can be used.

Further, the support may be such a substrate described above, on which an inorganic and/or organic film is provided. Examples of the inorganic film include an inorganic antireflection film (inorganic BARC). Examples of the organic film include organic films such as an organic antireflection film (organic BARC) and a lower organic film used for a multilayer resist method.

Here, the multilayer resist method is a method of providing an organic film (lower organic film) formed of at least one layer and a resist film (upper resist film) formed of at least one layer on a substrate and performing patterning on the lower organic film using a resist pattern formed on the upper resist film as a mask, and a pattern with a high aspect ratio can be formed using this method. In other words, according to the multilayer resist method, since a desired thickness can be ensured using the lower organic film, the thickness of the resist film can be reduced and thus a fine pattern with a high aspect ratio can be formed.

The multilayer resist method is classified into a method (two-layer resist method) of forming a two-layer structure having an upper resist film and a lower organic film and a method (three-layer resist method) of forming a multilayer structure formed of three or more layers by proving one or more intermediate layers (metal thin film or the like) between an upper resist film and a lower organic film.

The wavelength used for exposure is not particularly limited, and the exposure can be performed using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The method of forming a resist pattern of the present invention is highly useful for a KrF excimer laser, an ArF excimer laser, EB, or EUV and particularly useful for an ArF excimer laser, EB, or EUV.

The method of exposing the resist film may be performed through typical exposure (dry exposure) performed in air or inert gas such as nitrogen or liquid immersion exposure (liquid immersion lithography).

The liquid immersion exposure is an exposure method of filling a space between a resist film and a lens disposed in the lowermost position of an exposure device with a solvent (liquid immersion medium) having a refractive index larger than the refractive index of air in advance and performing exposure (immersion exposure) in this state.

As the liquid immersion medium, a solvent having a refractive index that is larger than the refractive index of air and smaller than the refractive index of the resist film to be exposed is preferable. The refractive index of such a solvent is not particularly limited as long as the refractive index is in the above-described range.

Examples of the solvent having a refractive index that is larger than the refractive index of air and smaller than the refractive index of the resist film include water, a fluorine-based inert liquid, a silicon-based organic solvent, and a hydrocarbon-based organic solvent.

Specific examples of the fluorine-based inert liquid include a liquid that contains a fluorine-based compound such as $C_3HCl_2F_5$, $C_4F_9OCH_3$, $C_4F_9OC_2H_5$, or $C_5H_3F_7$ as a main component, and the boiling point thereof is preferably in a range of 70° C. to 180° C. and more preferably in a range of 80° C. to 160° C. It is preferable that the fluorine-based inert liquid have the above-described boiling point from the viewpoint that a medium used for liquid immersion can be removed using a simple method after the exposure is completed.

As the fluorine-based inert liquid, a perfluoroalkyl compound formed by all hydrogen atoms in an alkyl group being substituted with fluorine atoms is particularly preferable. Specific examples of the perfluoroalkylether compound include a perfluoroalkyl ether compound and a perfluoroalkylamine compound.

Further, specific examples of the perfluoroalkylether compound include perfluoro(2-butyl-tetrahydrofuran) (boiling point of 102° C.); and specific examples of the perfluoroalkylamine compound include perfluorotributylamine (boiling point of 174° C.).

Water is preferably used as the liquid immersion medium from the viewpoints of cost, safety, environmental problems, versatility, and the like.

The organic solvent contained in the organic developer used for the negative type development treatment is not particularly limited as long as the above-described (A) component (the (A) component before exposure) can be dissolved therein, and the solvent can be appropriately selected from among known organic solvents. Specific examples thereof include a polar solvent such as a ketone-based solvent, an ester-based solvent, an alcohol-based solvent, a nitrile-based solvent, an amide-based solvent, or an ether-based solvent and a hydrocarbon-based solvent.

The ketone-based solvent is an organic solvent that contains C—C(═O)—C in the structure. The ester-based solvent is an organic solvent contains C—C(═O)—O—C in the structure. The alcohol-based solvent is an organic solvent that contains an alcoholic hydroxyl group in the structure. The "alcoholic hydroxyl group" indicates a hydroxyl group bonded to a carbon atom of an aliphatic hydrocarbon group. The nitrile-based solvent is an organic solvent that contains a nitrile group in the structure. The amide-based solvent is an organic solvent that contains an amide group in the structure. The ether-based solvent is an organic solvent that contains C—O—C in the structure.

In the organic solvents, organic solvents containing a plurality of functional groups in the structures which characterize each of the above-described solvents are present. In this case, each of the above-described solvents corresponds to all solvents containing the functional groups included in the corresponding organic solvent. For example, diethylene glycol monomethyl ether corresponds to both of the alcohol-based solvent and the ether-based solvent in the above-described classification.

The hydrocarbon-based solvent is a hydrocarbon solvent which is formed of hydrocarbon that may be halogenated and does not have a substituent other than a halogen atom. Examples of the halogen atom include a fluorine atom, a chlorine atom, a bromine atom, and an iodine atom. Among these, a fluorine atom is preferable.

Among the examples, as the organic solvent contained in the organic developer, a polar solvent is preferable and a ketone-based solvent, an ester-based solvent, or a nitrile-based solvent is more preferable.

Examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and methyl amyl ketone (2-heptanone). Among these, methyl amyl ketone (2-heptanone) is preferable as the ketone-based solvent.

Examples of the ester-based solvent include methyl acetate, butyl acetate, ethyl acetate, isopropyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxy propionate, ethyl 2-hydroxy propionate, methyl-3-methoxy propionate, ethyl-3-methoxy propionate, ethyl-3-ethoxy propionate, and propyl-3-methoxy propionate. Among these, butyl acetate is preferable as the ester-based solvent.

Examples of the nitrile-based solvent include acetonitrile, propionitrile, valeronitrile, and butyronitrile.

Known additives can be blended into the organic developer as necessary. Examples of the additives include a surfactant. The surfactant is not particularly limited, and ionic or non-ionic fluorine-based and/or silicon-based surfactants can be used.

As the surfactant, a non-ionic surfactant is preferable, and a non-ionic fluorine-based surfactant or a silicon-based surfactant is more preferable.

In a case where the surfactant is blended into the organic developer, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developer.

The negative type development treatment can be performed according to a known development method, and examples of the known development method include a method (dipping method) of immersing a support in an organic developer for a certain period of time; a method (paddle method) of raising an organic developer on the surface of a support using the surface tension and maintaining the state for a certain period of time; a method (spray method) of spraying an organic developer to the surface of a support; and a method (dynamic dispense method) of continuously coating a support rotating at a certain speed with an organic developer while scanning an organic developer coating nozzle at a certain speed.

In a case where the rinse treatment is performed after the negative type development, as the organic solvent contained in the rinse liquid used for the rinse treatment, a solvent in which a resist pattern is unlikely to be dissolved is appropriately selected from among the organic solvents exemplified in the examples of the organic solvent used for the organic developer and then used. At least one solvent selected from the hydrocarbon-based solvent, the ketone-based solvent, the ester-based solvent, the alcohol-based solvent, the amide-based solvent, and the ether-based solvent is typically used. Among these, at least one solvent selected from the hydrocarbon-based solvent, the ketone-based solvent, the ester-based solvent, the alcohol-based solvent, and the amide-based solvent is preferable; at least one solvent selected from the alcohol-based solvent and the ester-based solvent is more preferable; and the alcohol-based solvent is particularly preferable.

As the alcohol-based solvent used for the rinse liquid, monohydric alcohol having 6 to 8 carbon atoms is preferable, and the monohydric alcohol may be linear, branched, or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol, and 2-hexanol are preferable; and 1-hexanol and 2-hexanol are more preferable.

These organic solvents may be used alone or in the form of a mixture containing two or more kinds thereof. Further, the organic solvents may be mixed with an organic solvent other than those described above or water and then used. In consideration of the development characteristics, the content of water in the rinse liquid is preferably 30% by mass or less, more preferably 10% by mass or less, still more preferably 5% by mass or less, and particularly preferably 3% by mass or less with respect to the total amount of the rinse liquid.

Known additives can be added to the rinse liquid as necessary. Examples of the additives include a surfactant. Examples of the surfactant are the same as those described above. Among those, a non-ionic surfactant is preferable, and a non-ionic fluorine-based surfactant or a non-ionic silicon-based surfactant is more preferable.

In a case where a surfactant is added to the rinse liquid, the amount of the surfactant to be added is typically in a range of 0.001% to 5% by mass, preferably in a range of 0.005% to 2% by mass, and more preferably in a range of 0.01% to 0.5% by mass with respect to the total amount of the rinse liquid.

The rinse treatment (washing treatment) using the rinse liquid can be performed according to a known rinse method. Examples of the known rinse treatment method include a method (rotation coating method) of continuously coating a support rotating at a certain speed with a rinse liquid; a method (dipping method) of immersing a support in a rinse liquid for a certain period of time; and a method (spray method) of spraying a rinse liquid to the surface of a support.

According to the method of forming a resist pattern of the present embodiment described above, since the above-described (resist composition) is used, the occurrence of pattern collapse is suppressed, the residual film rate is improved, and a resist pattern having an excellent shape with a reduced roughness can be formed.

EXAMPLES

Hereinafter, the present invention will be described in more detail with reference to examples, but the present invention is not limited to these examples.

Polymer Synthesis Example 1: Production of Polymer Compound 1

19.37 g of propylene glycol monomethyl ether acetate (PM) was added to a three-neck flask connected with a thermometer, a reflux tube, and a nitrogen introduction tube, and the three-neck flask was heated at 80° C.

Next, 10.00 g (31.61 mmol) of a compound (m02), 9.95 g (31.61 mmol) of a compound (m03), 4.43 g (79.03 mmol) of a compound (m11), and 4.66 g (12.80 mmol) of a compound (m011) were dissolved in 54.79 g of PM, and a solution to which 4.43 g (20.23 mmol) of dimethyl azobisisobutyrate (V-601) was added as a polymerization initiator and dissolved therein was added dropwise to the obtained solution for 4 hours in a nitrogen atmosphere.

After the dropwise addition, the reaction solution was heated and stirred for 1 hour, and the obtained reaction solution was cooled to room temperature.

The obtained reaction polymerization solution was added dropwise to a large amount of methanol/pure water (20% by mass or greater), an operation for depositing the polymer was performed, and the precipitated white powder was washed with a large amount of methanol and then dried, thereby obtaining 26.81 g of a target polymer compound 1 (yield: 73.4%).

The mass-average molecular weight (Mw) of the polymer compound 1 in terms of standard polystyrene acquired by performing GPC measurement was 8200, and the molecular weight dispersity (Mw/Mn) thereof was 1.71.

Moreover, the copolymer compositional ratio (l/m/n/o) (the proportion of each constitutional unit in the structural formula (molar ratio)) acquired by the carbon 13 nuclear magnetic resonance spectrum (600 MHz_$^{13}$CNMR) was 20/20/50/10.

Polymer compounds 2 to 19 were synthesized according to the same method as that for the [Polymer Synthesis Example 1] described above except that the following monomers deriving constitutional units constituting respective polymer compounds were used at a predetermined molar ratio.

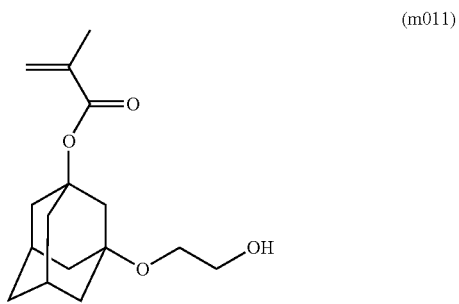

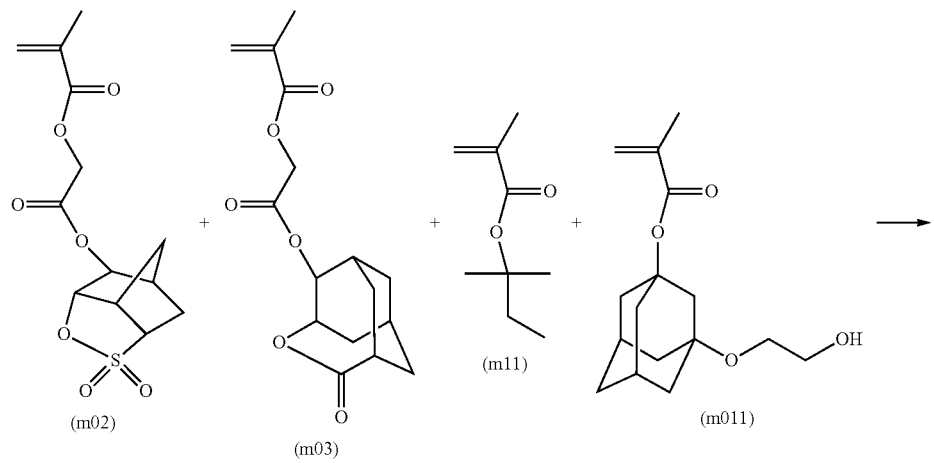

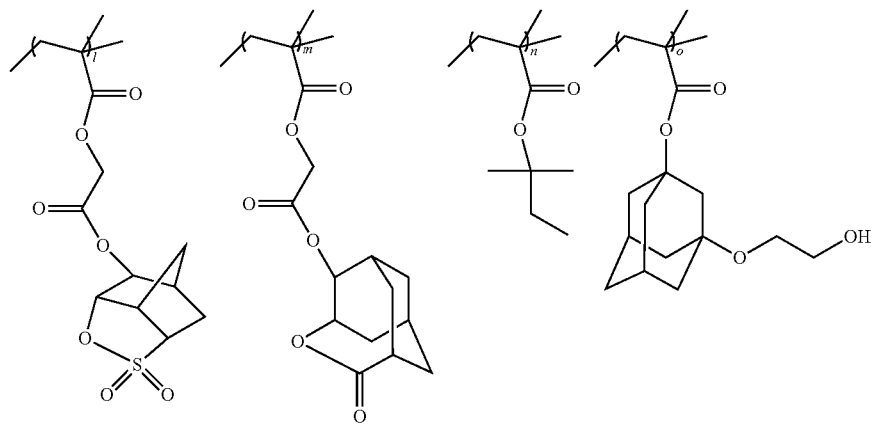

Polymer compound 1

(m012)
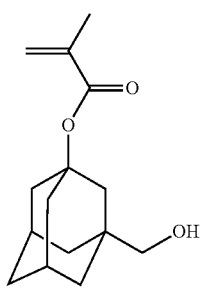
(m031)
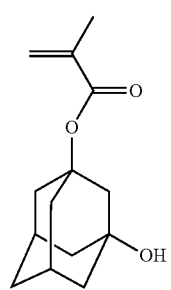
(m02)
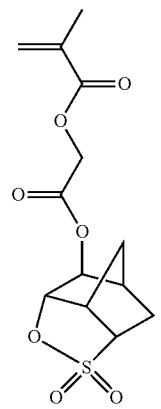
(m03)
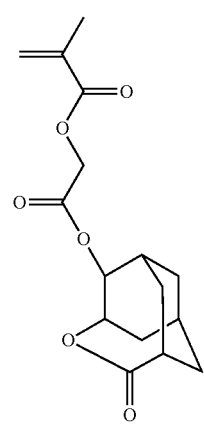
(m04)
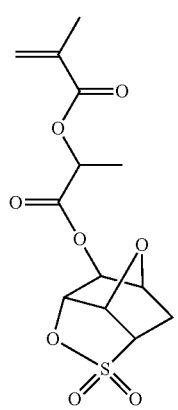
(m05)
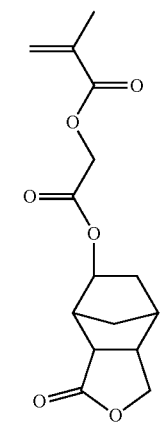
(m21)
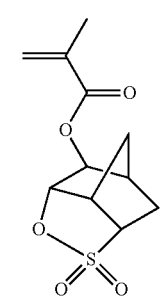
(m22)
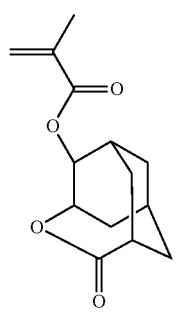

-continued (m23)
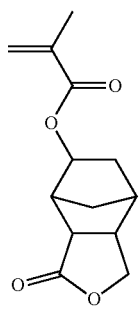

(m24)
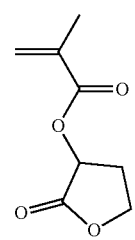

(m11)
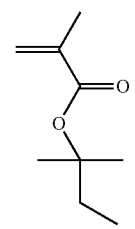

(m12)
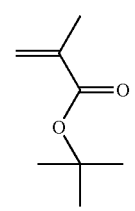

(m13)
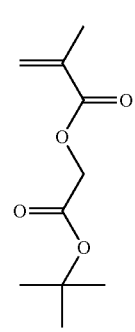

(m14)
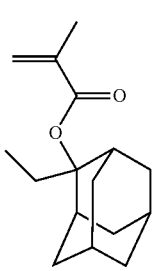

-continued (m15)
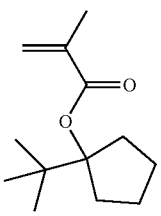

The copolymer compositional ratio (the proportion of each constitutional unit in the polymer compound (molar ratio)) of each of the polymer compounds 1 to 19 acquired by $^{13}$C-NMR, the mass-average molecular weight (Mw) of each polymer compound in terms of standard polystyrene acquired by GPC measurement, and the molecular weight dispersity (Mw/Mn) of each polymer compound are listed in Table 1.

TABLE 1

| Polymer compound | Monomer composition | Copolymer compositional ratio (molar ratio) | Mw | Mw/Mn |
|---|---|---|---|---|
| 1 | m02/m03/m11/m011 | 20/20/50/10 | 8200 | 1.71 |
| 2 | m02/m04/m11/m011 | 21/22/48/9 | 8400 | 1.61 |
| 3 | m05/m03/m11/m011 | 20/20/51/9/ | 8000 | 1.63 |
| 4 | m02/m03/m12/m011 | 20/20/50/10 | 8100 | 1.72 |
| 5 | m02/m03/m13/m011 | 19/19/52/10 | 8600 | 1.82 |
| 6 | m02/m03/m15/m011 | 20/20/50/10 | 8100 | 1.72 |
| 7 | m02/m03/m12/m14/m011 | 10/29/40/11/10 | 7500 | 1.88 |
| 8 | m02/m03/m12/m15/m011 | 10/29/20/31/10 | 8000 | 1.55 |
| 9 | m02/m04/m12/m012 | 21/22/46/11 | 7700 | 1.63 |
| 10 | m02/m11/m011 | 42/46/12 | 8800 | 1.44 |
| 11 | m03/m11/m011 | 40/49/11 | 8200 | 1.65 |
| 12 | m21/m02/m12/m011 | 21/22/48/9 | 8100 | 1.67 |
| 13 | (m23 + m05)/m11/m011 | 42/49/9 | 5000 | 1.95 |
| 14 | (m22 + m03)/m11/m011 | 40/50/10 | 5500 | 1.74 |
| 15 | m02/m03/m11/m31 | 20/20/49/11 | 8100 | 1.7 |
| 16 | m24/m02/m12/m15/m011 | 10/28/21/30/11 | 7900 | 1.52 |
| 17 | m02/m03/m14/m11/m31 | 20/20/10/39/9 | 7200 | 1.7 |
| 18 | m02/m03/m15/m31 | 21/19/50/10 | 7400 | 1.6 |
| 19 | m02/m03/m15 | 20/30/50 | 7000 | 1.72 |

Examples 1 to 9 and Comparative Examples 1 to 10

Resist Composition

A resist composition of each example was prepared by mixing each component listed in Table 2 and dissolving the mixture.

TABLE 2

| | (A) component | (B) component | (D) component | (F) component | (S) component | |
|---|---|---|---|---|---|---|
| Example 1 | (A)-1 [100] | (B)-1 [6.0] | (D)-1 [3.0] | (F)-1 [1.5] | (S)-1 [10] | (S)-2 [2750] |
| Example 2 | (A)-2 [100] | (B)-1 [6.0] | (D)-1 [3.0] | (F)-1 [1.5] | (S)-1 [10] | (S)-2 [2750] |
| Example 3 | (A)-3 [100] | (B)-1 [6.0] | (D)-1 [3.0] | (F)-1 [1.5] | (S)-1 [10] | (S)-2 [2750] |
| Example 4 | (A)-4 [100] | (B)-1 [6.0] | (D)-1 [3.0] | (F)-1 [1.5] | (S)-1 [10] | (S)-2 [2750] |
| Example 5 | (A)-5 [100] | (B)-1 [6.0] | (D)-1 [3.0] | (F)-1 [1.5] | (S)-1 [10] | (S)-2 [2750] |
| Example 6 | (A)-6 [100] | (B)-1 [6.0] | (D)-1 [3.0] | (F)-1 [1.5] | (S)-1 [10] | (S)-2 [2750] |
| Example 7 | (A)-7 [100] | (B)-1 [6.0] | (D)-1 [3.0] | (F)-1 [1.5] | (S)-1 [10] | (S)-2 [2750] |
| Example 8 | (A)-8 [100] | (B)-1 [6.0] | (D)-1 [3.0] | (F)-1 [1.5] | (S)-1 [10] | (S)-2 [2750] |
| Example 9 | (A)-9 [100] | (B)-1 [6.0] | (D)-1 [3.0] | (F)-1 [1.5] | (S)-1 [10] | (S)-2 [2750] |
| Comparative Example 1 | (A)-10 [100] | (B)-1 [6.0] | (D)-1 [3.0] | (F)-1 [1.5] | (S)-1 [10] | (S)-2 [2750] |
| Comparative Example 2 | (A)-11 [100] | (B)-1 [6.0] | (D)-1 [3.0] | (F)-1 [1.5] | (S)-1 [10] | (S)-2 [2750] |
| Comparative Example 3 | (A)-12 [100] | (B)-1 [6.0] | (D)-1 [3.0] | (F)-1 [1.5] | (S)-1 [10] | (S)-2 [2750] |
| Comparative Example 4 | (A)-13 [100] | (B)-1 [6.0] | (D)-1 [3.0] | (F)-1 [1.5] | (S)-1 [10] | (S)-2 [2750] |
| Comparative Example 5 | (A)-14 [100] | (B)-1 [6.0] | (D)-1 [3.0] | (F)-1 [1.5] | (S)-1 [10] | (S)-2 [2750] |
| Comparative Example 6 | (A)-15 [100] | (B)-1 [6.0] | (D)-1 [3.0] | (F)-1 [1.5] | (S)-1 [10] | (S)-2 [2750] |
| Comparative Example 7 | (A)-16 [100] | (B)-1 [6.0] | (D)-1 [3.0] | (F)-1 [1.5] | (S)-1 [10] | (S)-2 [2750] |
| Comparative Example 8 | (A)-17 [100] | (B)-1 [6.0] | (D)-1 [3.0] | (F)-1 [1.5] | (S)-1 [10] | (S)-2 [2750] |
| Comparative Example 9 | (A)-18 [100] | (B)-1 [6.0] | (D)-1 [3.0] | (F)-1 [1.5] | (S)-1 [10] | (S)-2 [2750] |
| Comparative Example 10 | (A)-19 [100] | (B)-1 [6.0] | (D)-1 [3.0] | (F)-1 [1.5] | (S)-1 [10] | (S)-2 [2750] |

In Table 2, each abbreviation has the following meaning. Further, the numerical values in the parentheses indicate the blending amounts (part by mass).

(A)-1 to (A)-19: the above-described polymer compounds 1 to 19

(B)-1: an acid generator formed of a compound represented by Chemical Formula (B)-1 shown below (D)-1: an acid diffusion control agent formed of a compound represented by Chemical Formula (D)-1 shown below (F)-1: a fluorine-containing polymer compound represented by Chemical Formula (F)-1 shown below The mass-average molecular weight (Mw) in terms of standard polystyrene acquired by GPC measurement was 15000, the molecular weight dispersity (Mw/Mn) was 1.69, and the copolymer compositional ratio (l/m) (the proportion of each constitutional unit in the structural formula (molar ratio)) acquired by $^{13}$C-NMR was 50/50.

(S)-1: γ-butyrolactone (S)-2: a mixed solvent containing propylene glycol monomethyl ether acetate/propylene glycol monomethyl ether/cyclohexanone=45/30/25 (mass ratio)

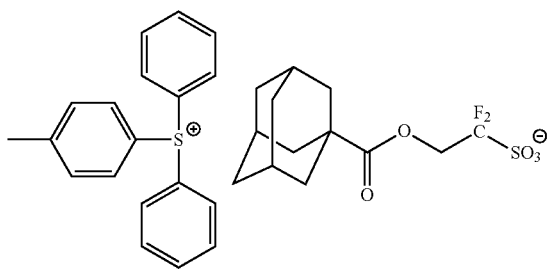

(B)-1

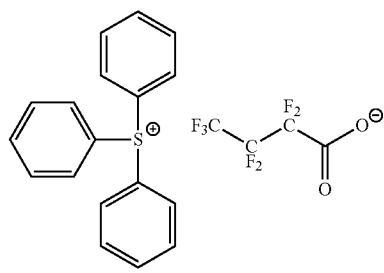

(D)-1

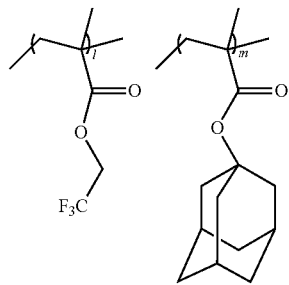

(F)-1

Formation of Resist Pattern

An 8-inch silicon substrate on which a hexamethyldisilazane (HMDS) treatment was performed at 90° C. for 36 seconds was uniformly coated with each resist composition of each example using a spinner, and a bake treatment (PAB) was performed thereon at a heating temperature of 110° C. for 60 seconds, thereby forming a resist film (film thickness of 100 nm).

Next, the resist film was selectively irradiated with an ArF excimer laser (193 nm) through a desired photomask using an ArF exposure device NSR-S610C [manufactured by Nikon Corporation; NA (numerical aperture)=1.30, Crosspole (0.78-0.97) with POLANO, liquid immersion medium: water].

Thereafter, a post-exposure heat treatment was performed at 115° C. for 60 seconds.

Next, solvent development was performed using butyl acetate at 23° C. for 13 seconds, and then shake-off drying was performed.

As a result, in all examples, a space and line pattern (hereinafter, also simply referred to as an "SL pattern") with a space width of 45 nm and a pitch of 90 nm was formed.

Evaluation of Optimum Exposure Amount (Eop)

An optimum exposure amount Eop (mJ/cm$^2$) at which a target resist pattern was formed by forming the above-described resist pattern was acquired. The results are listed as "Eop (mJ/cm$^2$)" in Table 3.

Evaluation of Pattern Collapse

An SL pattern was formed by changing the exposure amount (mJ/cm$^2$) and the focal point during the formation of the resist pattern. At this time, the maximum dimension of a space portion in the SL pattern resolved without causing pattern collapse was measured using CD-SEM (acceleration voltage of 300 V). A scanning electron microscope (trade name: S-9380, manufactured by Hitachi High-Technologies Corporation) was used for CD-SEM.

The maximum dimension of the space portion in the resolved SL pattern is listed as the "maximum resolution dimension (nm)" in Table 3.

Evaluation of Line Width Roughness (LWR)

In the resist pattern formed in the above-described manner, 400 sites of the space width of the SL pattern in the longitudinal direction of the space were measured by CD-SEM (acceleration voltage of 300 V). A scanning electron microscope (trade name: S-9380, manufactured by Hitachi High-Technologies Corporation) was used for CD-SEM.

Next, the value of three times (3s) the standard deviation (s) was acquired from the measurement results of the space width of each pattern, and the value obtained by averaging the 3s of 400 sites was calculated as the scale showing LWR. The results are listed as "LWR" in Table 3.

The 3s acquired in the above-described manner means that the roughness of the space portion was small when the value thereof was as small as possible and an SL pattern having a space with a more uniform width was obtained.

Evaluation of Residual Film Rate after Development

Method of Preparing Sample for Measuring Residual Film

A 12-inch silicon substrate (hereinafter, referred to as Bare Si) was coated with an organic antireflection film composition "ARC29A" (trade name, manufactured by Brewer Science, Inc.) using a spinner, baked on a hot plate at 205° C. for 60 seconds, and dried, thereby forming an organic antireflection film having a film thickness of 80 nm. The film was coated with each resist composition of Examples 1 to 9 and Comparative Examples 1 to 10, subjected to a pre-bake (PAB) treatment on a hot plate at 110° C. for 60 seconds, and then dried, thereby forming a resist film having a film thickness of 100 nm.

Thereafter, the entire surface of the resist film was exposed using an ArF exposure device NSR-308 (manufactured by Nikon Corporation, NA (numerical aperture)=0.92, 60.95). The optimum exposure amount for each resist composition was used as the exposure amount. Next, the film was dried at 110° C. for 60 seconds.

Thereafter, solvent development was performed using butyl acetate at 23° C. for 13 seconds, and then shake-off drying was performed. Next, post-bake was performed at 100° C. for 60 seconds.

Measurement of Residual Film Rate

The residual film rate (unit: %) was acquired using the following equation based on the thickness of the film (the film thickness of the exposed portion after the solvent development) formed using each resist composition according to the above-described Method of preparing sample for measuring residual film.

The results are listed in Table 3.

Residual film rate (%)=($FT2/FT1$)×100

In the equation, FT1 indicates the film thickness (nm) of the resist before the exposure, and FT2 indicates the film thickness (nm) of the LS pattern.

The film thickness was measured using Nanospec 6100A (manufactured by Nanometrics Incorporated).

TABLE 3

| | Eop (mJ/cm$^2$) | Maximum resolution dimension (nm) | LWR | Residual film rate (%) |
|---|---|---|---|---|
| Example 1 | 18.3 | 59 | 2.2 | 76 |
| Example 2 | 20.0 | 57 | 2.5 | 77 |
| Example 3 | 20.6 | 57 | 2.8 | 75 |
| Example 4 | 24.0 | 63 | 2.8 | 80 |
| Example 5 | 15.2 | 59 | 2.7 | 82 |
| Example 6 | 13.7 | 56 | 3.0 | 72 |
| Example 7 | 19.4 | 55 | 3.0 | 71 |
| Example 8 | 22.0 | 58 | 2.8 | 75 |
| Example 9 | 18.8 | 57 | 2.6 | 75 |
| Comparative Example 1 | 17.5 | 56 | 3.3 | 73 |
| Comparative Example 2 | 20.0 | 56 | 3.5 | 77 |
| Comparative Example 3 | 19.5 | 50 | 3.3 | 68 |
| Comparative Example 4 | — | | | (not resolved) |
| Comparative Example 5 | 21.5 | 51 | 4.0 | 67 |
| Comparative Example 6 | 18.6 | 48 | 2.4 | 75 |

TABLE 3-continued

| | Eop (mJ/cm$^2$) | Maximum resolution dimension (nm) | LWR | Residual film rate (%) |
|---|---|---|---|---|
| Comparative Example 7 | 22.8 | 49 | 2.8 | 64 |
| Comparative Example 8 | — | 42 | — | 70 |
| Comparative Example 9 | 14.2 | 45 | 3.1 | 72 |
| Comparative Example 10 | — | 39 | — | 71 |

In Table 3, "-" means that the measurement was not able to be performed due to pattern collapse.

Based on the results listed in Table 3, it was confirmed that all of the residual film rate, the pattern collapse (maximum resolution dimension), and LWR were improved in Examples 1 to 9, compared to Comparative Examples 1 to 10.

Particularly in the examples in which a polymer compound having the constitutional unit (a1) containing an acid-dissociable group free from a cyclic hydrocarbon group was used, it was confirmed that the improvement effect was not high.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid when exposed and whose solubility in a developer is changed by an action of an acid, the resist composition comprising:
a base material component (A) whose solubility in a developer is changed by an action of an acid,
wherein the base material component (A) comprises a polymer compound (A1) having a constitutional unit (a01) represented by Formula (a0-1), a constitutional unit (a02) represented by Formula (a0-2), and a constitutional unit (a03) which is represented by Formula (a0-3) and has a structure different from the constitutional unit (a02),

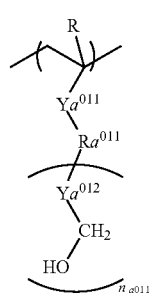

(a0-1)

wherein R represents a hydrogen atom, an alkyl group having 1 to 5 carbon atoms, or a halogenated alkyl group having 1 to 5 carbon atoms, $Ya^{011}$ represents a divalent linking group, $Ra^{011}$ represents a cyclic aliphatic hydrocarbon group which may have a substituent, $Ya^{012}$ represents a single bond or a divalent linking group, $n_{a011}$ represents an integer of 1 to 3, and in a case where $n_{a011}$ represents 2 or greater, a plurality of $Ya^{012}$'s may be the same as or different from each other; and

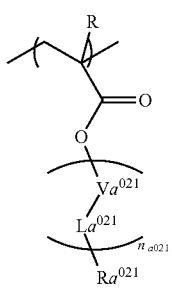

(a0-2)

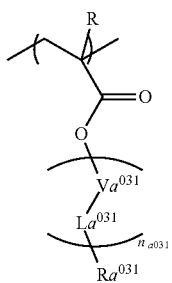

(a0-3)

wherein a plurality of R's each independently represents a hydrogen atom, an alkyl group having 1 to 5 carbon atoms, or a halogenated alkyl group having 1 to 5 carbon atoms, $Va^{021}$ and $Va^{031}$ each independently represents a divalent hydrocarbon group which may have an ether bond, $La^{021}$ and $La^{031}$ each independently represents, —COO—, —CON(R')—, —OCO—, —CONHCO—, or —CONHCS—, R' represents a hydrogen atom or a methyl group, $Ra^{021}$ and $Ra^{031}$ each independently represents a lactone-containing cyclic group, a carbonate-containing cyclic group, or a —SO$_2$-containing cyclic group, $n_{a021}$ and $n_{a031}$ each independently represents 1 or 2, in a case where $n_{a021}$ represents 2, a plurality of $Va^{021}$'s may be the same as or different from each other and a plurality of $La^{021}$'s may be the same as or different from each other, and in a case where $n_{a031}$ represents 2, a plurality of $Va^{031}$'s may be the same as or different from each other and a plurality of $La^{031}$'s may be the same as or different from each other.

2. The resist composition according to claim 1, wherein $Ra^{021}$ in Formula (a0-2) represents a —SO$_2$-containing cyclic group.

3. The resist composition according to claim 1, wherein the polymer compound (A1) further has a constitutional unit (a1) containing an acid-decomposable group that has a polarity to be increased by an action of an acid.

4. The resist composition according to claim 3, wherein the constitutional unit (a1) is a constitutional unit represented by Formula (a1-1-1):

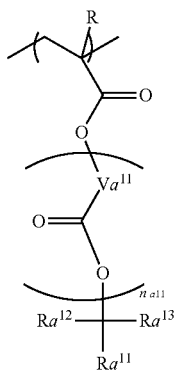

(a1-1-1)

wherein R represents a hydrogen atom, an alkyl group having 1 to 5 carbon atoms, or a halogenated alkyl group having 1 to 5 carbon atoms, $Va^{11}$ represents a divalent hydrocarbon group which may have an ether bond, $Ra^{11}$ to $Ra^{13}$ each independently represents a linear or branched alkyl group having 1 to 5 carbon atoms which may have a substituent, $n_{a11}$ represents an integer of 0 to 2, and in a case where $n_{a11}$ represents 2, a plurality of $Va^{11}$'s may be the same as or different from each other.

5. The resist composition according to claim 1, wherein $Ra^{011}$ in Formula (a0-1) represents a bridged alicyclic group which may have a substituent.

6. A method of forming a resist pattern, comprising:
   forming a resist film on a support using the resist composition according to claim 1;
   exposing the resist film; and
   patterning the exposed resist film by performing negative type development using a developer that contains an organic solvent to form a resist pattern.

* * * * *